(12) United States Patent
Kakegawa et al.

(10) Patent No.: US 8,513,638 B2
(45) Date of Patent: Aug. 20, 2013

(54) SEMICONDUCTOR DEVICE INCLUDING A PHASE-CHANGE MEMORY ELEMENT

(75) Inventors: Tomoyasu Kakegawa, Tokyo (JP); Isamu Asano, Tokyo (JP); Tsuyoshi Kawagoe, Tokyo (JP); Hiromi Sasaoka, Tokyo (JP); Naoya Higano, Tokyo (JP); Yuta Watanabe, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 72 days.

(21) Appl. No.: 13/137,687

(22) Filed: Sep. 2, 2011

(65) Prior Publication Data

US 2012/0056148 A1    Mar. 8, 2012

(30) Foreign Application Priority Data

Sep. 7, 2010    (JP) ................ P2010-200004

(51) Int. Cl.
*H01L 29/02*    (2006.01)

(52) U.S. Cl.
USPC ..... 257/4; 257/2; 257/3; 257/5; 257/E29.002; 438/102; 438/103; 438/104; 365/163

(58) Field of Classification Search
USPC ............. 257/2–5, E29.002; 438/102–104; 356/163
See application file for complete search history.

(56) References Cited

U.S. PATENT DOCUMENTS

2009/0191367 A1*    7/2009    Chen ..................... 428/34.1

OTHER PUBLICATIONS

S. M. Sadeghipour, et al., "Phase Change Random Access Memory, Thermal Analysis" ITHERM-06, pp. 660-665, 2006.
M.Gill, et al., "Ovonic Unified Memory-A High-Performance Nonvolatile Memory Technology for Stand-Alone Memory and Embedded Applications" ISSCC 2002 Digest of Technical Papers vol. 45, pp. 202-203 and 459, Feb. 2002.
G. Servalli, "A 45nm Generation Phase Change Memory Technology", IEDM-09, pp. 113-116, 2009.

\* cited by examiner

*Primary Examiner* — Jami M Valentine
(74) *Attorney, Agent, or Firm* — McGinn IP Law Group, PLLC

(57) ABSTRACT

A semiconductor device may include, but is not limited to: a first insulating film; a second insulating film over the first insulating film; a first memory structure between the first and second insulating films; and a third insulating film between the first and second insulating films. The first memory structure may include, but is not limited to: a heater electrode; and a phase-change memory element between the heater electrode and the second insulating film. The phase-change memory element contacts the heater electrode. The third insulating film covers at least a side surface of the phase-change memory element. Empty space is positioned adjacent to at least one of the heater electrode and the third insulating film.

18 Claims, 73 Drawing Sheets

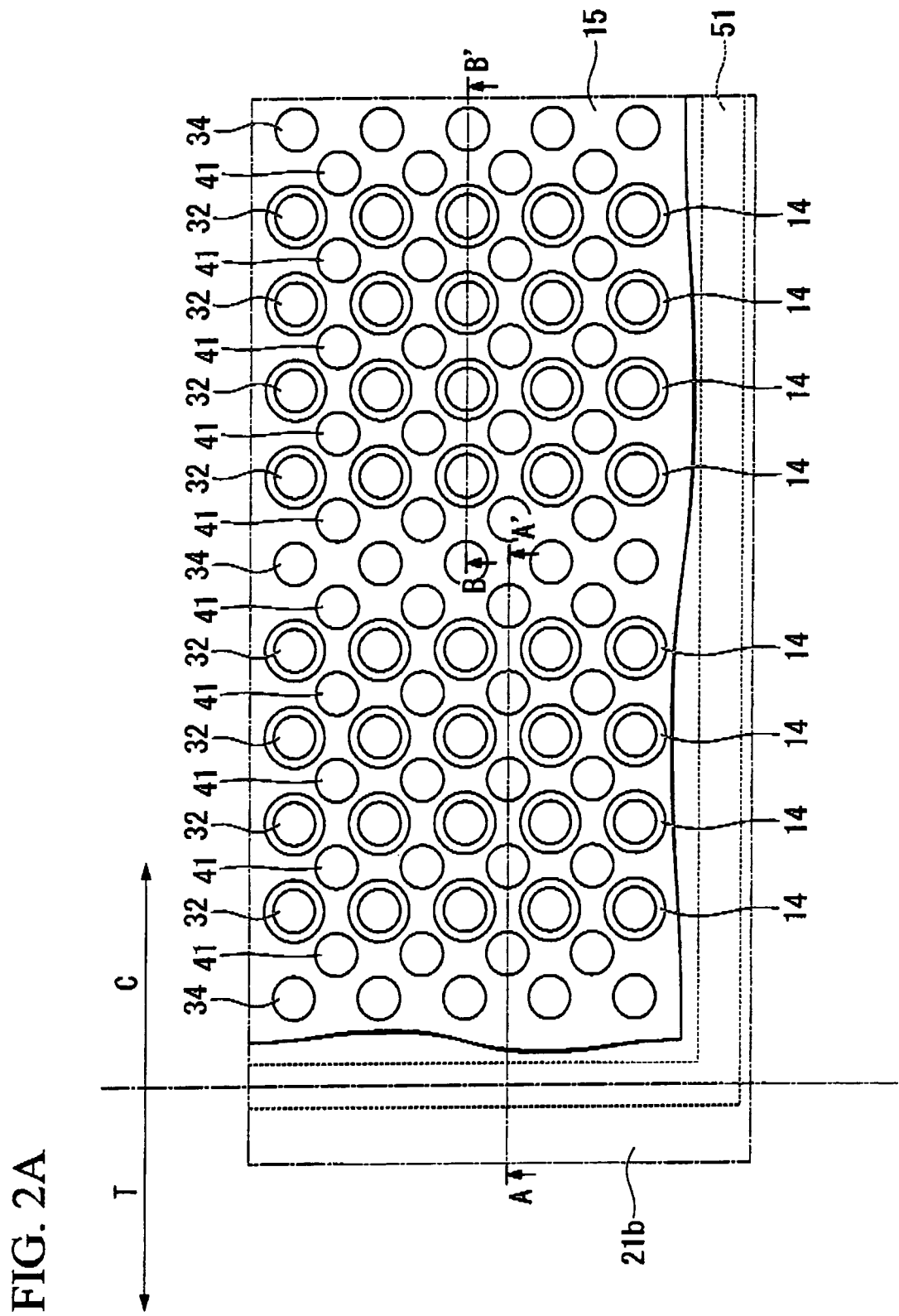

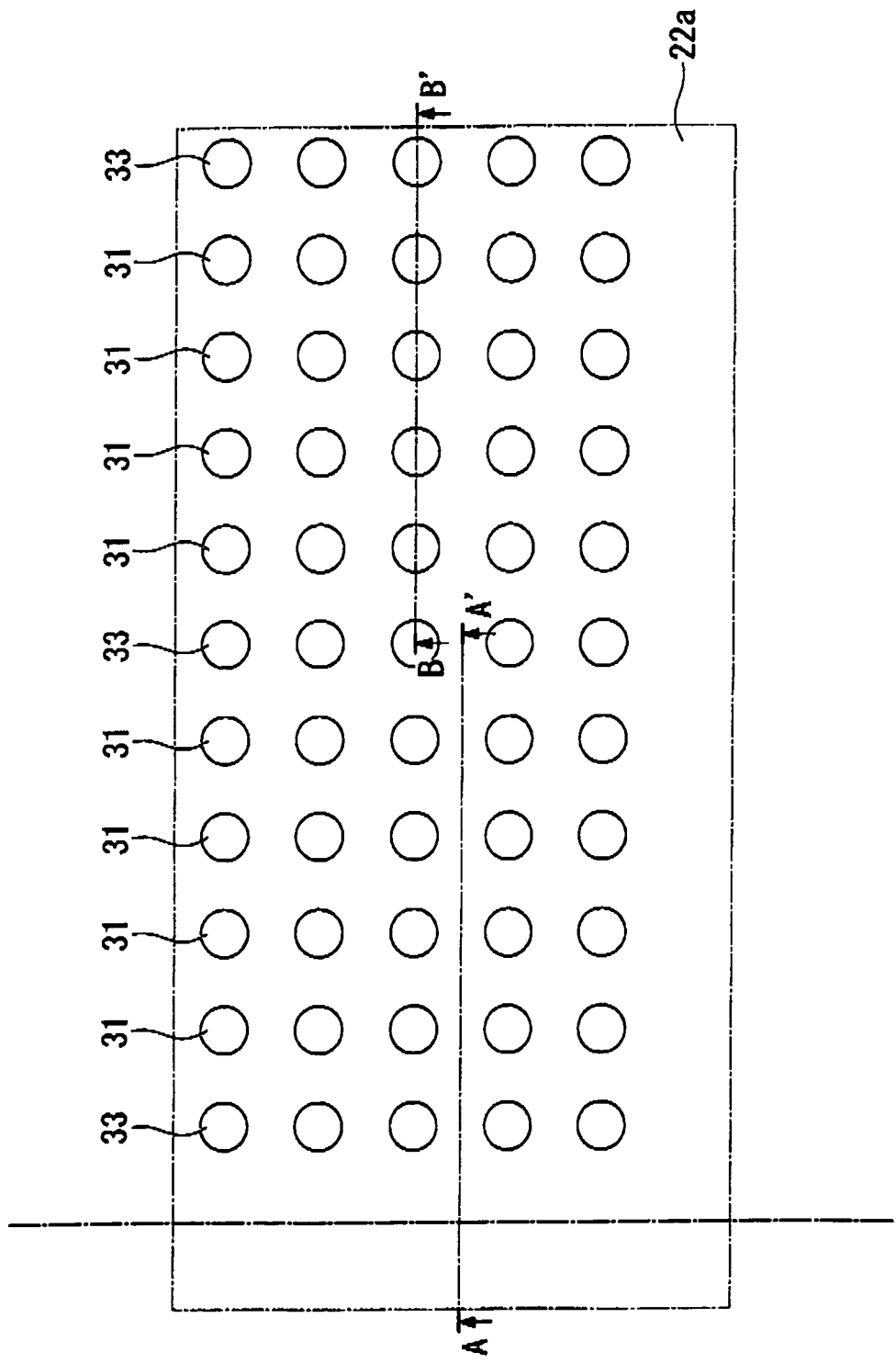

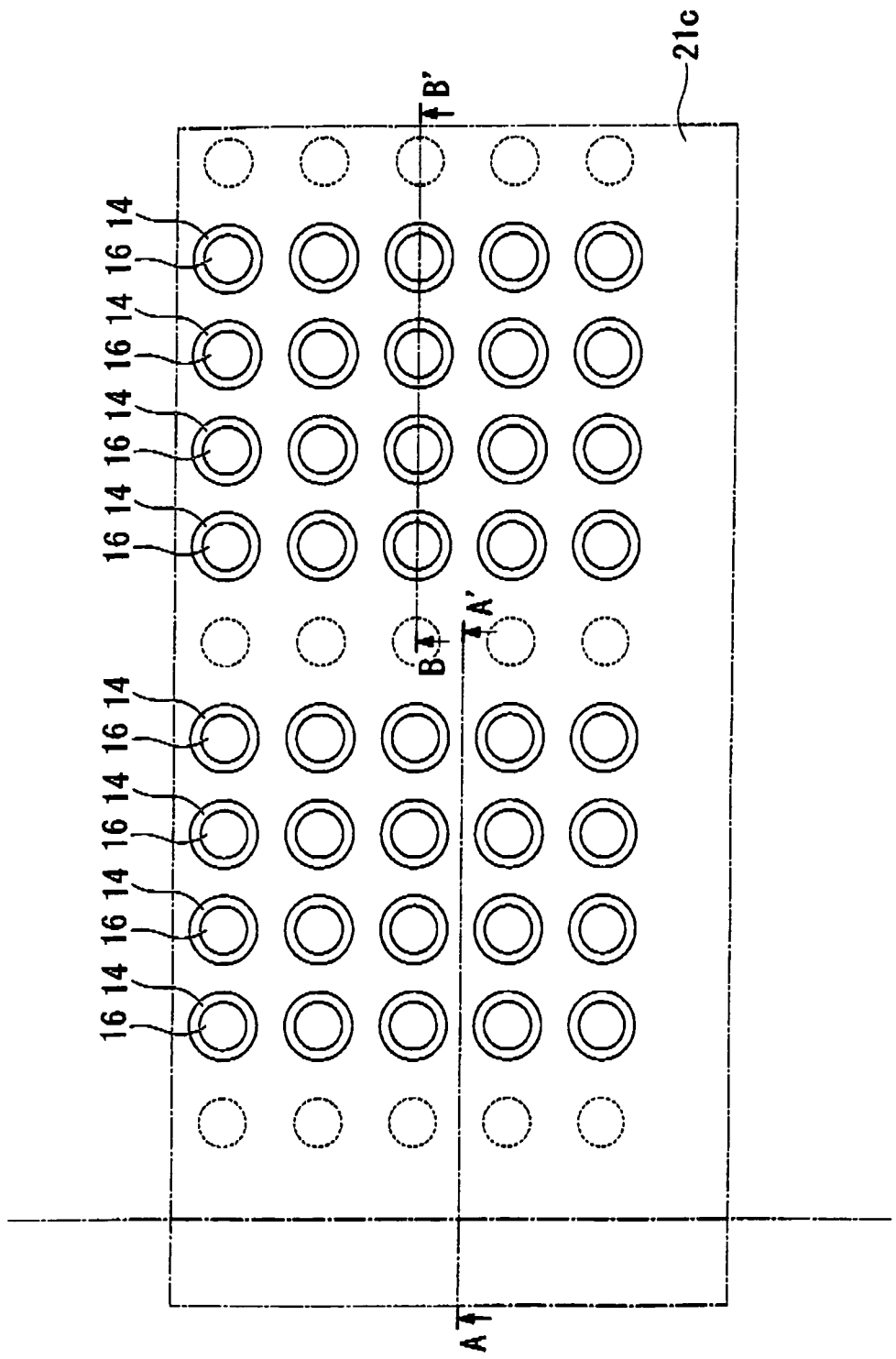

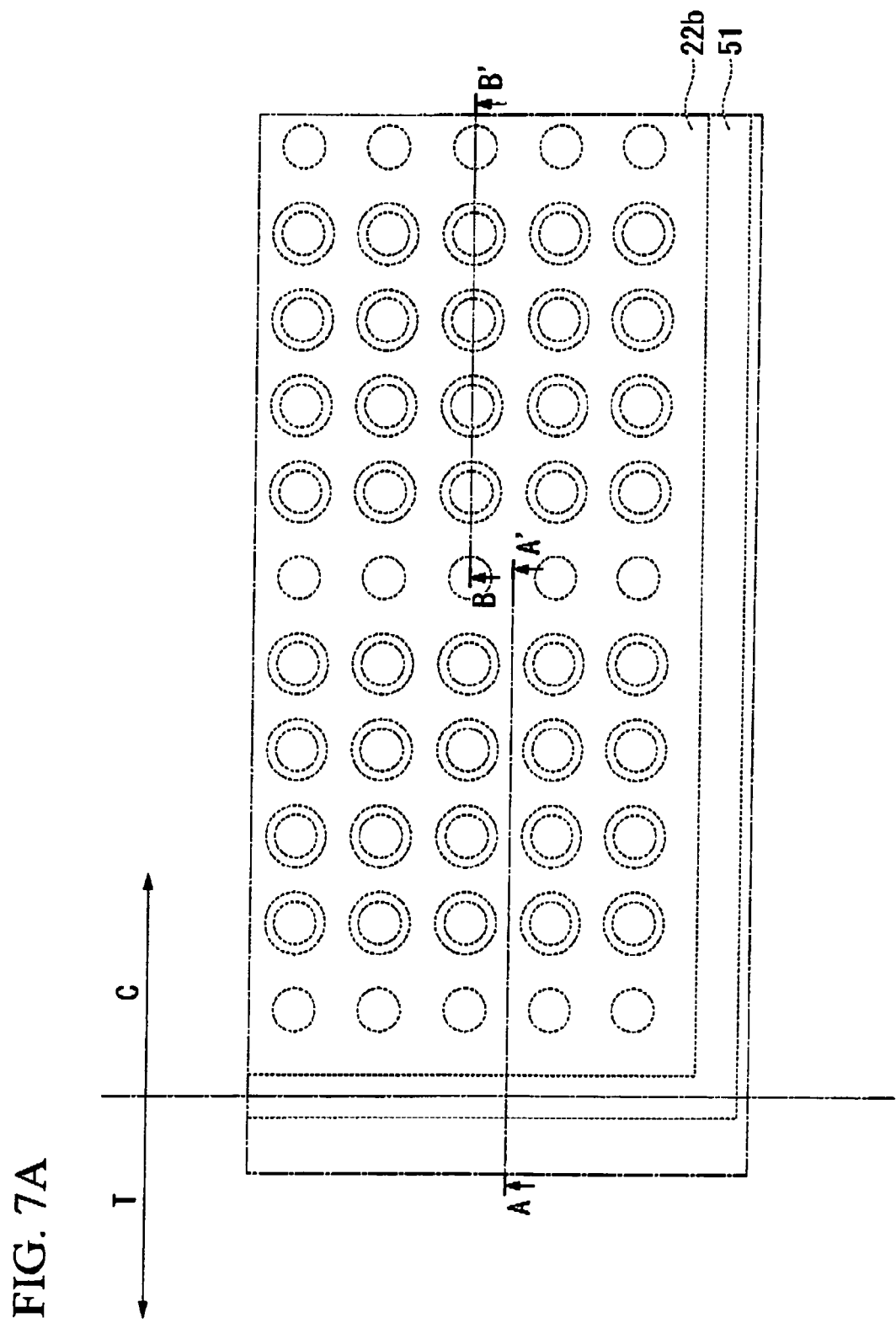

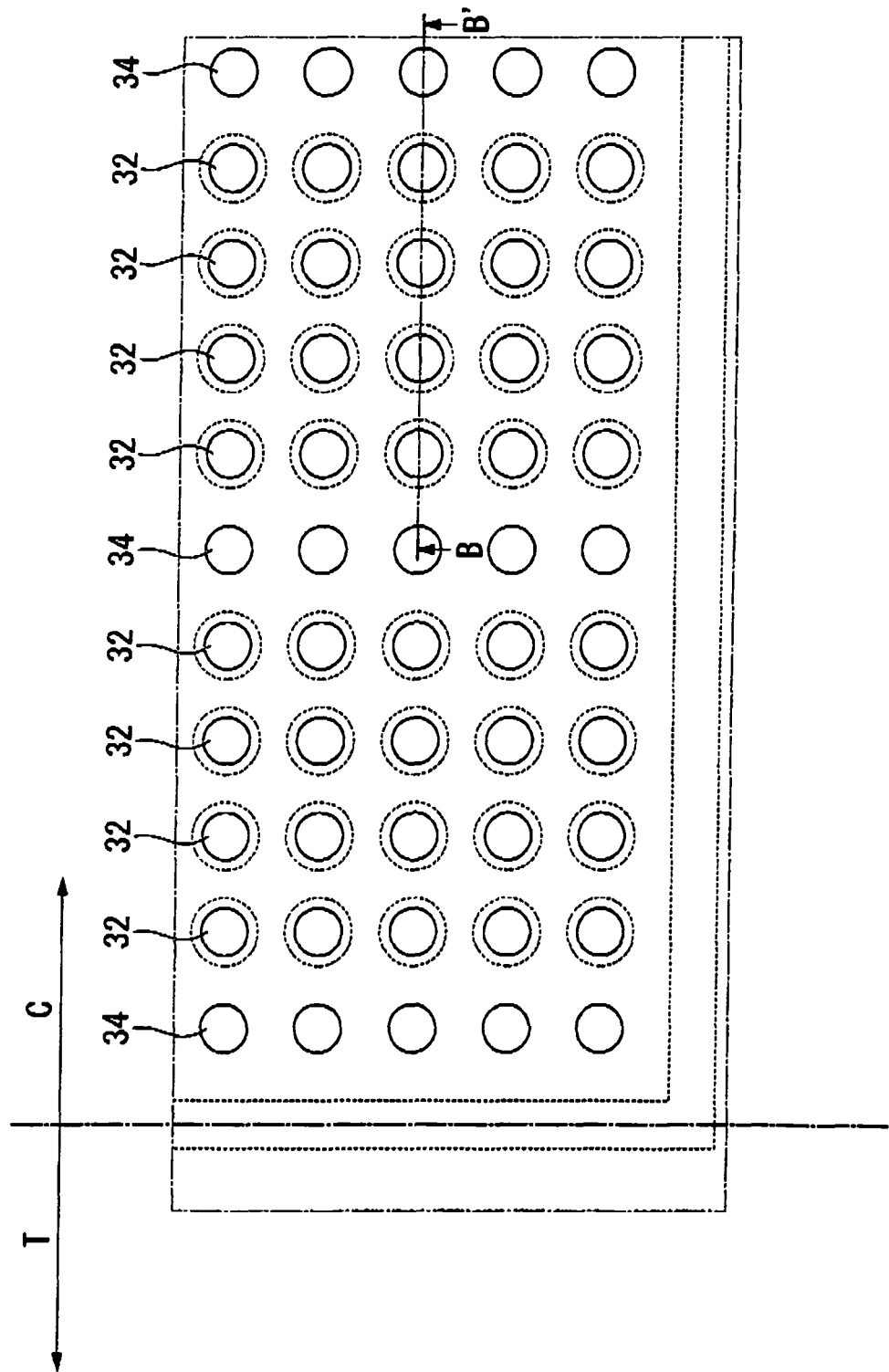

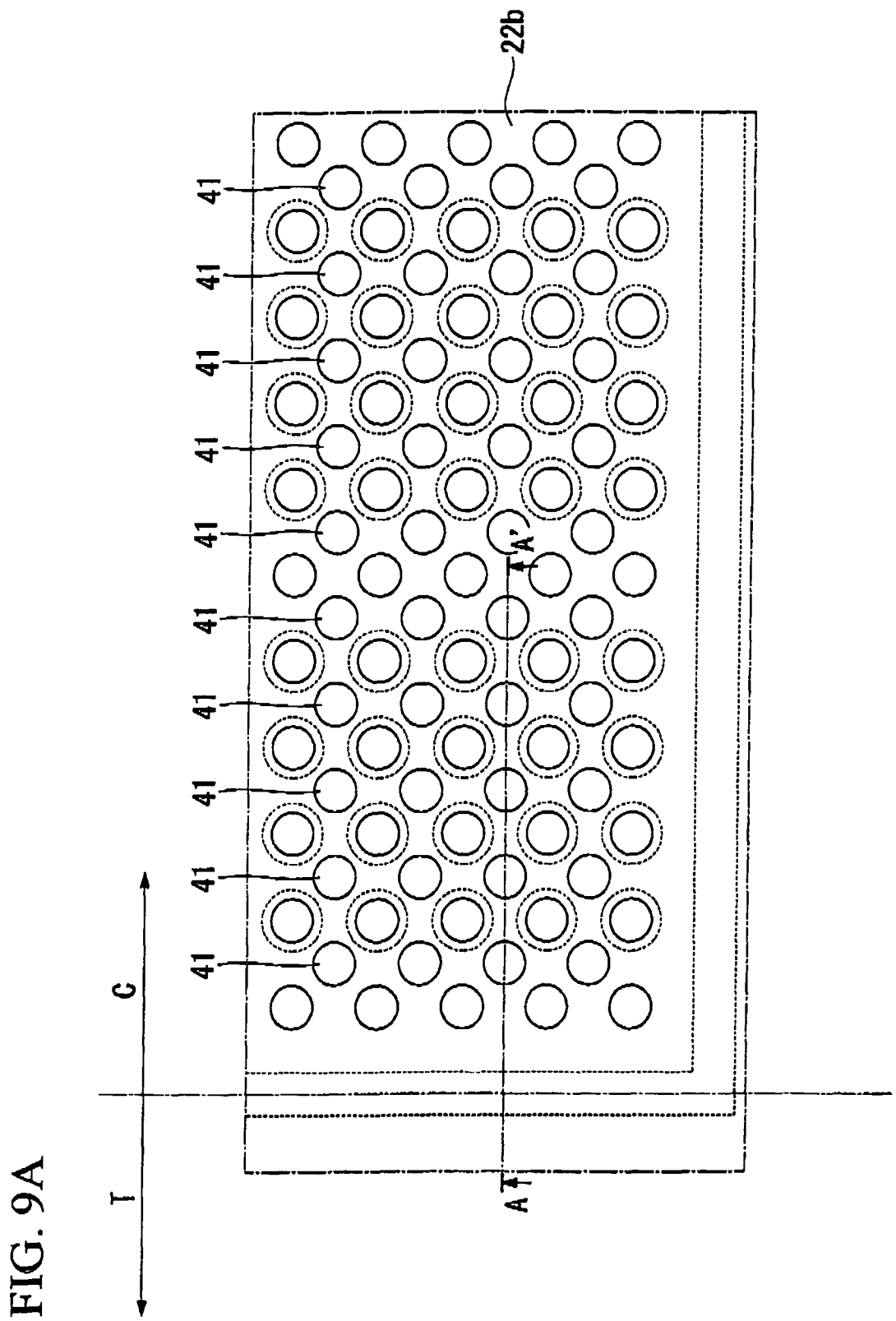

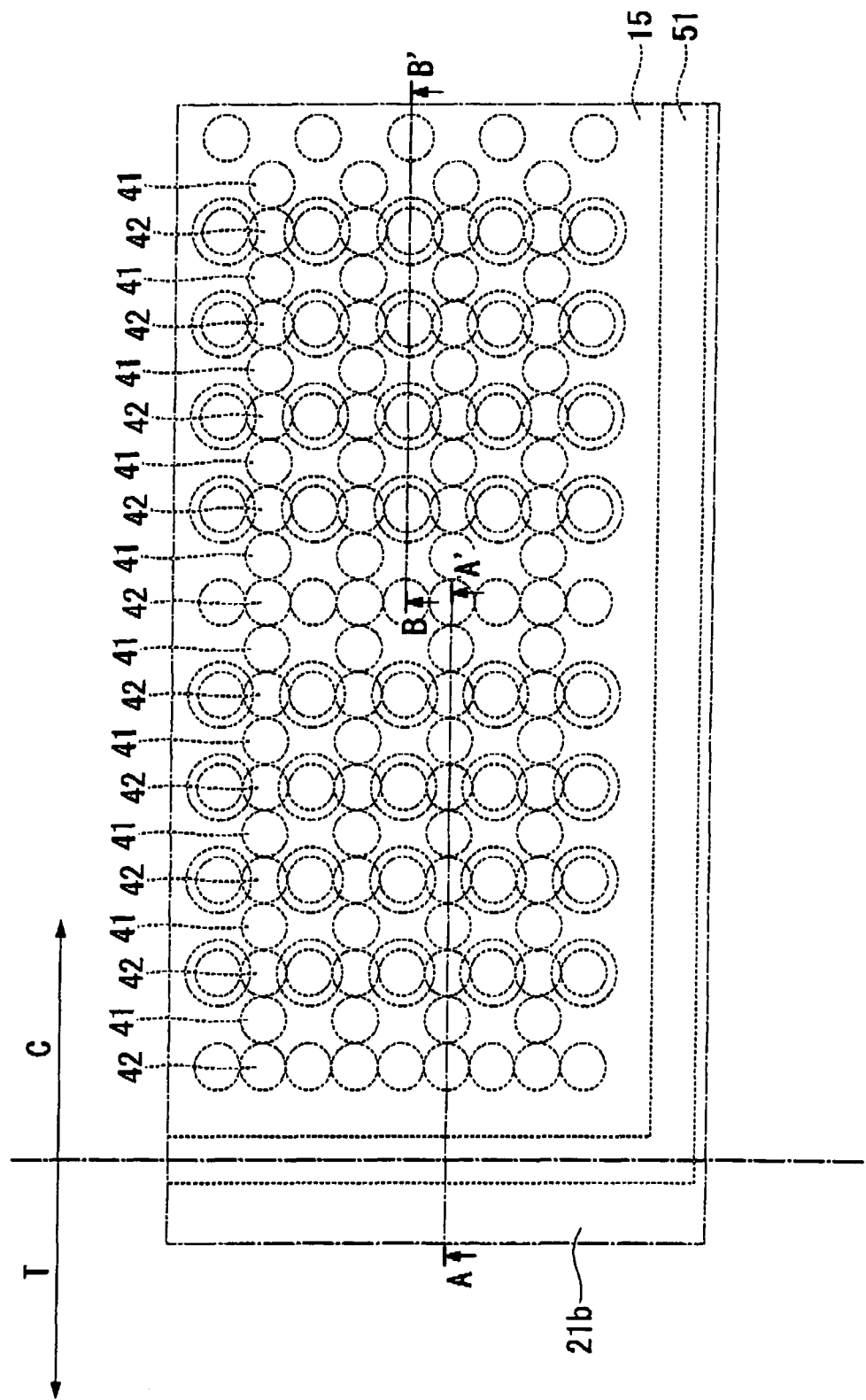

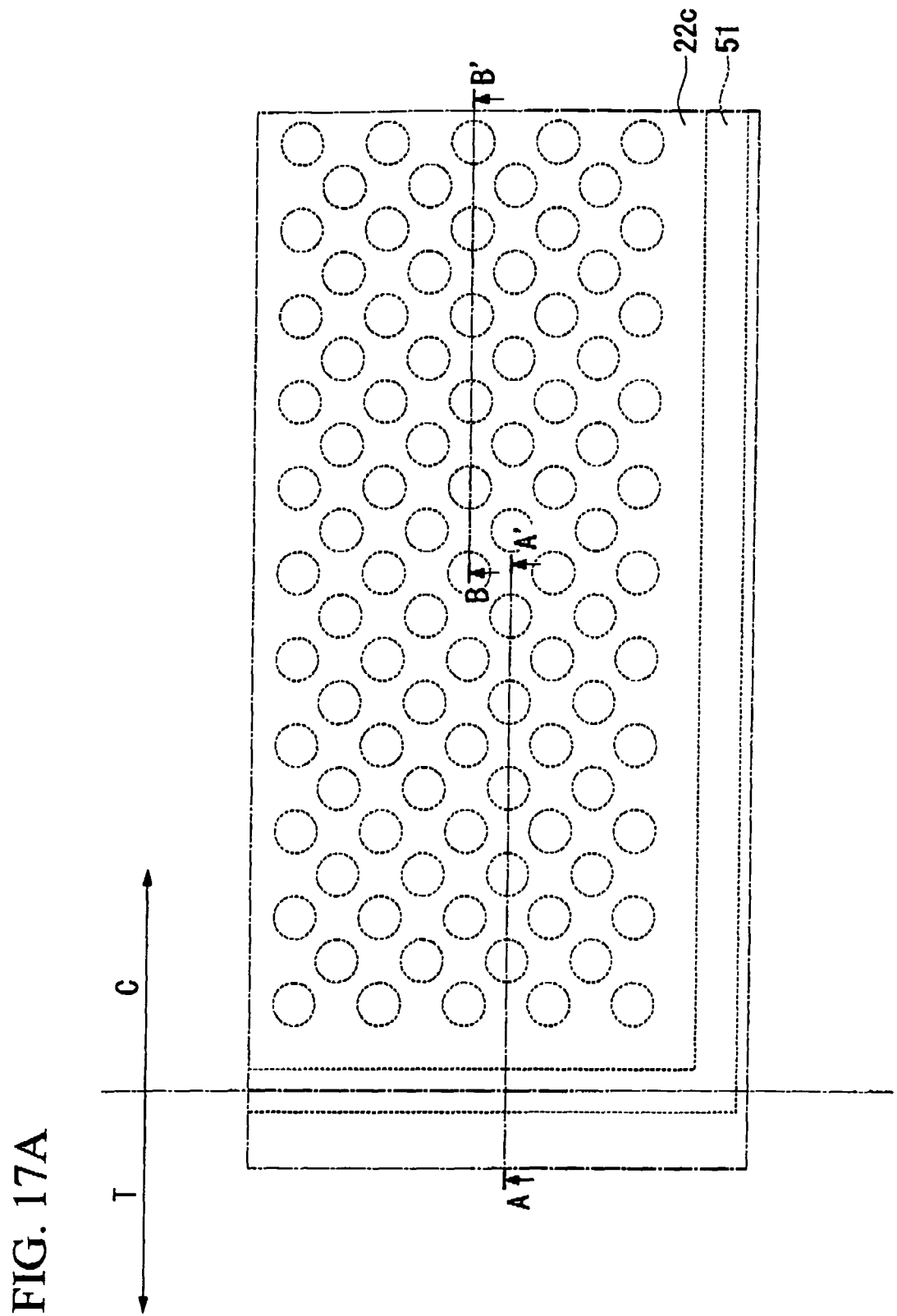

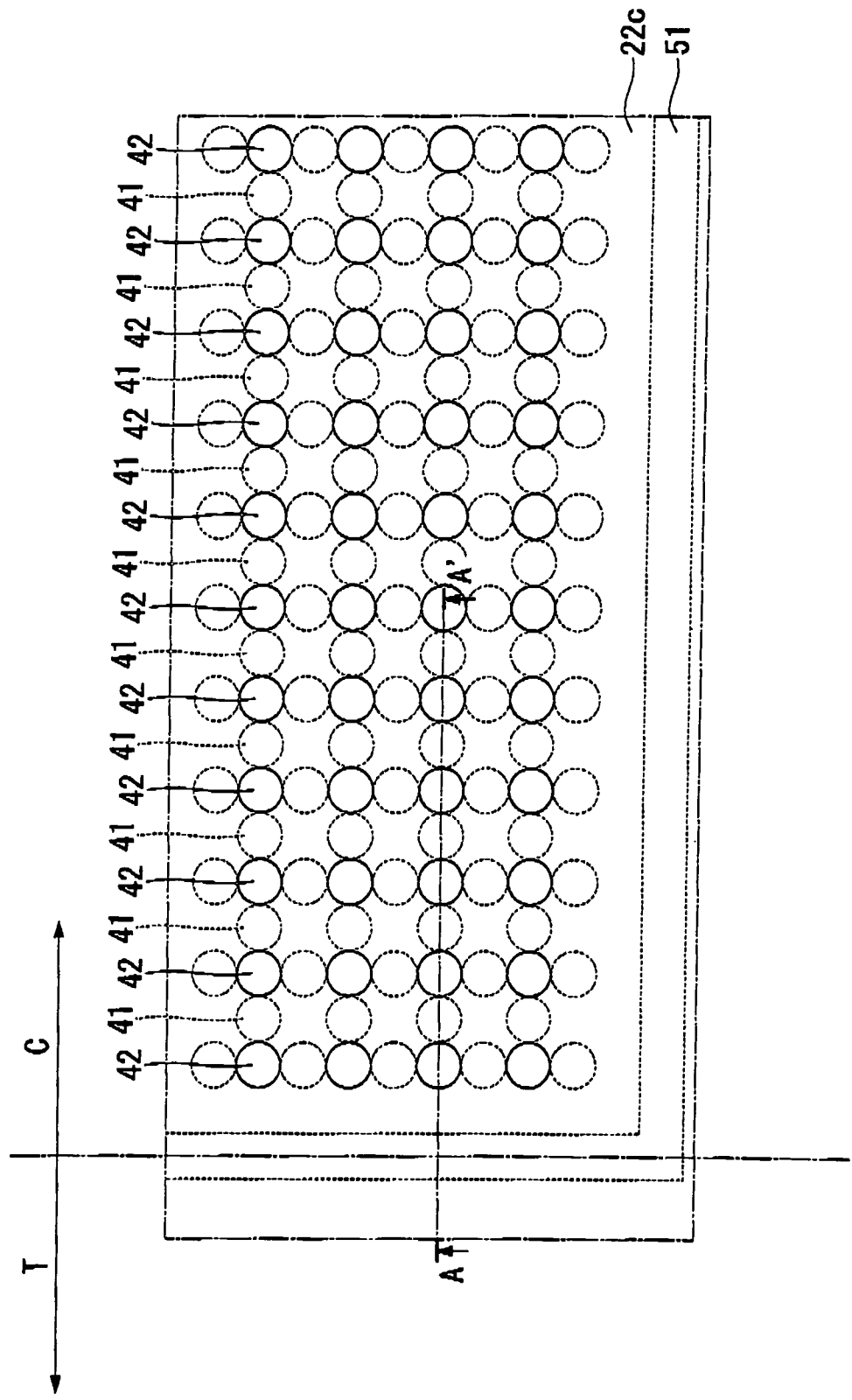

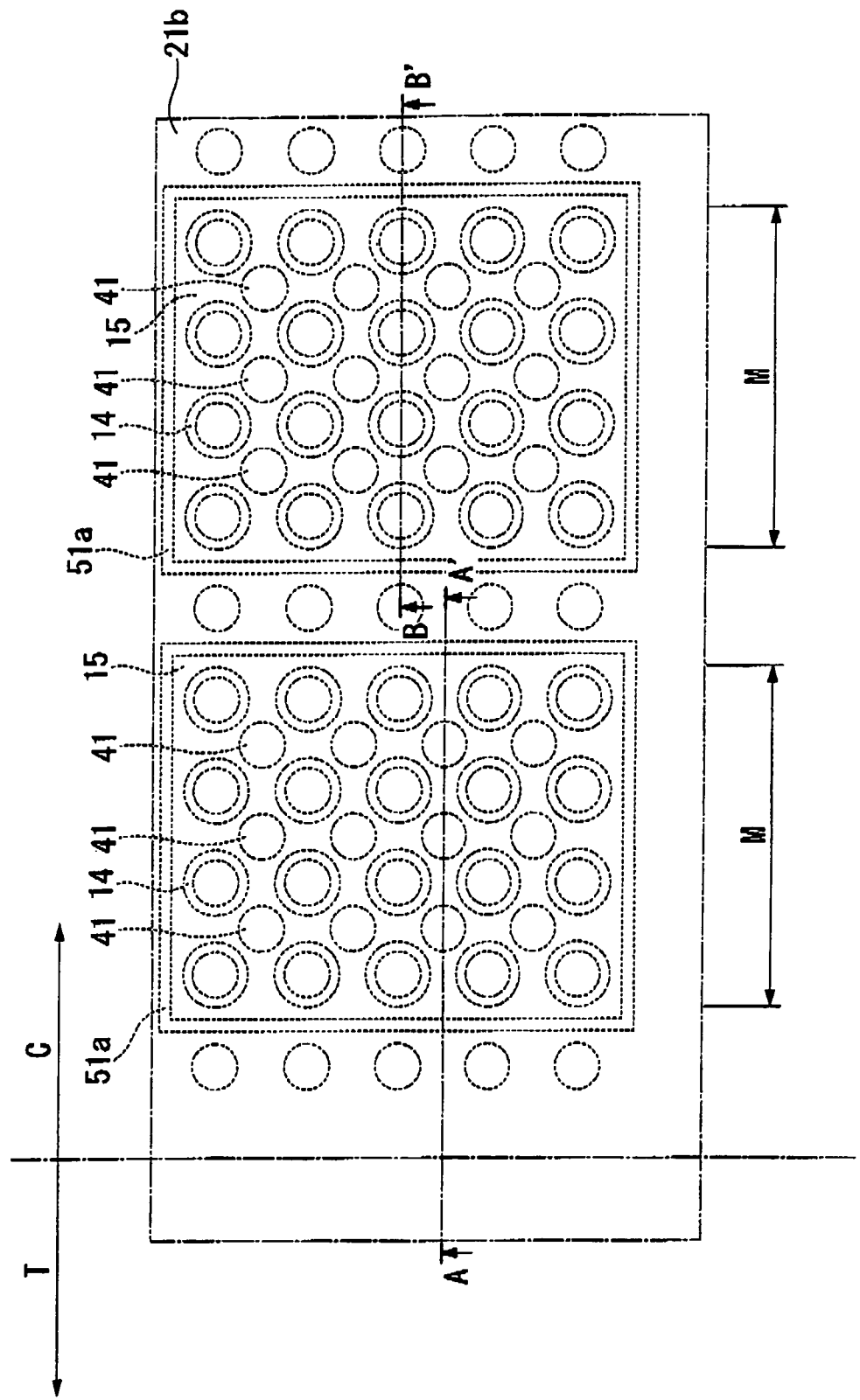

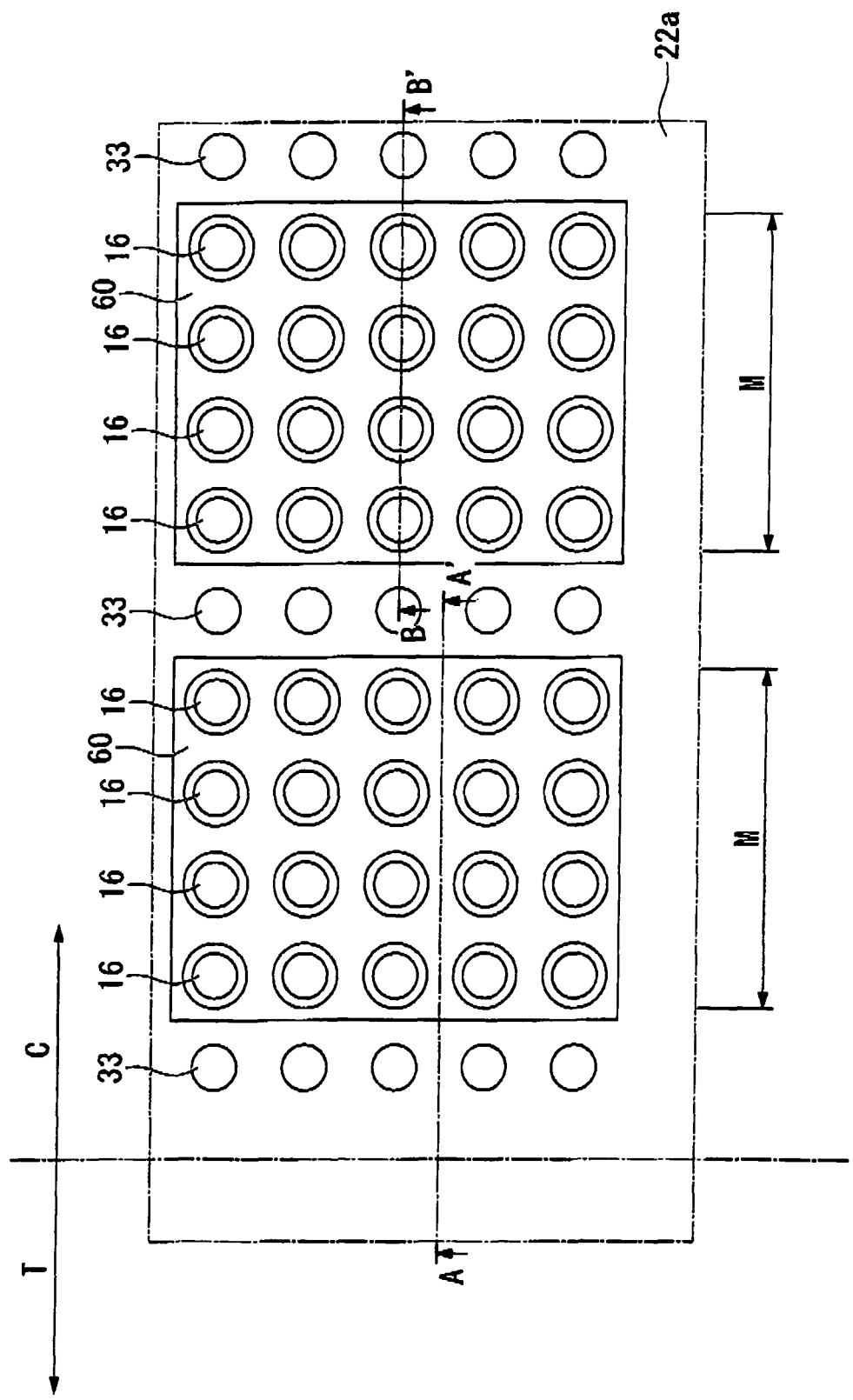

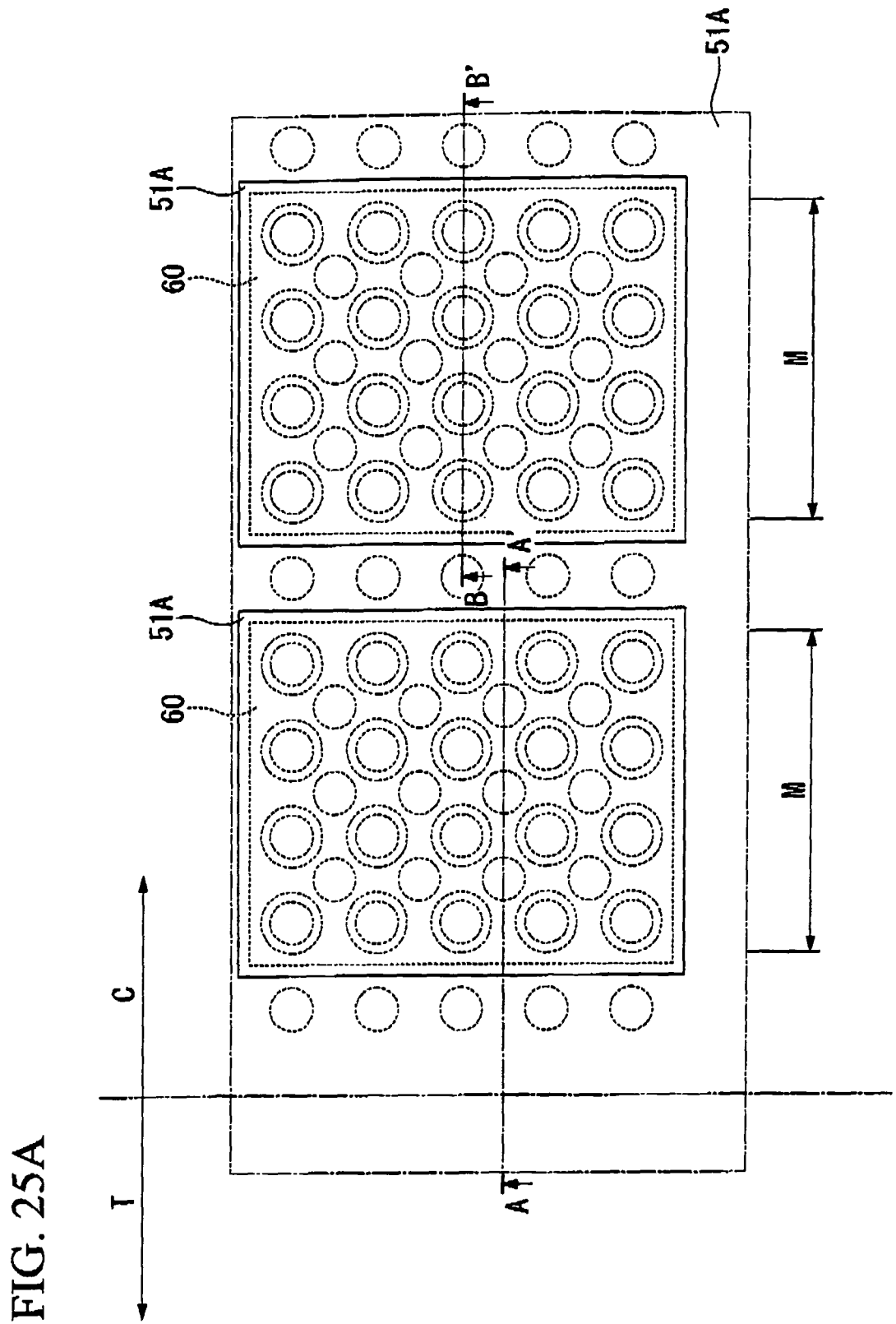

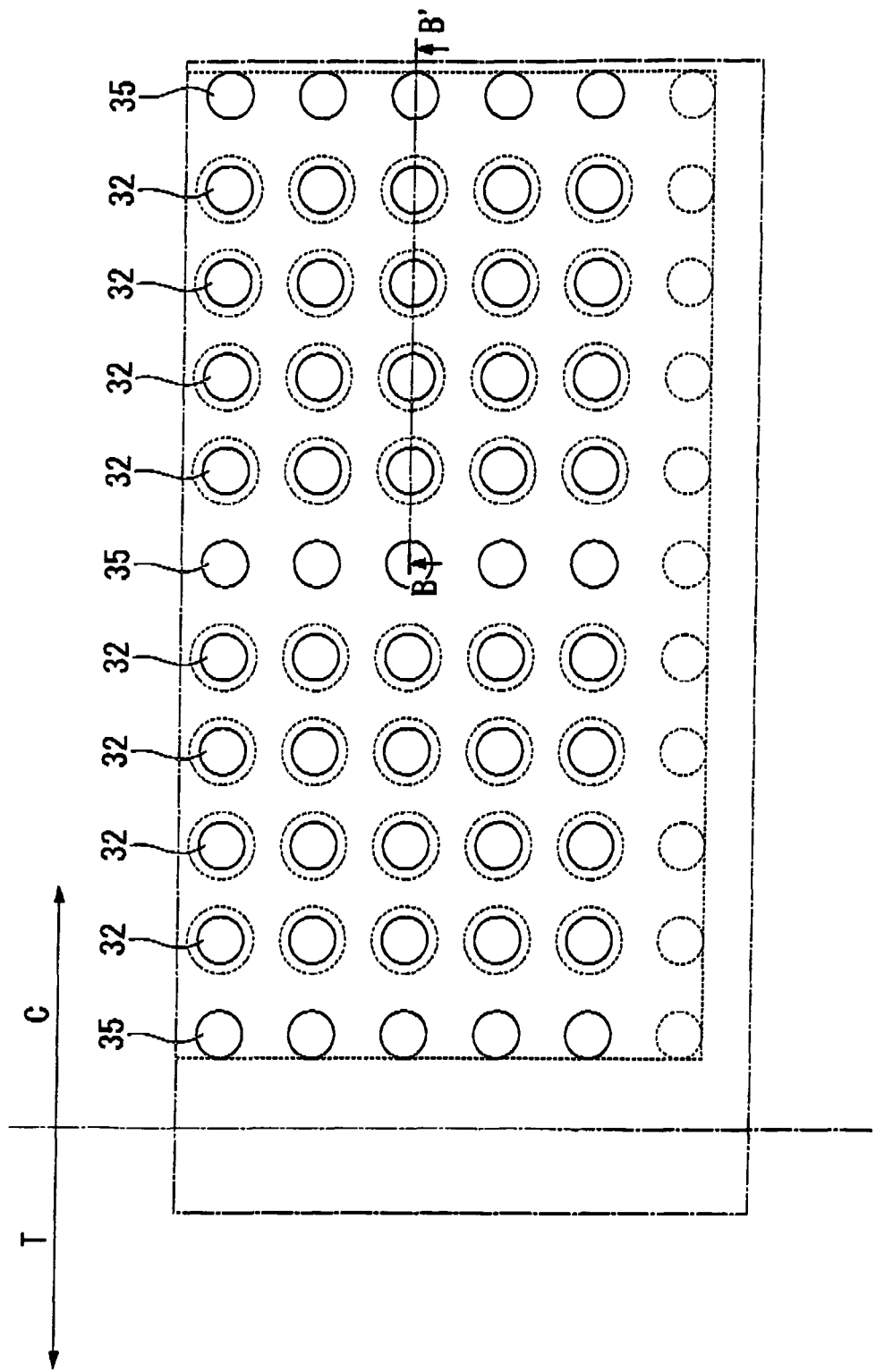

SEMICONDUCTOR DEVICE INCLUDING A PHASE-CHANGE MEMORY ELEMENT

BACKGROUND OF THE INVENTION

1. Field of the Invention

The present invention relates to a semiconductor device

Priority is claimed on Japanese Patent Application No. 2010-200004, filed Sep. 7, 2010, the content of which is incorporated herein by reference.

2. Description of the Related Art

PRAM (phase change random access memory) stores data by means of a change in resistance upon phase transition of a phase-change memory material layer between a crystalline state and an amorphous state. A memory cell circuit of PRAM has a structure in which one transistor and one resistor are included in one cell, as shown in FIG. 39 (see, for example, S. M. Sadeghipour, L. Pileggi, M. Asheghi, "Phase Change Random Access Memory, Thermal Analysis", ITHERM-06, pp 660).

As shown in FIG. 40, a general PRAM cell 100 with respect to one resistor has a cylindrical multi-layered structure including: a heater electrode 101; a phase-change memory material film 102; an upper electrode 103; and an insulating film 104 surrounding the heater electrode 101. The upper electrode 103 is larger in diameter than the heater electrode 101. Phase transition between the crystalline state and the amorphous state is implemented as follows. When a current is provided to the heater electrode 101, heat from the heater electrode 101 transfers to the phase-change memory material layer 102. Thus, phase transition occurs, and a phase-change region 102a is formed in the phase-change memory material layer 102. The current required for causing the phase transition is called a rewriting current.

Recently, it has been required to reduce the amount of the rewriting current to achieve lower power consumption. In the case of FIG. 40, a heat q1 is supplied from the heater electrode 101 to the phase-change memory material layer 102. A heat q2 is used for increasing a temperature of the heater electrode 101. Thus, a phase-change region 102a is formed over the heater electrode 101. In this case, not only the heat q1, but also the following heats q3, q4, q5, and q6 are supplied from the heater electrode 101. The heat q3 diffuses into the insulating film 104. The heat q4 diffuses into the heater electrode 101. The heats q5 and q6 spread from the phase-change region 102a toward the upper electrode 103 and the phase-change memory material layer 102.

A thermal conductivity of the heater electrode 101 is 20 W/k·m, which is much greater than that of another phase-change memory element, such as the phase-change memory material layer 102. For this reason, the heat q4, which is approximately 60 to 70% of the total heat generated from the heater electrode 101, diffuses into the heater electrode 101 itself rather than diffusing into the phase-change memory material layer 102.

Additionally, the thermal conductivities of the phase-change memory material layer 102, the upper electrode 103, and the insulating film 104 are smaller than that of the heater electrode 101, but are greater than that of the phase-change region 102a. For this reason, the heat generated from the heater electrode 101 spreads toward the phase-change memory material layer 102, the upper electrode 103, and the insulating film 104. Consequently, only the heat q1, which is only around 1% of the entire heat generated from the heater electrode 101, diffuses into the phase-change memory material layer 102 to contribute to the phase transition, thereby lowering the thermal efficiency, and therefore requiring a large rewriting current.

To achieve a reduction in the amount of rewriting current, the aforementioned document discloses a PRAM cell 200 as shown in FIG. 41, which prevents the heat of the heater electrode 101 from diffusing the heater electrode 101 itself. Similar to the PRAM cell 100 shown in FIG. 40, the PRAM cell 200 has a cylindrical multi-layered structure including a heater electrode 201, a phase-change memory material layer 202, an upper electrode 203, and an insulating film 204. The PRAM cell 200 differs from the PRAM cell 100 in that the diameter of the heater electrode 201 is equal to that of the upper electrode 203, and that the insulating film 204 surrounds a phase-change region 202a formed in the phase-change memory material film 202.

In the case of the PRAM cell 200, a current concentrates only in the phase-change memory material film 202. For this reason, the phase change region 202a is formed in a middle portion of the phase-change memory material film 202, which is separated from the heater electrode 201 having the large thermal conductivity. Accordingly, the thermal efficiency of the PRAM cell 200 becomes higher than that of the PRAM cell 100, and thereby a reduction in the rewriting current is expected (see also M. Gill, T. Lowrey, and J. Park, "Ovonic Unified Memory—A High-performance Nonvolatile Memory Technology for Stand Alone Memory and Embedded Applications", ISSCC 2002 Digest of Technical Papers vol. 45, pp. 202-203 and 459, February 2002; and G. Servalli, "A 45 nm Generation Phase Change Memory Technology", IEDM-09, pp. 113-116).

However, in the case of the PRAM cell 200 shown in FIG. 41, prevention of heat from diffusing into the lower electrode 201 can be achieved, but prevention of heat from diffusing into the insulating film 204 cannot be achieved. For this reason, the larger amount of heat causing phase transition than in the case of the PRAM cell 100 can be secured, but the amount of heat diffusing into the phase-change memory material film 202 is still small. Accordingly, further enhancement of thermal efficiency and further reduction in the rewriting current are required.

SUMMARY

In one embodiment, a semiconductor device may include, but is not limited to: a first insulating film; a second insulating film over the first insulating film; a first memory structure between the first and second insulating films; and a third insulating film between the first and second insulating films. The first memory structure may include, but is not limited to: a heater electrode; and a phase-change memory element between the heater electrode and the second insulating film. The phase-change memory element contacts the heater electrode. The third insulating film covers at least a side surface of the phase-change memory element. Empty space is positioned adjacent to at least one of the heater electrode and the third insulating film.

In another embodiment, a semiconductor device may include, but is not limited to: a first insulating film; a second insulating film over the first insulating film; and a plurality of memory structures between the first and second insulating films. Each of the plurality of memory structures is spatially separated from one another. Each of the plurality of memory structures may include, but is not limited to: a heater electrode; and a phase-change memory element between the heater electrode and the second insulating film. The phase-change memory element contacts the heater electrode.

BRIEF DESCRIPTION OF THE DRAWINGS

The above features and advantages of the present invention will be more apparent from the following description of certain preferred embodiments taken in conjunction with the accompanying drawings, in which:

FIG. 2A is a plan view illustrating the semiconductor device of the first embodiment;

FIG. 13A is a cross-sectional view illustrating a semiconductor device according to a third embodiment of the present invention;

FIG. 22A is a plan view illustrating an example of a semiconductor device according to a fourth embodiment of the present invention;

FIGS. 32A to 35B illustrate a process flow indicative of a method of manufacturing the semiconductor device of the fifth embodiment;

DETAILED DESCRIPTION OF THE PREFERRED EMBODIMENTS

The present invention will now be described herein with reference to illustrative embodiments. The accompanying drawings explain a semiconductor device and a method of manufacturing the semiconductor device in the embodiments. The size, the thickness, and the like of each illustrated portion might be different from those of each portion of an actual semiconductor device.

Those skilled in the art will recognize that many alternative embodiments can be accomplished using the teachings of the present invention and that the present invention is not limited to the embodiments illustrated herein for explanatory purposes.

First Embodiment

Figure 1:
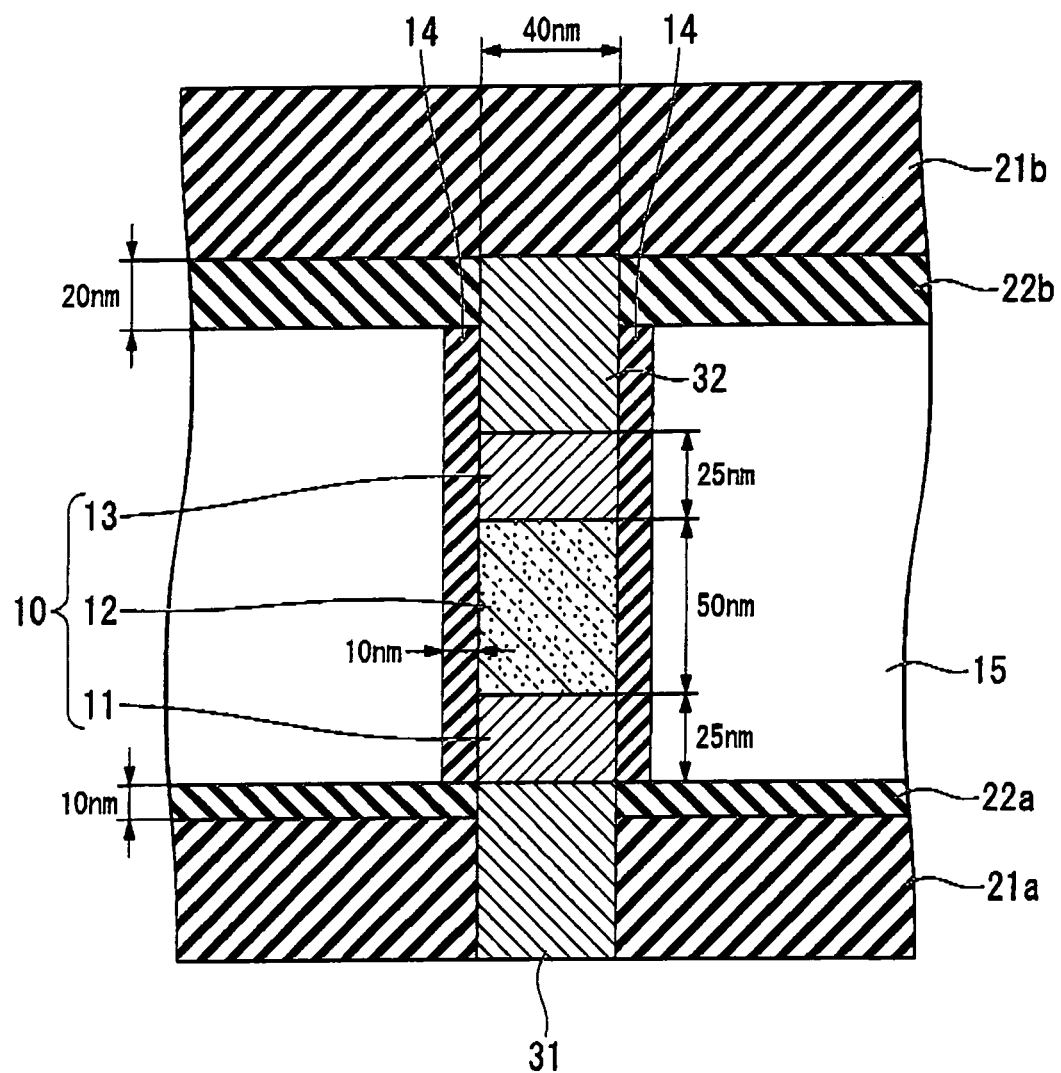
FIG. 1 is a cross-sectional view illustrating an example of a semiconductor device according to a first embodiment of the present invention.
Figure 2B:
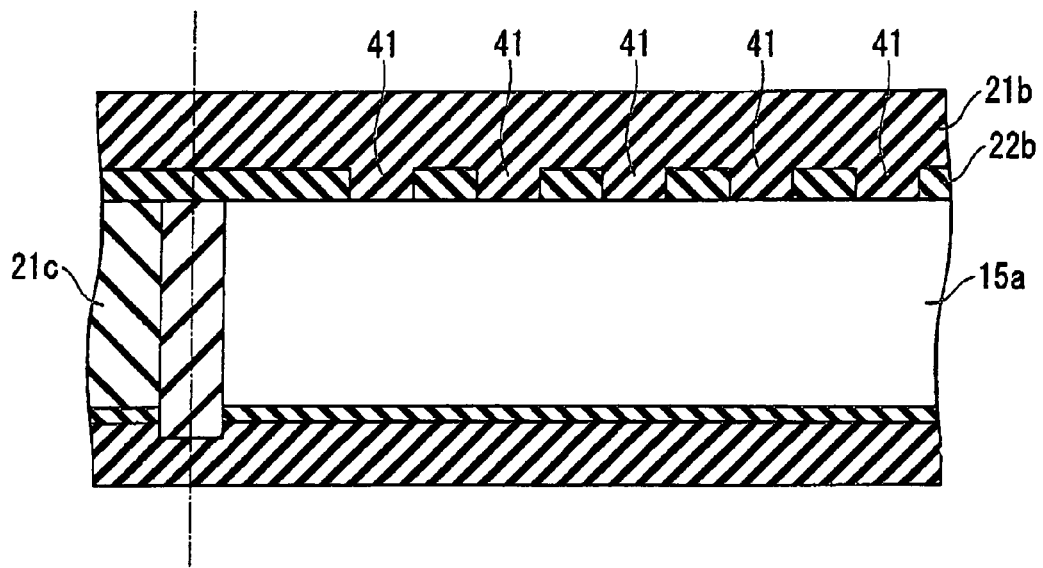
FIGS. 2B and 2C are cross-sectional views taken along lines A-A' and B-B' shown in FIG. 2A, respectively.
Figure 2C:
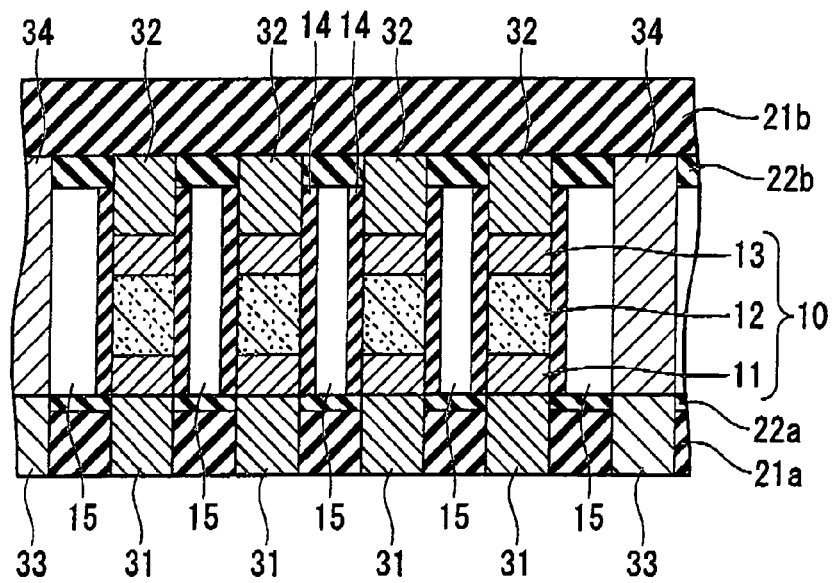

Hereinafter, a semiconductor device according to a first embodiment of the present invention is explained. FIG. 1 is a cross-sectional view illustrating an example of the semiconductor device of the first embodiment. FIG. 2A is a plan view illustrating part of the semiconductor device of the first embodiment. FIGS. 2B and 2C are cross-sectional views taken along lines A-A' and B-B' shown in FIG. 2A, respectively.

As shown in FIGS. 1, 2A to 2C, the semiconductor device of the first embodiment is a phase change memory including: an element layer over a semiconductor substrate (not shown), the element layer including a switching element (not shown); a phase-change memory element 10 over the element layer; an inter-layer insulating film (second inter-layer insulating film 21b) over the phase-change memory element 10; a vacuum space portion 15 between the element layer and the second inter-layer insulating film 21b, the vacuum space portion 15 surrounding the phase-change memory element 10.

The phase-change memory element 10 has a multi-layered structure including: a heater electrode 11 coupled to the switching element; a phase-change memory material layer 12 over the heater electrode 11, the phase-change memory material layer 12 being subjected to phase transition caused by heat from the heater electrode 11; and an upper electrode 13 over the phase-change memory material layer 12. The space portion 15 surrounds the heater electrode 11, the phase-change memory material layer 12, and the upper electrode 13.

As shown in FIG. 2A, the semiconductor substrate has a memory cell region C and a peripheral circuit region T surrounding the memory cell region C. As shown in FIG. 2C, multiple phase-change memory elements 10 are arranged in a matrix over the memory cell region C. The switching element (not shown) included in the element layer includes, for example, a MOS transistor that includes: a gate electrode coupled to a word line; a source electrode coupled to a bit line; and a drain electrode coupled to the heater electrode 11.

Hereinafter, the structure of the semiconductor device of the first embodiment is explained in detail. As shown in FIG. 1, the element layer includes: a first inter-layer insulating film 21a; and a first etching stopper film 22a having a etching selectivity different from that of the first inter-layer insulating film 21a. The first inter-layer insulating film 21a is made of a silicon oxide film or the like. The first etching stopper film 22a is made of a silicon nitride film having a thickness of 10 nm, or the like. A first contact plug 31 is provided so as to penetrate the first inter-layer insulating film 21a and the first etching stopper film 22a. The first contact plug 31 is coupled to, for example, a drain electrode of a MOS transistor (not shown). The diameter of the first contact plug 31 is, for example, 40 nm. The first contact plug is made of tungsten or the like.

The heater electrode 11, the phase-change memory material layer 12, and the upper electrode 13 are stacked over the first contact plug 31. The stack of the heater electrode 11, the phase-change memory material layer 12, and the upper electrode 13 has a cylindrical shape having the diameter of, for example, 40 nm. The heater electrode 11 and the upper electrode 13 are made of a titanium nitride film or the like. Each of the heater electrode 11 and the upper electrode 13 has the thickness of, for example, 25 nm. The phase-change memory material layer 12 is made of a GST (GeSbTe) film, or the like. The GST film has a characteristic in that the resistance value varies according to a cooling rate. If the GST film is cooled slowly, crystal with low resistance is formed. If the GST film is cooled quickly, amorphous with high resistance is formed. The thickness of the phase-change memory material layer 12 is, for example, approximately 50 nm.

A protection insulating film 14 covers a side surface of the phase-change memory element 10. The thickness of the protection insulating film 14 is, for example, 10 nm. The protection insulating film 14 functions as a protection film that protects the phase-change memory element 10 when the space portion 15 is formed. Similar to the first etching stopper film 22a, the protection insulating film 14 is preferably made of a silicon nitride film.

A second etching stopper 22b is disposed over the phase-change memory elements 10 and the protection insulating film 14. The second inter-layer insulating film 21b is disposed over the second etching stopper film 22b. A second contact plug 32 penetrates the second etching stopper film 22b so as to be coupled to the upper electrode 13. The second contact plug 32 is made of tungsten or the like. The second contact plug 32 and the upper electrode 13 have the same diameter of, for example, approximately 40 nm. The phase-change memory element 10 and the space portion 15 surrounding the phase-change memory element 10 are disposed between the first and second etching stopper films 22a and 22b.

As shown in FIGS. 2A and 2B, the space portion 15 is disposed over the memory cell region C. A partition layer 51 surrounds the memory cell region C to separate the memory cell region C from the peripheral circuit region T. The horizontal thickness of the partition layer 51 is, for example, 40 nm. The bottom level of the partition layer 51 reaches the top level of the first inter-layer insulating film 21a. The partition layer 51 is made of a silicon nitride film, similar to the first and second etching stopper films 22a and 22b, and the protection insulating film 14.

As shown in FIG. 2B, the second etching stopper film 22b has first holes 41 each having a diameter substantially equal to that of the phase-change memory element 10. The first holes 41 are filled with the second inter-layer insulating film 21b. As shown in FIG. 2A, the first holes 41 are arranged in a matrix in plan view. Each first hole 41 is positioned in plan view inside four neighboring phase-change memory elements 10. Preferably, the second inter-layer insulating film 21b is made of a silicon oxide film formed under a lower coverage condition. Similar to the first etching stopper film 22a and the protection insulating film 14, the second etching stopper film 22b is preferably made of a silicon nitride film having the etching selectivity different from those of the first inter-layer insulating film 21a and the second inter-layer insulating film 22a.

Thus, the space portion 15 is sealed by the partition layer 51, the first and second etching stopper films 22a and 22b, and the second inter-layer insulating film 21b. The protection insulating film 14 separates the phase-change memory element 10 from the space portion 15.

As shown in FIG. 2C, a third contact plug 33 penetrates the element layer over the memory cell region C. The third contact plug 33 and the first contact plug 31 have the same shape and diameter. A fourth contact plug 34 is coupled onto the third contact plug 33. The third and fourth contact plugs 33 and 34 are made of tungsten. The third and fourth contact plugs 33 and 34 have substantially the same diameter of approximately 40 nm. The top level of the fourth contact plug 34 is substantially equal to the top levels of the second contact plug 32 and the second etching stopper film 22b.

Hereinafter, a method of manufacturing the semiconductor device of the first embodiment is explained. The manufacturing method of the first embodiment mainly includes: a process of forming the phase-change memory elements 10; and a process of forming the space portion 15. FIGS. 3A to 11C illustrate a process flow indicative of a method of manufacturing the semiconductor device of the first embodiment. Each of the figures A is a plan view illustrating a process of the manufacturing method. Each of the figures B is a cross-sectional view taken along line A-A' shown in the corresponding figure A. Each of the figures C is a cross-sectional view taken along line B-B' shown in the corresponding figure A.

Figure 3B:
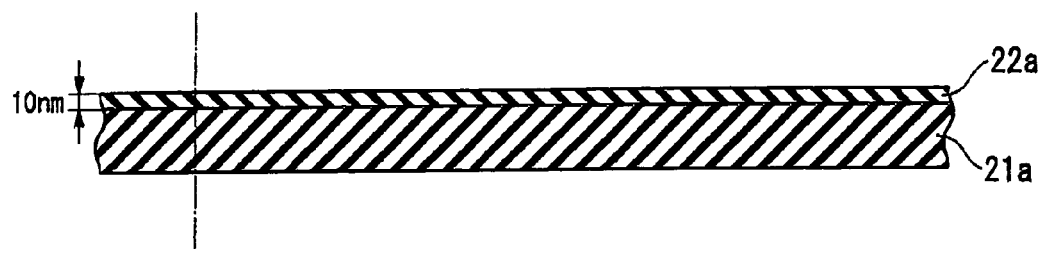
FIG. 3A to 11C illustrate a process flow indicative of a method of manufacturing the semiconductor device of the first embodiment.

Hereinafter, the process of forming the phase-change memory elements 10 is explained with reference to FIGS. 3A to 6B. As shown in FIG. 3B, the first etching stopper film 22a is formed over the first inter-layer insulating film 21a. Preferably, the first inter-layer insulating film 21a is made of a silicon oxide film. The first etching stopper film 22a is preferably made of a silicon nitride film having the etching selectivity different from that of the first inter-layer insulating film 21a. The thickness of the first etching stopper 22a is, for example, approximately 10 nm.

Figure 3C:
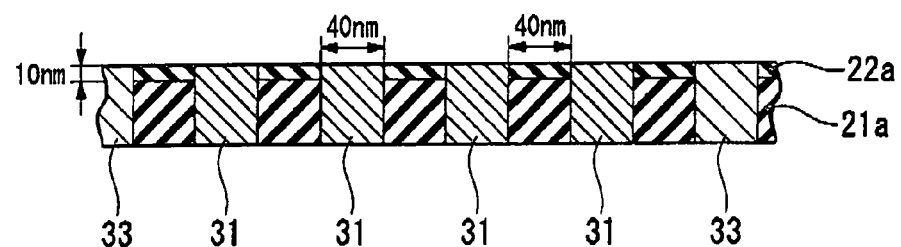

Then, the first contact plug 31 and the third contact plug 33 are formed so as to penetrate the first inter-layer insulating film 21a and the first etching stopper film 22a, as shown in FIG. 3C. The first contact plug 21 is a contact plug to be coupled to a MOS transistor or the like.

In the first embodiment, the element layer is defined as a layer including the first inter-layer insulating film 21a, the first and third contact plugs 31 and 33, and switching elements (which are not shown, but are formed under the first contact plugs 31). As shown in FIG. 3A, the first contact plugs 31 are arranged in a matrix in plan view. The third contact plugs 33 are arranged in a line between two lines of the first contact plugs 31.

Figure 4A:
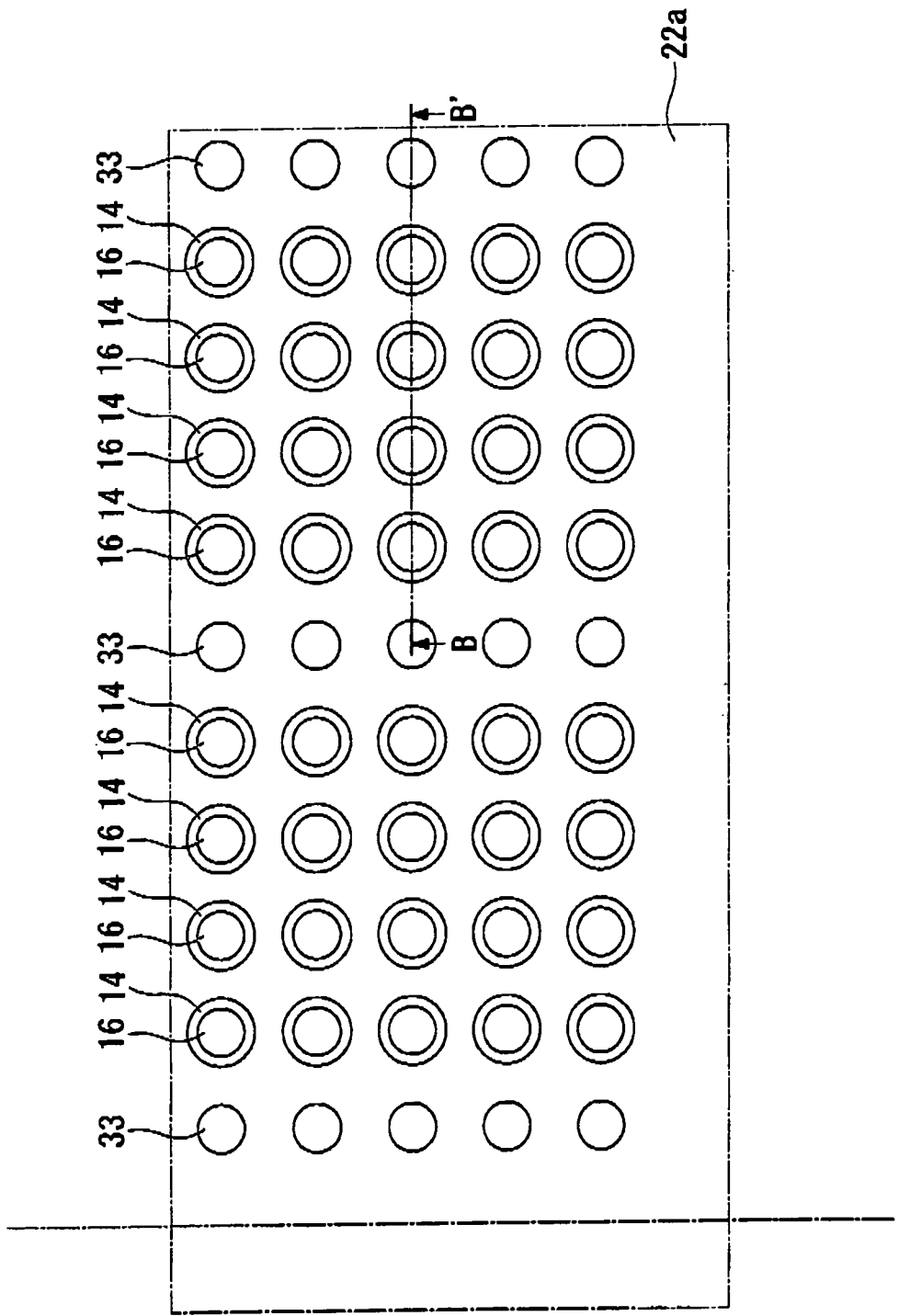
Figure 4B:
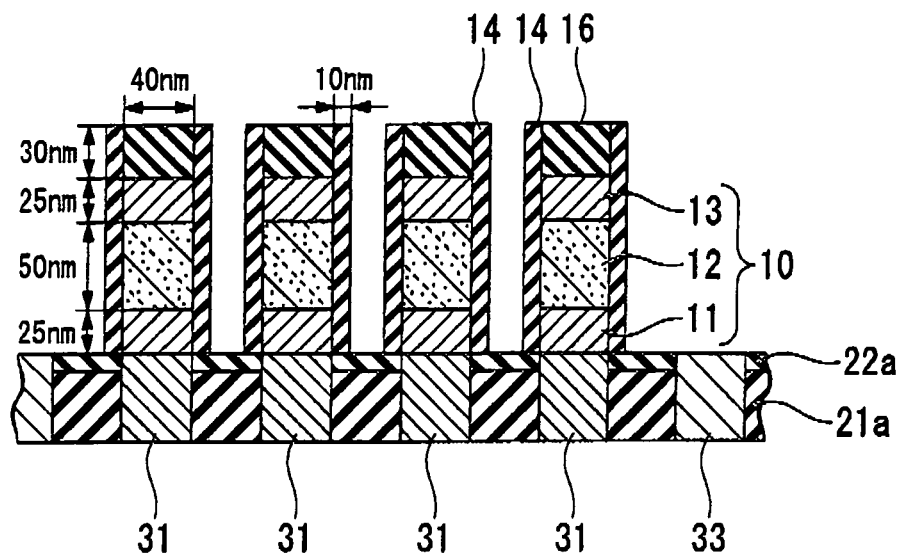

Then, a stack of the heater electrode 11, the phase-change memory material layer 12, the upper electrode 13, and a SiN film 16 is formed over the first etching stopper film 22a, as shown in FIG. 4B. Then, the stack of the heater electrode 11, the phase-change memory material layer 12, the upper electrode 13, and a SiN film 16 is selectively removed by photolithography and etching processes. Thus, the cylindrical phase-change memory electrodes 10 are formed over the first contact plugs 31.

Then, a silicon nitride film is formed over the first etching stopper film 22a so as to cover the phase-change memory elements 10. Then, portions of the silicon nitride film, which cover the first etching stopper film 22a, are anisotropically etched. Thus, the protection insulating film 14 covering the side surface of the phase-change memory element 10 is formed as shown in FIGS. 4A and 4B.

Figure 5B:
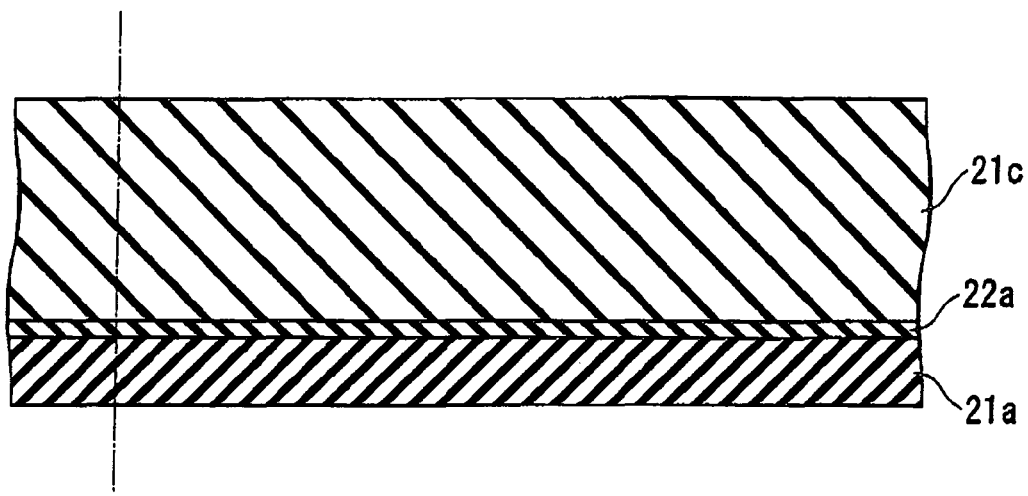
Figure 5C:
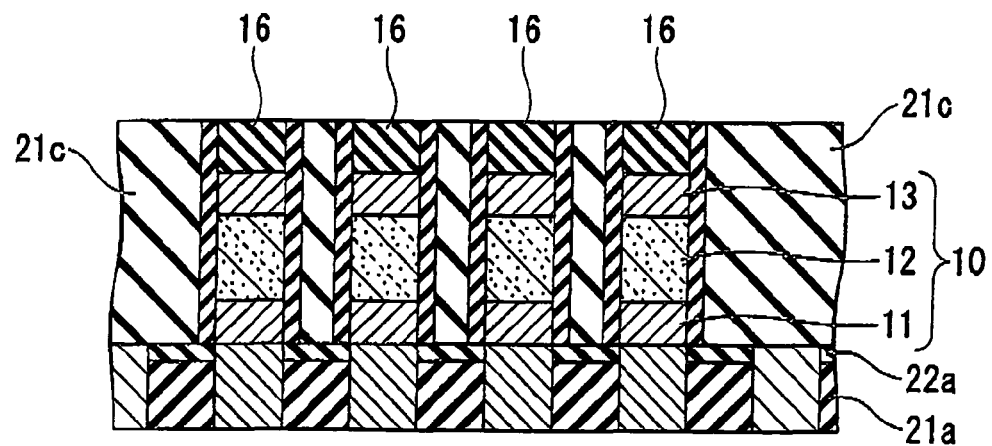
Figure 6A:
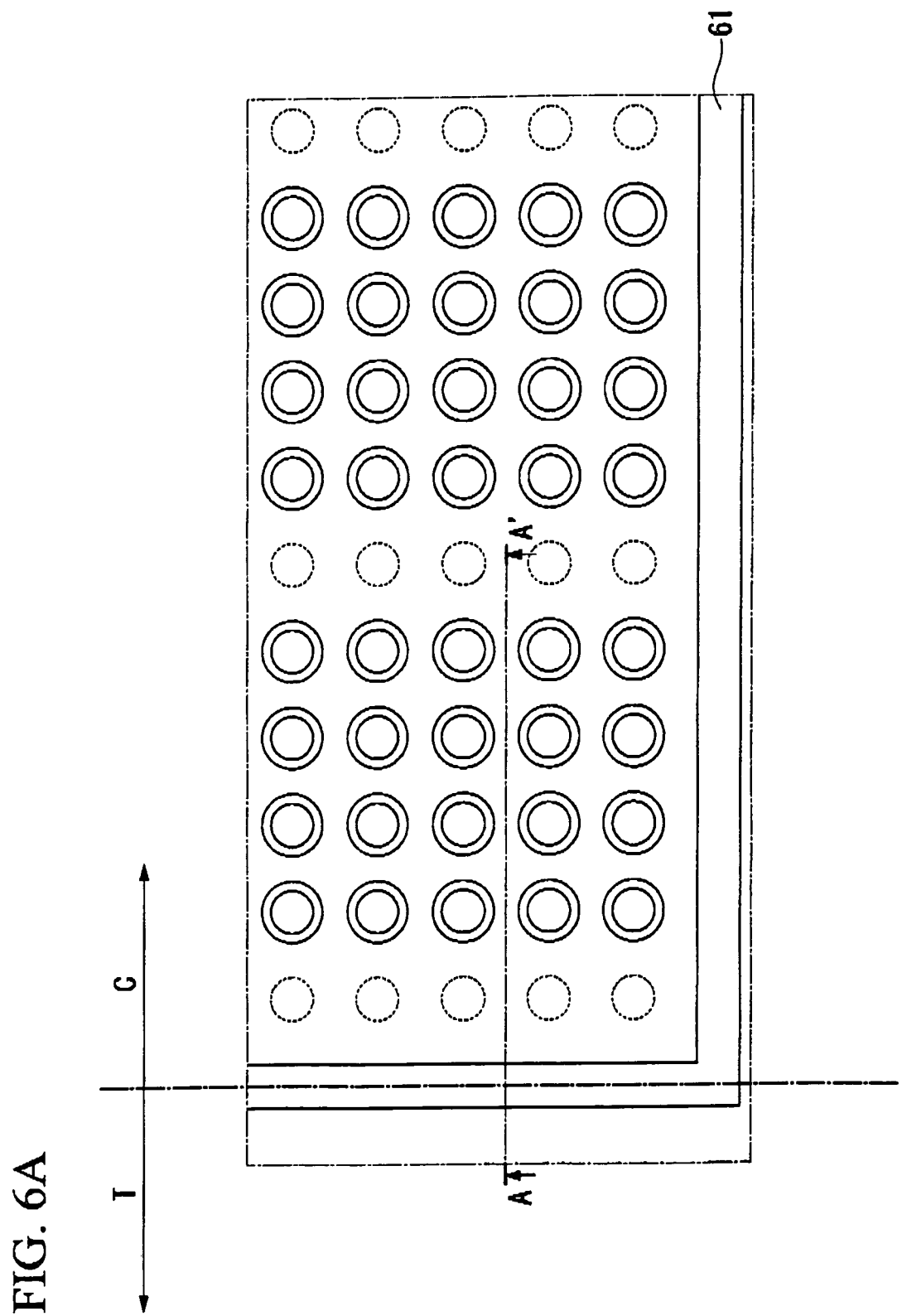
Figure 6B:
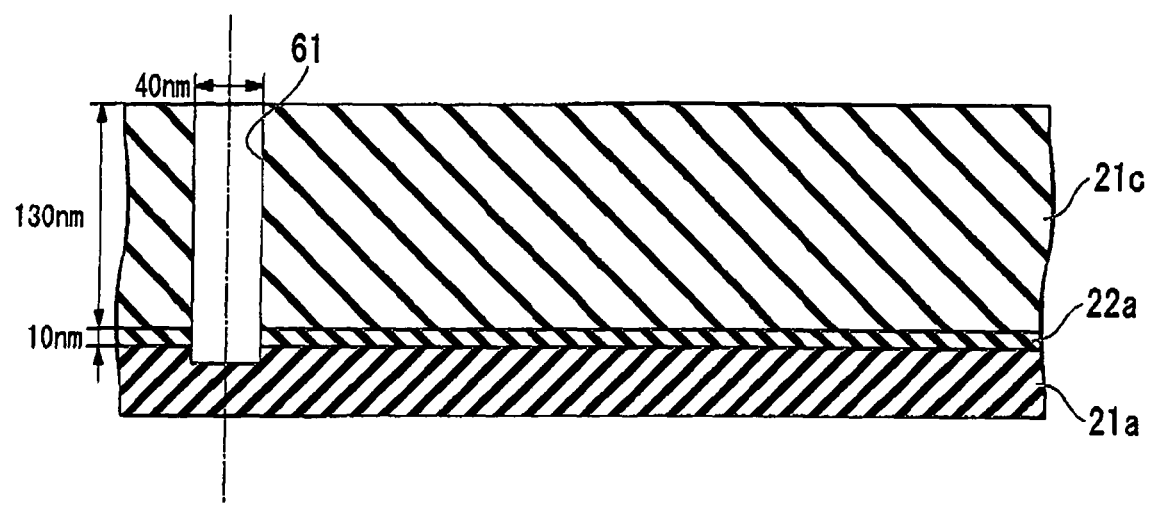

Then, a silicon oxide film is formed over the first etching stopper film 22a so as to cover the phase-change memory elements 10. Then, the silicon oxide film is planarized by a CMP (chemical mechanical polishing) method until upper surfaces of the protection insulating film 14 and the SiN film 16 are exposed. Thus, the third inter-layer insulating film 21c is formed as shown in FIGS. 5A to 5C.

Then, the third inter-layer insulating film 21c is selectively removed by photolithography and etching processes to form the groove 61 over a boundary region between the memory cell region C and the peripheral circuit region T. The groove 61 surrounds the memory cell region C. The horizontal width of the groove 61 is approximately 40 nm. The depth of the groove 61 is greater than or equal to 140 nm such that the bottom surface of the groove 61 reaches the first etching stopper film 22a.

Figure 7B:
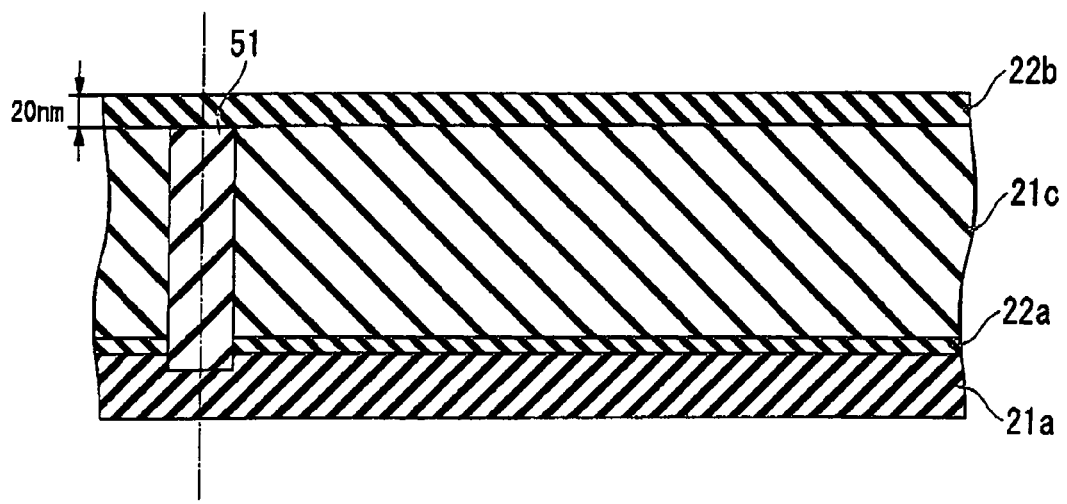

Hereinafter, the next process of forming the space portion 15 is explained with reference to FIGS. 7A to 11C. As shown in FIGS. 7A and 7B, the groove 61 is filled with a silicon nitride film that is the same material for forming the first etching stopper film 22a and the protection insulating film 14. Thus, the partition layer 51 having the width of approximately 40 nm is formed. The partition layer 51 separates the memory cell region C from the peripheral circuit region T.

Figure 7C:
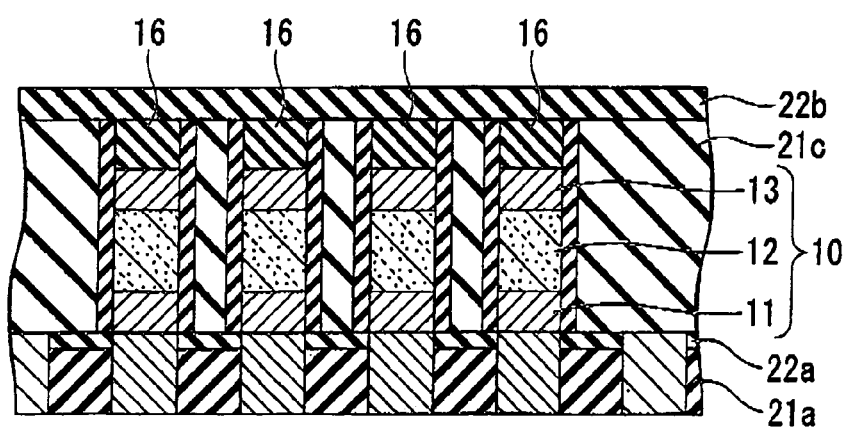

Then, a silicon nitride film is formed over the third inter-layer insulating film 21c and the phase-change memory element 10. Thus, the second etching stopper film 22b, which has the thickness of approximately 20 nm, is formed as shown in FIGS. 7B and 7C.

Figure 8B:
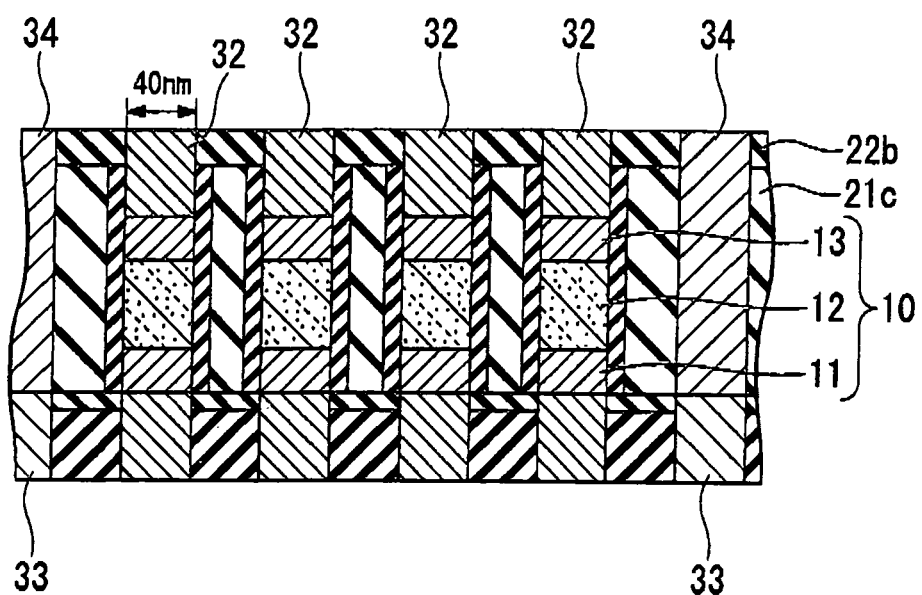

Then, contact holes, which penetrate the third inter-layer insulating film 21c and the second etching stopper film 22b, are formed so as to expose the upper surfaces of the third contact plugs 33, as shown in FIGS. 8A and 8B. Then, the second etching stopper film 22b and the SiN film 16 are selectively removed to form contact holes over the phase-change memory elements 10.

Then, a tungsten film is formed over the second etching stopper film 22b so as to fill the contact holes. Then, the tungsten film is planarized by the CMP method so as to expose the upper surface of the second etching stopper film 22b. Thus, the second contact plugs 32 are formed over the respective phase-change memory elements 10, and the fourth contact plugs 34 are formed over the respective third contact plugs 33.

Figure 9B:
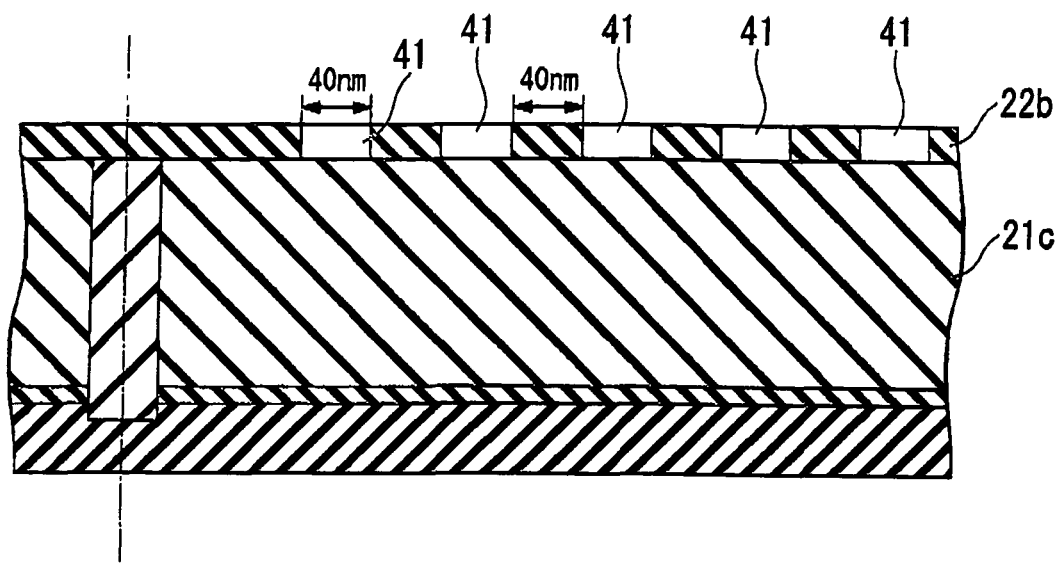

Then, first holes 41 are formed in the second etching stopper film 22b over the memory cell region C by photolithography and etching processes, as shown in FIGS. 9A and 9B. The diameter of the first hole 41 is, for example, approximately 40 nm. The first holes 41 are arranged in a matrix such that each first hole 41 is positioned inside four neighboring phase-change memory elements 10 in plan view. Preferably, the distance between two adjacent first holes 14 is, for example, approximately 40 nm.

Figure 10A:
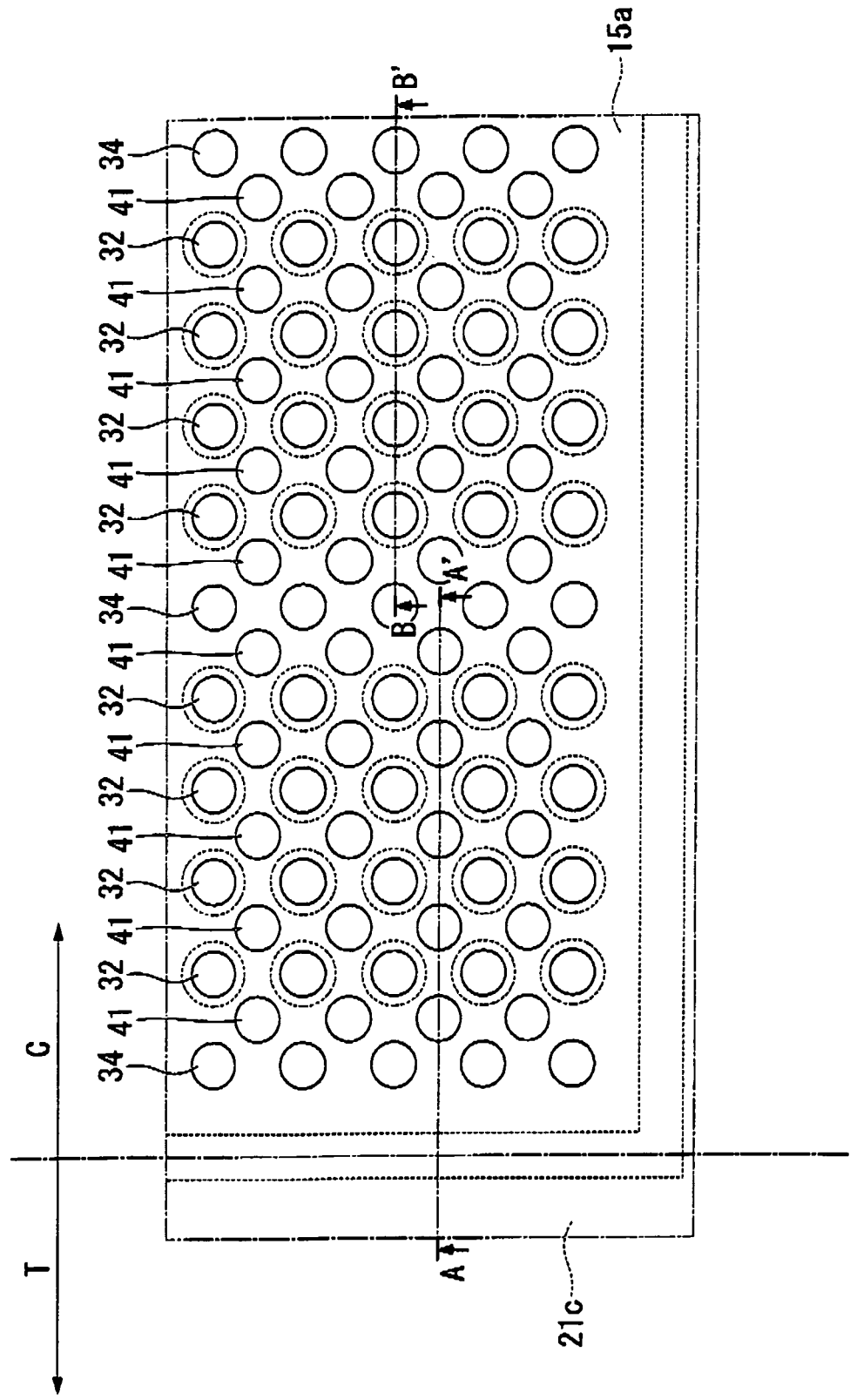
Figure 10B:
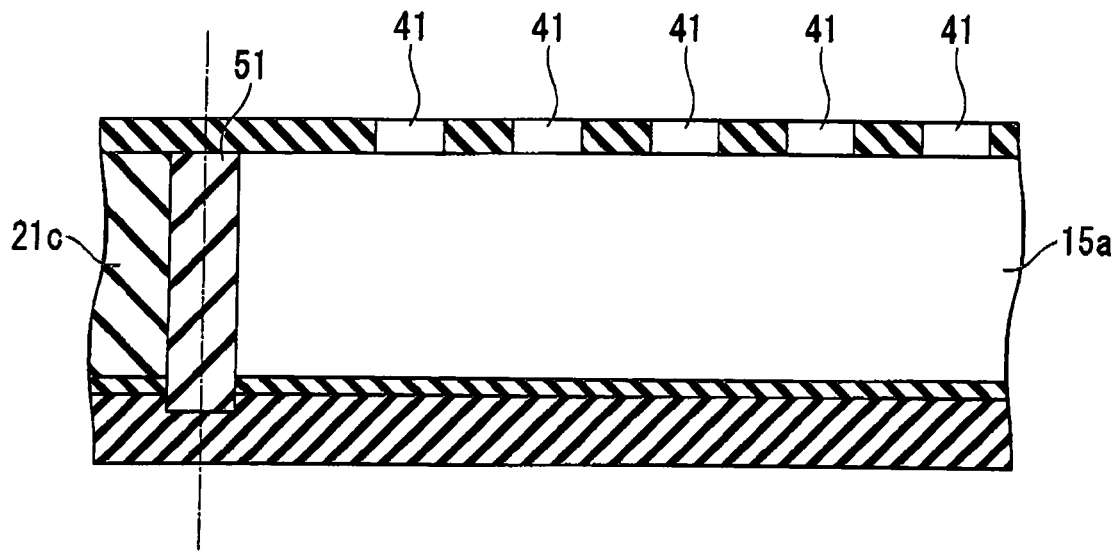
Figure 10C:
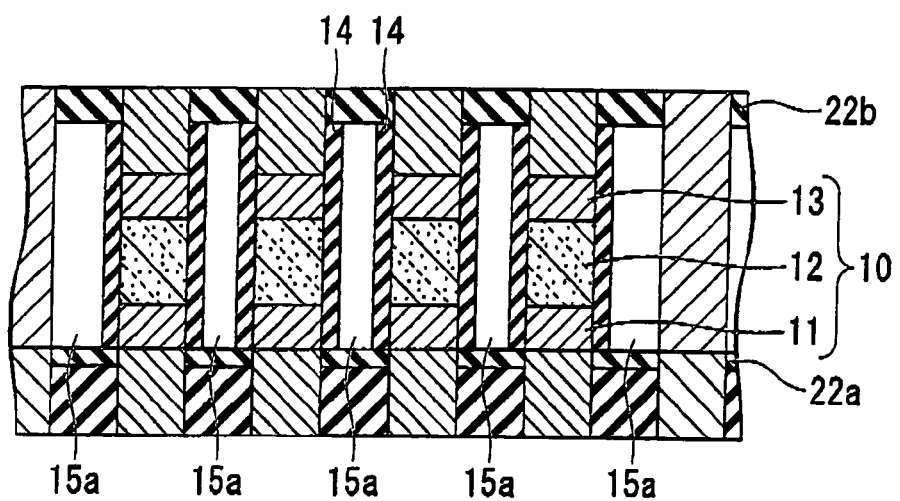

Then, the third inter-layer insulating film 21c is wet-etched by providing etchant through the first holes 41, as shown in FIGS. 10B and 10C. An etchant, whose etching selectivity is high with respect to the silicon oxide film and is low with respect to the silicon nitride film, is used. Thus, the space portion 15a surrounding the phase-change memory elements 10 is formed. In this case, since the partition layer 51 made of the silicon nitride film surrounds the memory cell region C, the etchant does not penetrate the peripheral circuit region T. Since the first and second etching stopper films 22a and 22b are made of the silicon nitride film, the element layer is protected from the etchant. Since the protection insulating film 14 is made of the silicon nitride film, the phase-change memory elements 10 are protected from the etchant.

Figure 11A:
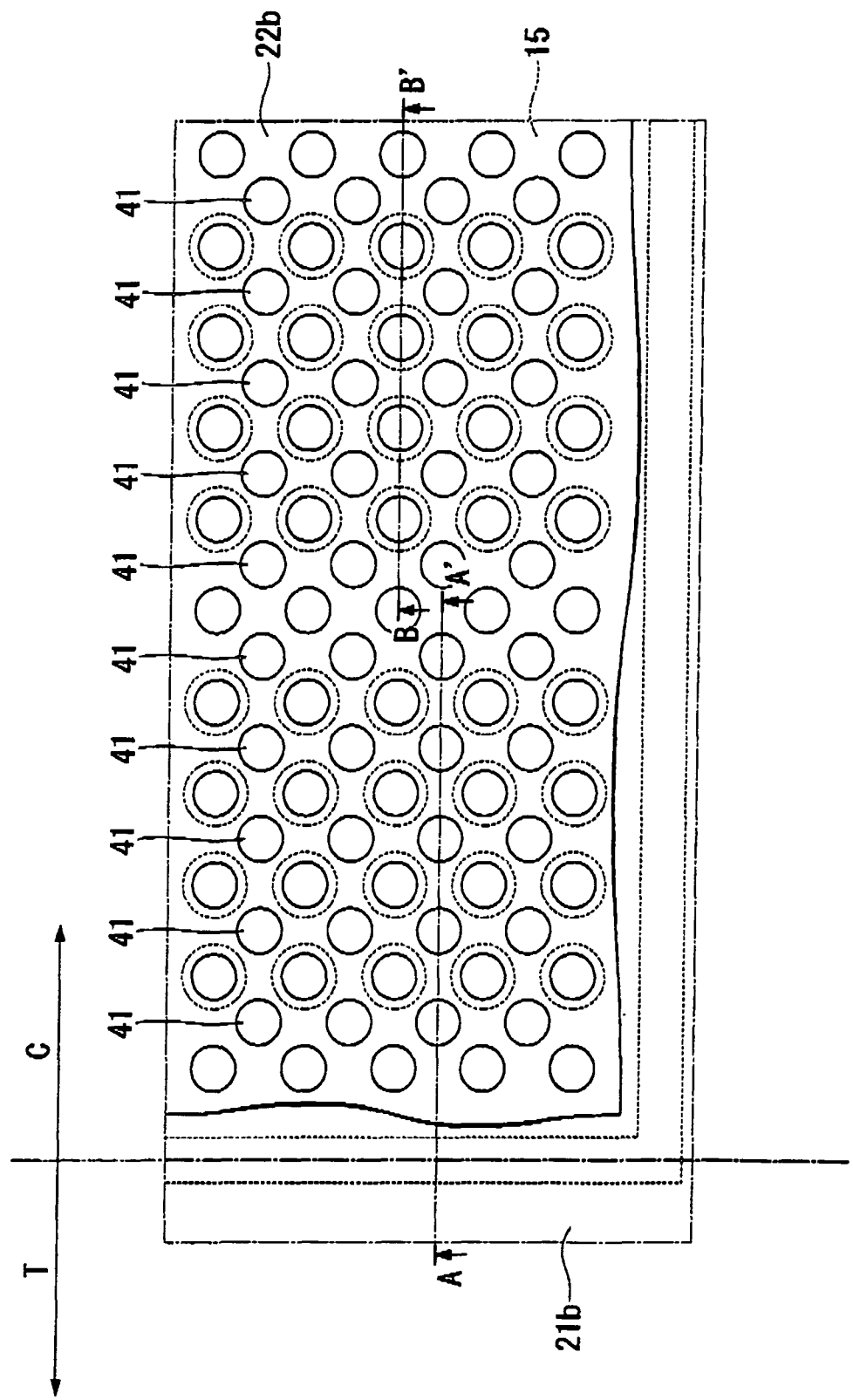
Figure 11B:
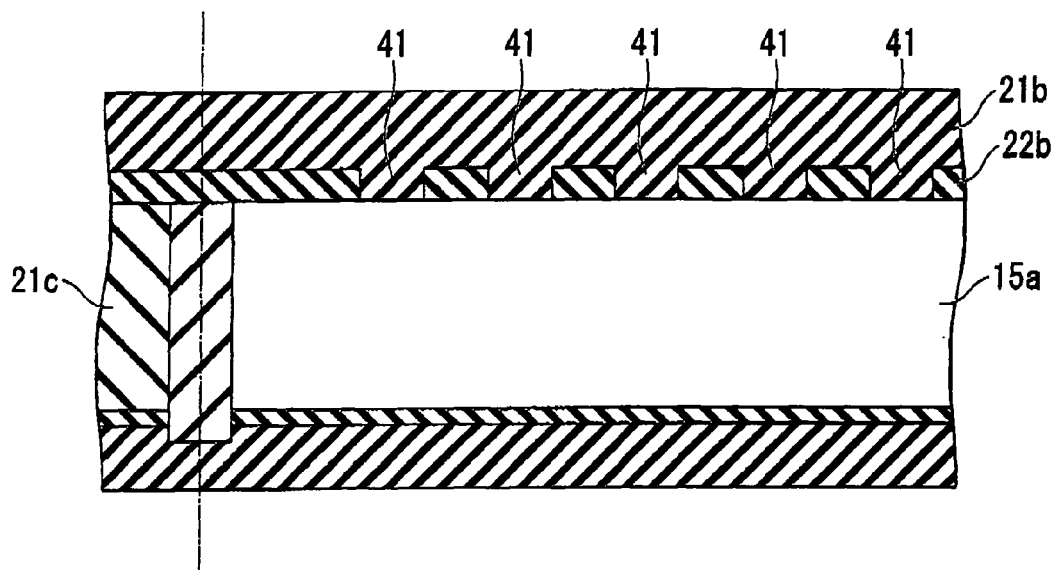
Figure 11C:
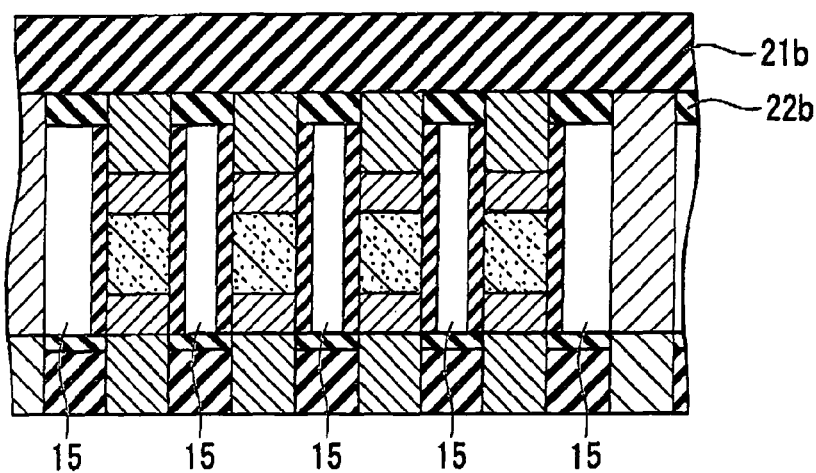

Then, the second inter-layer insulating film 21b is formed over the second etching stopper film 22b by a vacuum film forming method so as to fill the first holes 41, as shown in FIGS. 11A to 11C. The second inter-layer insulating film 21b is made of a silicon oxide film. Thus, the vacuum space portion 15 surrounding the phase-change memory elements 10 is formed. When the second inter-layer insulating film 21b is formed, a silicon oxide film is preferably formed under a lower coverage condition so that the second inter-layer insulating film 21b is not formed in the space portion 15.

According to the semiconductor device of the first embodiment, the vacuum space portion 15 with low thermal conductivity is formed so as to surround the phase-change memory elements 10, thereby achieving higher thermal efficiency than in the case of forming an insulating film with high thermal conductivity so as to surround the phase-change memory elements 10. Accordingly, the amount of rewriting current required for causing phase transition of the phase-change memory material layer 12 can be reduced.

Additionally, the first holes 41, through which the etchant is provided to form the space portion 15, are arranged such that each first hole 41 is positioned inside four neighboring phase-change memory elements 10 in plan view. Accordingly, the space portion 15a can be formed uniformly and easily.

Further, the partition layer 51 is formed in the boundary region between the memory cell region C and the peripheral circuit region T so as to surround the memory cell region C. The partition layer 51 is made of a material having an etching rate different from that of the third inter-layer insulating film 21c. Accordingly, when the third inter-layer insulating film 21c is wet-etched, the etchant is prevented from penetrating into the peripheral circuit region T.

Moreover, the protection insulating film 14 is formed so as to cover the side surfaces of the phase-change memory elements 10. The protection insulating film 14 is made of a material having an etching rate different from that of the third inter-layer insulating film 21c. Accordingly, when the third inter-layer insulating film 21c is etched, the space portion 15a surrounding the phase-change memory elements 10 can be formed without causing damage to the phase-change memory elements 10.

Second Embodiment

Figure 12A:
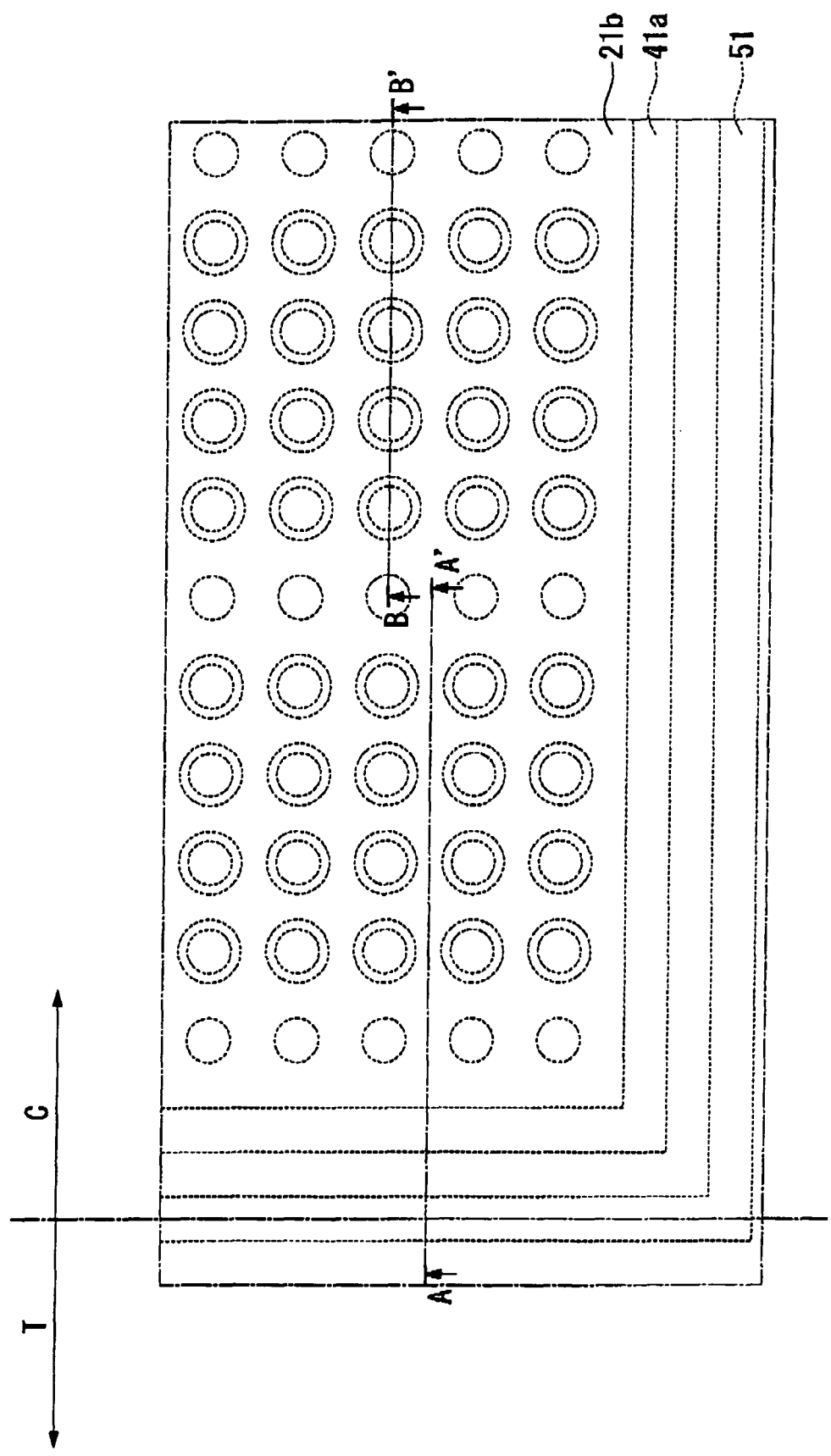
FIG. 12A is a cross-sectional view illustrating an example of a semiconductor device according to a second embodiment of the present invention.
Figure 12B:
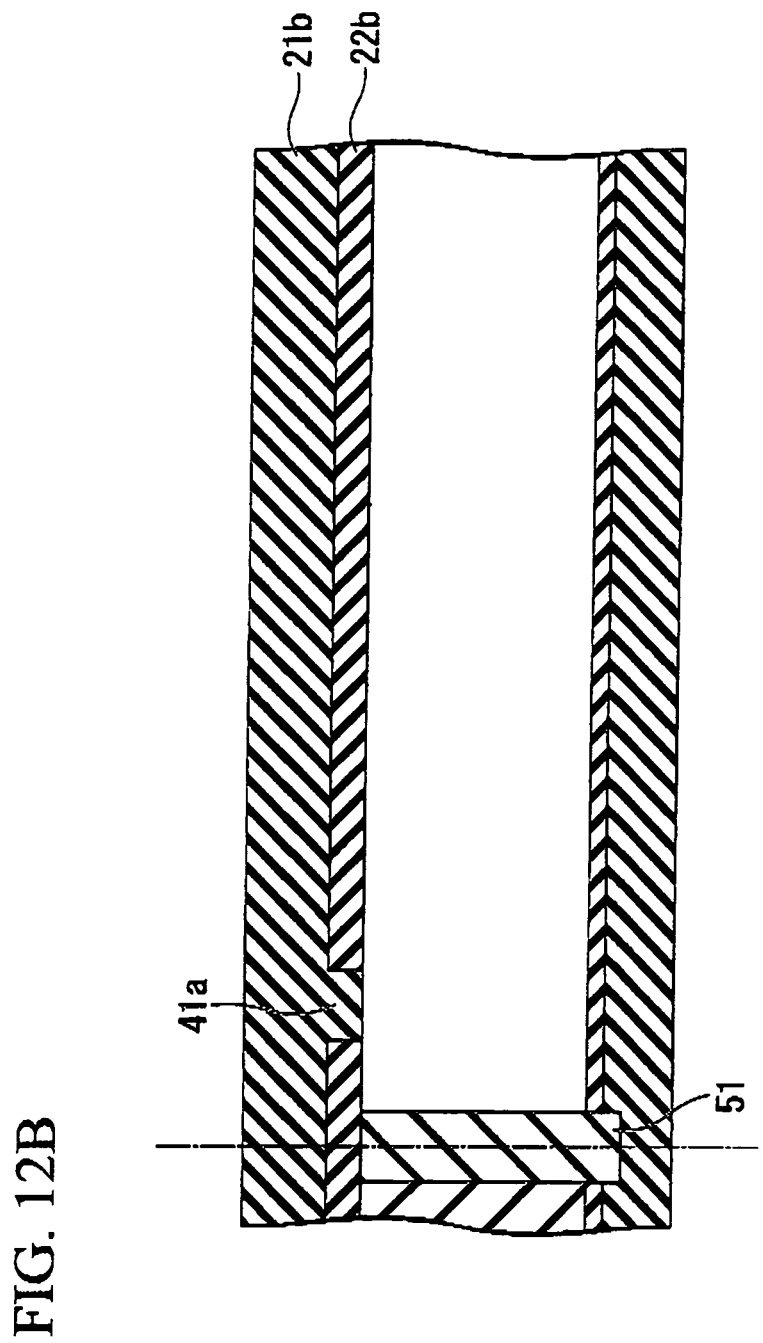
FIGS. 12B and 12C are cross-sectional views taken along lines A-A' and B-B' shown in FIG. 12A, respectively.
Figure 12C:
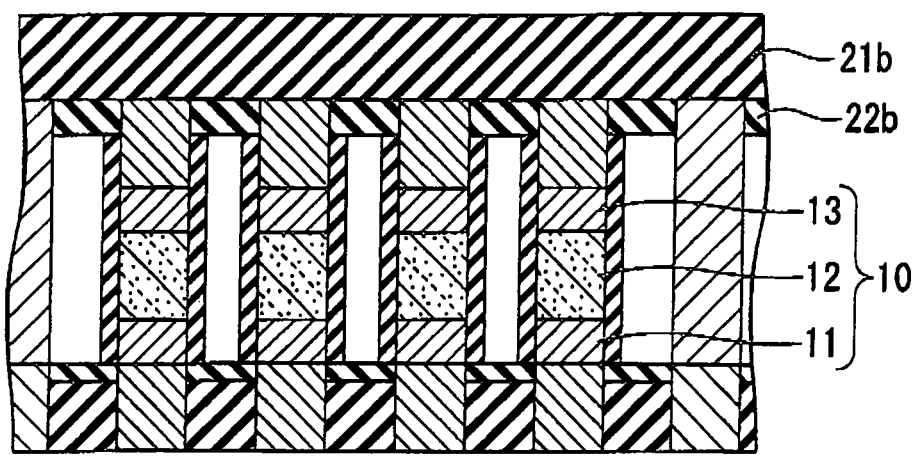

Hereinafter, a semiconductor device according to a second embodiment is explained. FIG. 12A is a plan view illustrating part of the semiconductor device of the second embodiment. FIGS. 12B and 12C are cross-sectional views taken along lines A-A' and B-B' shown in FIG. 12A, respectively.

The semiconductor device of the second embodiment differs from the semiconductor device of the first embodiment only in the configuration of the first hole 41. Like reference numerals denote like elements between the first and second embodiments, and explanations thereof are omitted here.

Hereinafter, the structure of the first hole 41a of the second embodiment is explained. As shown in FIG. 2A, the first holes 41 of the first embodiment are arranged in a matrix such that each first hole 41 is positioned inside four neighboring phase-change memory elements 10 in plan view.

As shown in FIGS. 12A and 12B, on the other hand, the first hole 41a of the second embodiment has a line shape extending over the memory cell region C, along the partition layer 51 in plan view. In other words, the first hole 41a is positioned between a plurality of phase-change memory elements 10 and the partition layer 51 so as to surround the plurality of phase-change memory elements 10.

Hereinafter, a method of forming the first hole 41a of the second embodiment is explained. The manufacturing method of the second embodiment up to the process of forming the second and fourth contact plugs 32 and 34 is the same as that of the first embodiment. Therefore, only processes thereafter are explained here.

The second etching stopper film 22b in the memory cell region C is selectively removed by photolithography and etching processes to form the first hole 41a having the line shape extending over the memory cell region C, along the partition layer 51. The width of the first hole 41a is approximately 40 nm. At this time, the first hole 41a is formed so as not to overlap the plurality of phase-change memory elements 10 in plan view.

Thus, the first hole 41a is separated from the plurality of phase-change memory elements 10. Accordingly, when the second inter-layer insulating film 21b made of a silicon oxide film is formed over the second etching stopper film 22b so as to fill the first hole 41a, the second inter-layer insulating film 21b is prevented from being deposited in the vicinity of the plurality of phase-change memory elements 10.

Third Embodiment

Figure 13B:
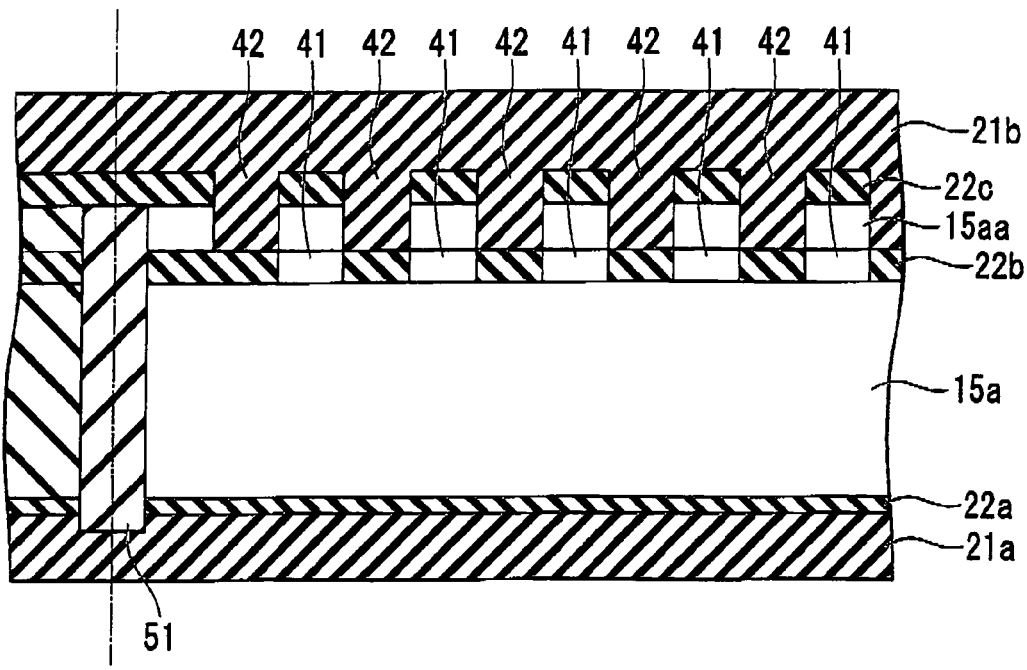
FIGS. 13B and 13C are cross-sectional views taken along lines A-A' and B-B' shown in FIG. 13A, respectively.
Figure 13C:
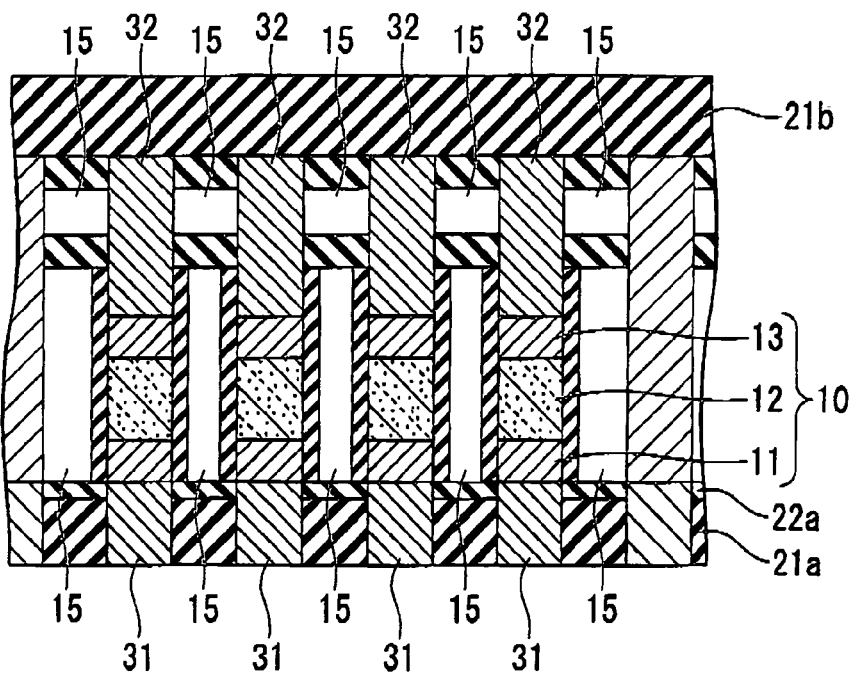

Hereinafter, a semiconductor device according to a third embodiment of the present invention is explained. FIG. 13A is a plan view illustrating part of the semiconductor device of the third embodiment. FIGS. 13B and 13C are cross-sectional views taken along lines A-A' and B-B' shown in FIG. 13A, respectively.

In the first embodiment, the holes 41, through which etchant is provided to wet-etch the third inter-layer insulating film 21c, are formed in the second etching stopper film 22b, and another hole is not formed. In the third embodiment, holes through which an etchant is provided have a two-layered structure that includes the first holes 41 and second holes 42. Like reference numerals denote like elements between the first and third embodiments, and explanations thereof are omitted here.

Hereinafter, the structure of the first and second holes 41 and 42 of the second embodiment is explained. Similar to the first embodiment, the first holes 41 are formed in the second etching stopper film 22b, as shown in FIG. 13B. A third etching stopper film 22c is disposed over the second etching stopper film 22b and the partition layer 51. Similar to the second etching stopper film 22b, the third etching stopper film 22c is made of a silicon nitride film.

The second holes 42 each having the same diameter, as that of the first hole 41 are formed in the third insulating etching stopper film 22c. As shown in FIG. 13A, the second holes 42 are arranged such that each second hole 42 is positioned between two adjacent phase-change memory elements 10 and between two adjacent first holes 41 in plan view. In other words, a second hole 42 is surrounded by two adjacent phase-change memory elements 10 and two adjacent first holes 41 in plan view. The first and second holes 41 and 42 do not overlap one another in plan view.

Space portions 15aa are formed over the respective first holes 41. The space portions 15aa are positioned between the second and third etching stopper films 22b and 22c. A second inter-layer insulating film 21b made of a silicon oxide film is disposed over the third etching stopper film 22c so as to fill the second holes 42. The second contact plugs 32 penetrate the second and third etching stopper films 22b and 22c so as to be coupled to the respective phase-change memory elements 10.

Similar to the first embodiment, the space portion 15 is sealed by the partition layer 51, and the first and second etching stopper films 22a and 22b. The space portion 15aa is sealed by the partition layer 51, the second and third etching stopper films 22b and 22c, and the portions of the second inter-layer insulating film 21b which fill the lower portions of the second holes 42, and the second contact plugs 32.

Similar to the first embodiment, the partition layer 51 is disposed over the boundary region between the memory cell region C and the peripheral circuit region T. The partition layer 51 is positioned between first and second inter-layer insulating films 21a and 21b, so as to surround the memory cell region C and separate the memory cell region C from the peripheral circuit region T. The partition layer 51 penetrates the first etching stopper film 22a and reaches the first inter-layer insulating film 21a.

Hereinafter, a method of manufacturing the first and second holes 41 and 42 of the third embodiment is explained with reference to FIGS. 14A to 21B. The manufacturing method of the third embodiment up to the process of forming the third inter-layer insulating film 21c is the same as the manufacturing method of the first embodiment. Therefore, only processes thereafter are explained hereinafter.

Figure 14A:
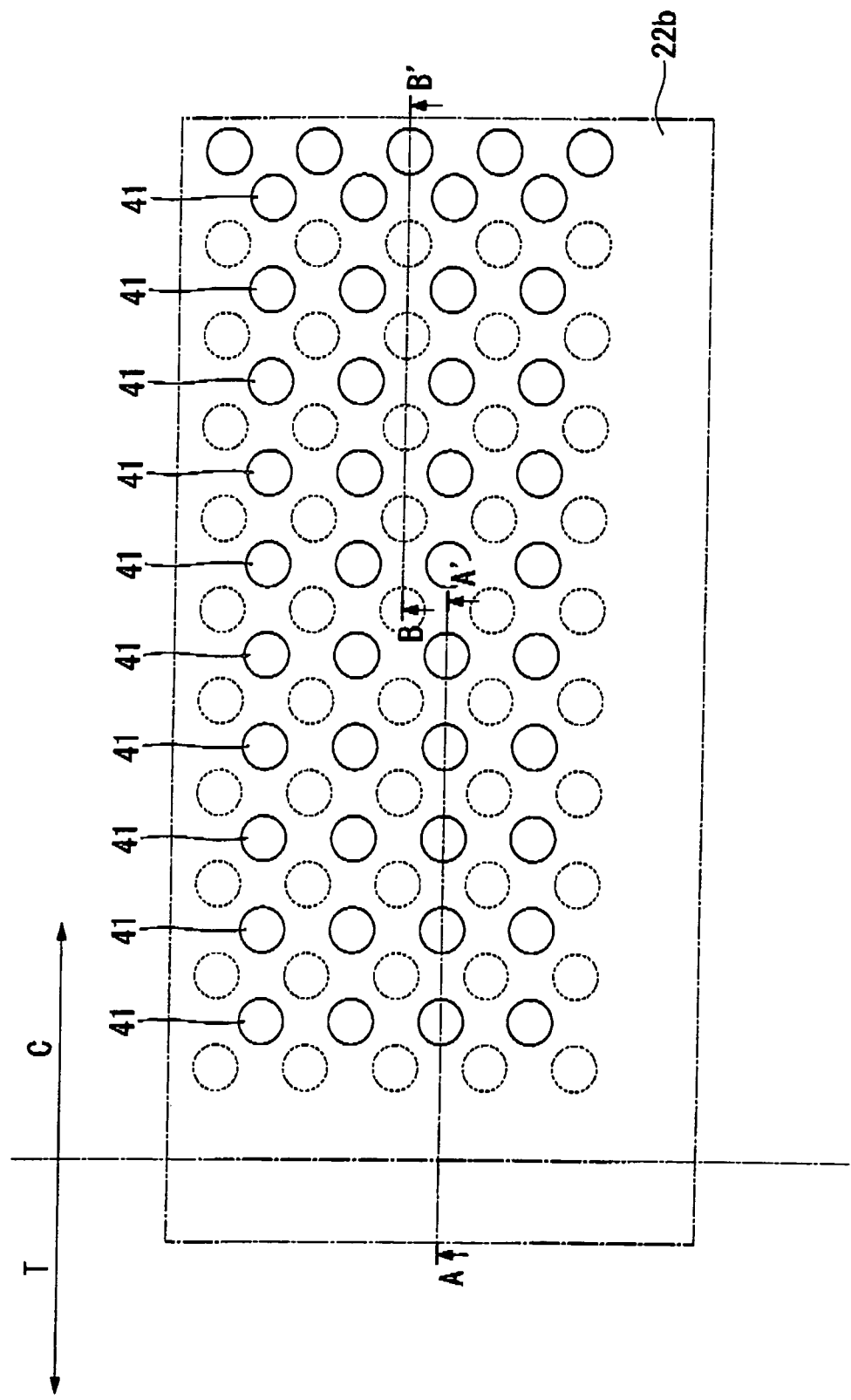
FIGS. 14A to 21B illustrate a process flow indicative of a method of manufacturing the semiconductor device of the third embodiment.
Figure 14B:
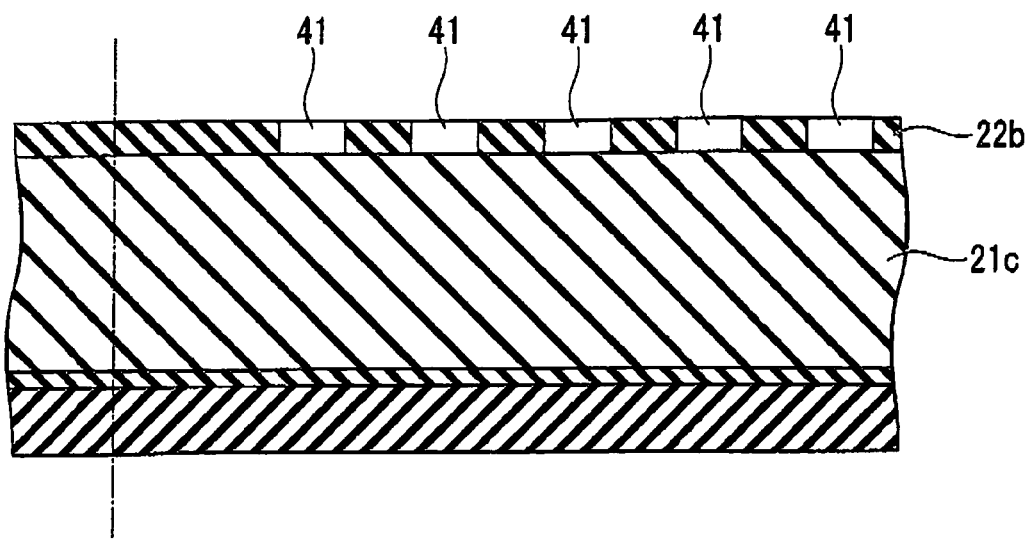
Figure 14C:
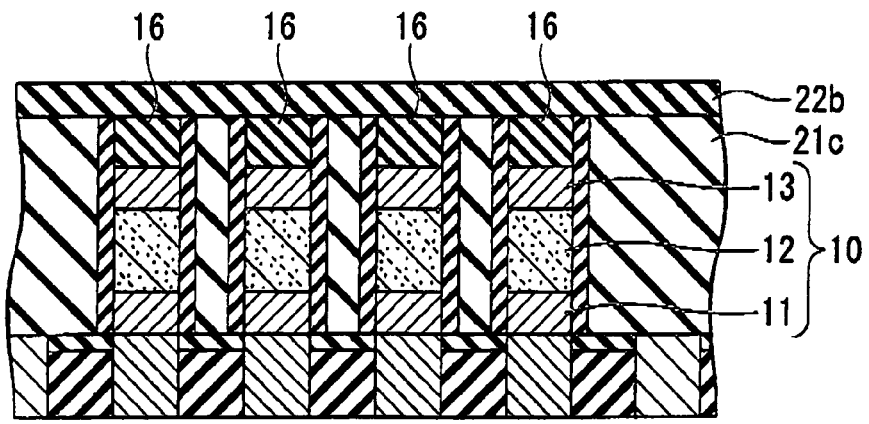

As shown in FIGS. 14B and 14C, a silicon nitride film is formed over the third inter-layer insulating film 21c and the phase-change memory elements 10. Thus, the second etching stopper film 22b having a thickness of approximately 20 nm is formed.

Then, similar to the first embodiment, the first holes 41 are formed in the second etching stopper film 22b over the memory cell region C by photolithography and etching processes, as shown in FIG. 148. As shown in FIG. 14A, the first holes 41 are arranged in a matrix such that each first hole 41 is positioned inside four neighboring phase-change memory elements 10 in plan view. Preferably, the distance between two adjacent first holes 41 is approximately 40 nm.

Figure 15A:
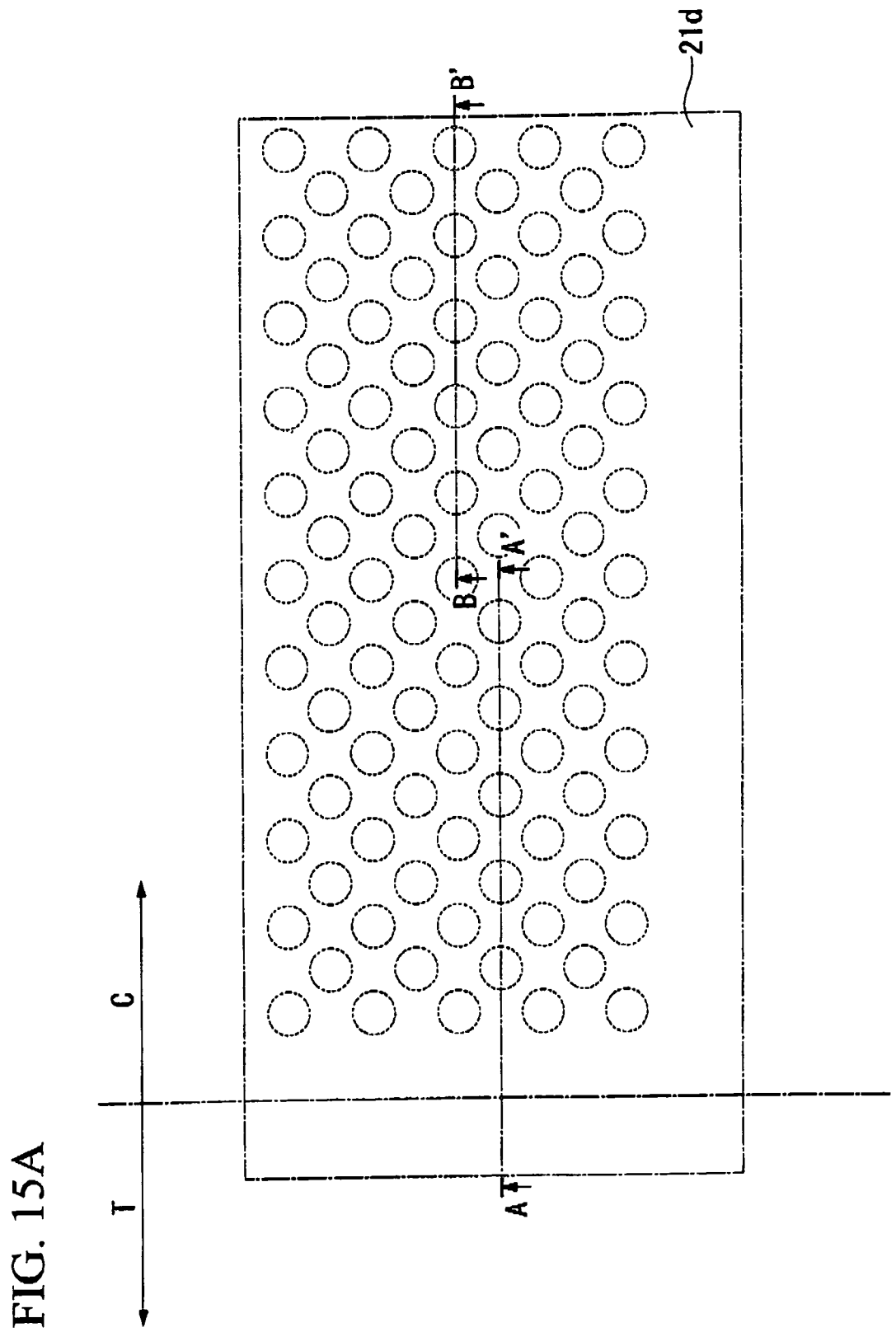
Figure 15B:
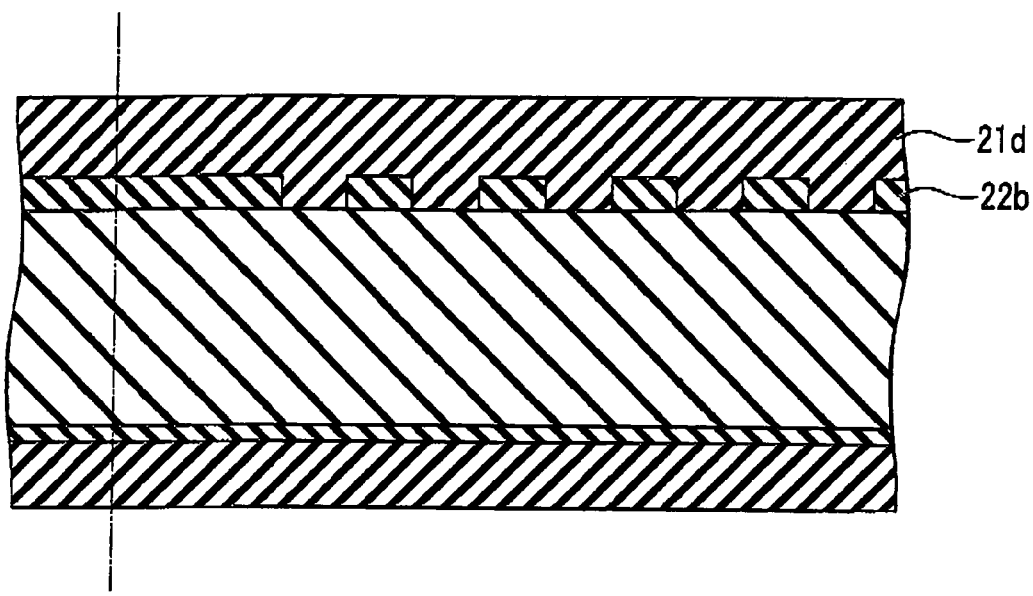
Figure 15C:
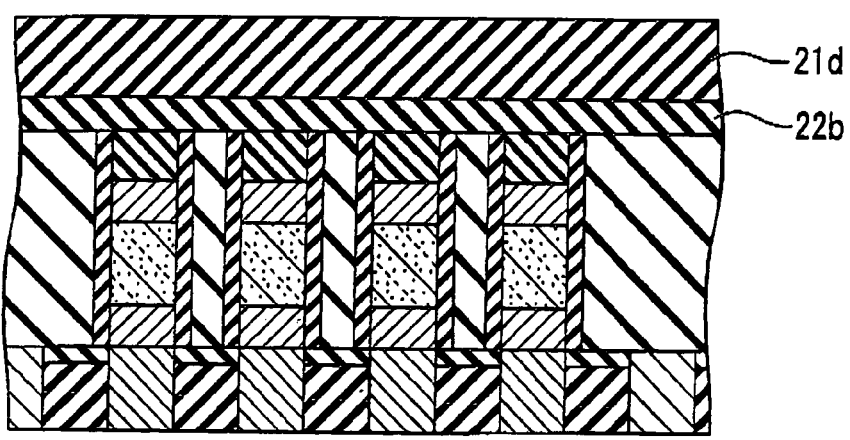

Then, a fourth inter-layer insulating film 21d made of a silicon oxide film is formed over the second etching stopper film 22b so as to fill the first holes 41, as shown in FIGS. 15B and 15C.

Figure 16A:
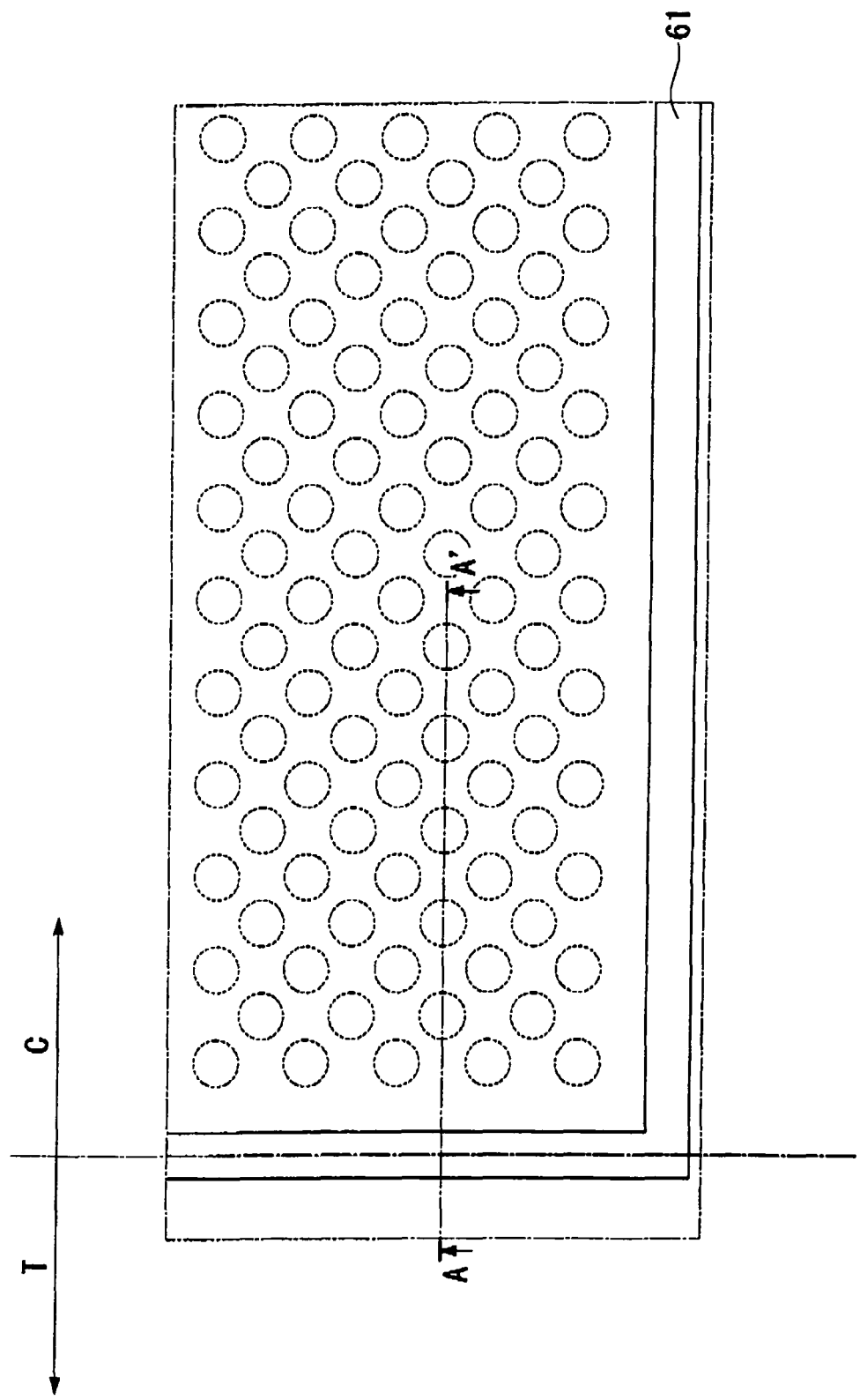
Figure 16B:
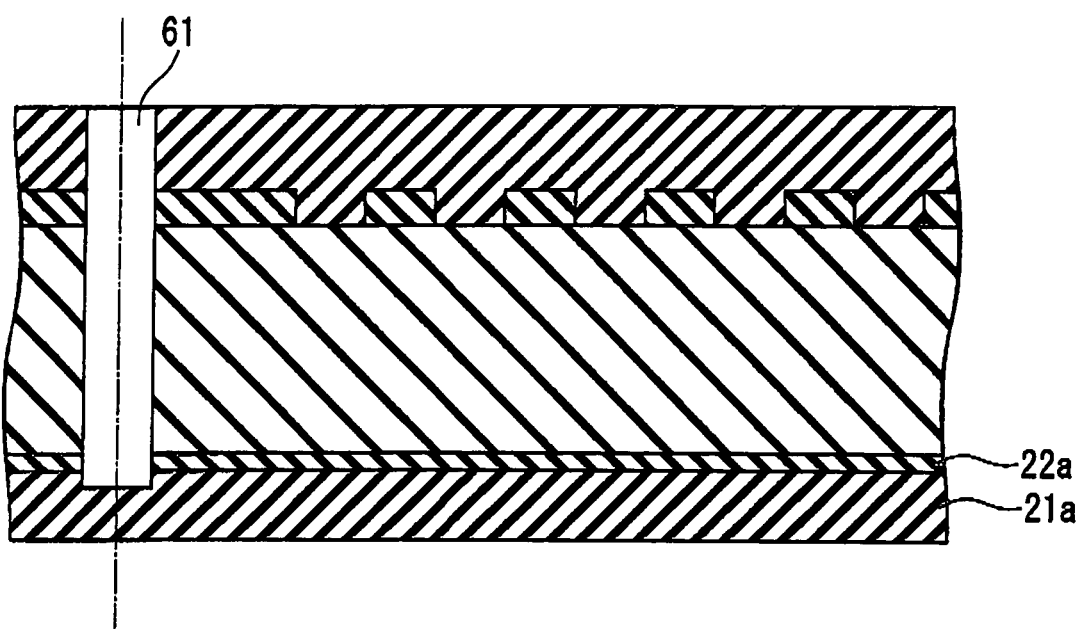

Then, similar to the first embodiment, a groove 61 is formed over the boundary region between the memory cell region C and the peripheral circuit region T by photolithography and etching processes so as to surround the memory cell region C and separate the memory cell region C from the peripheral circuit region T, as shown in FIGS. 16A and 16B. The groove has a width of approximately 40 nm. The etching process is performed until the groove 61 reaches the first etching stopper film 22a.

Figure 17B:
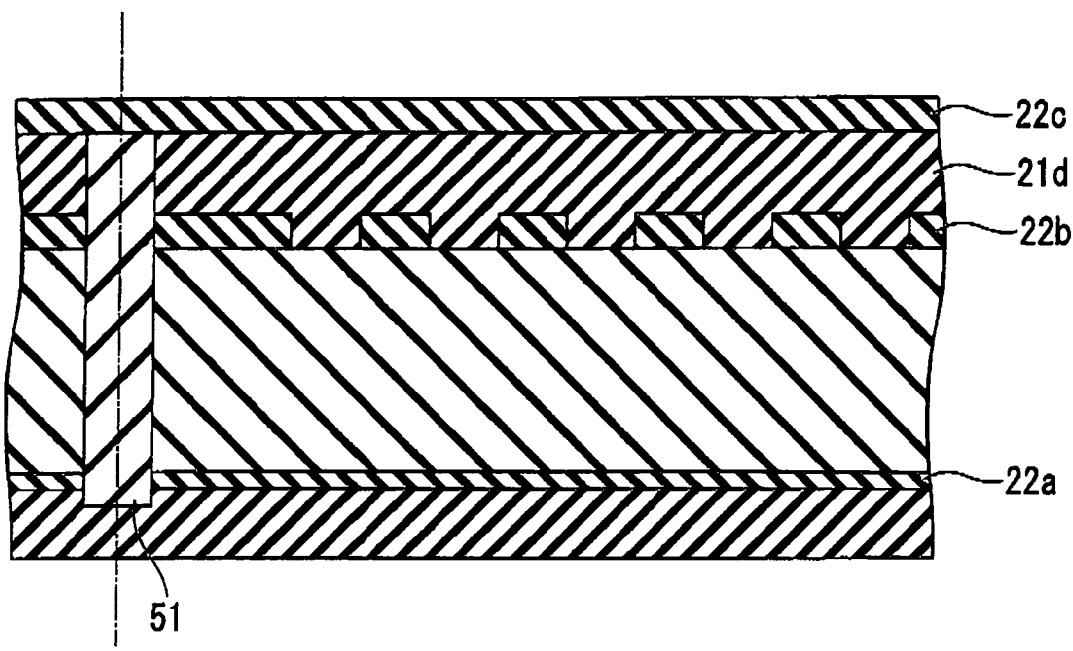
Figure 17C:
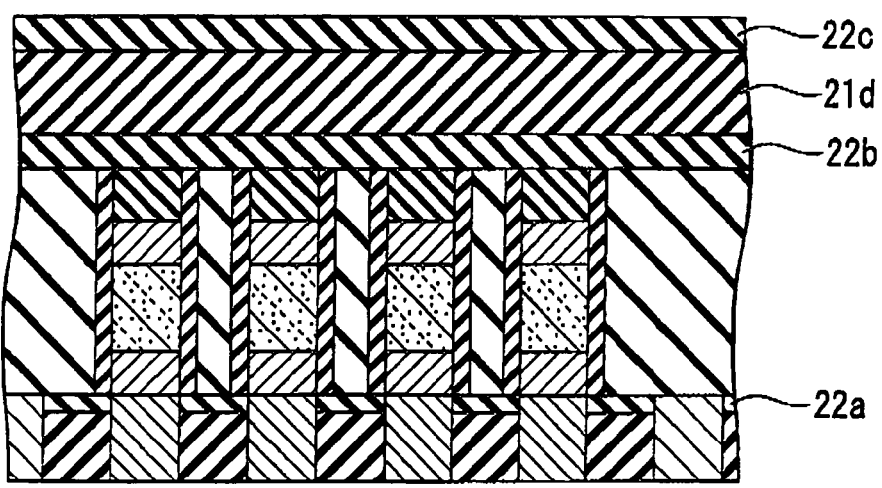

Then, the groove 61 is filled with a silicon nitride film that is the same material for forming the first etching stopper film 22a. Thus, the partition layer 51 having a width of approximately 40 nm is formed, as shown in FIGS. 17A and 17B. Then, a silicon nitride film is formed over the fourth inter-layer insulating film 21d. Thus, the third etching stopper film 22c having a thickness of approximately 20 nm is formed as shown in FIGS. 17B and 17C.

Figure 18A:
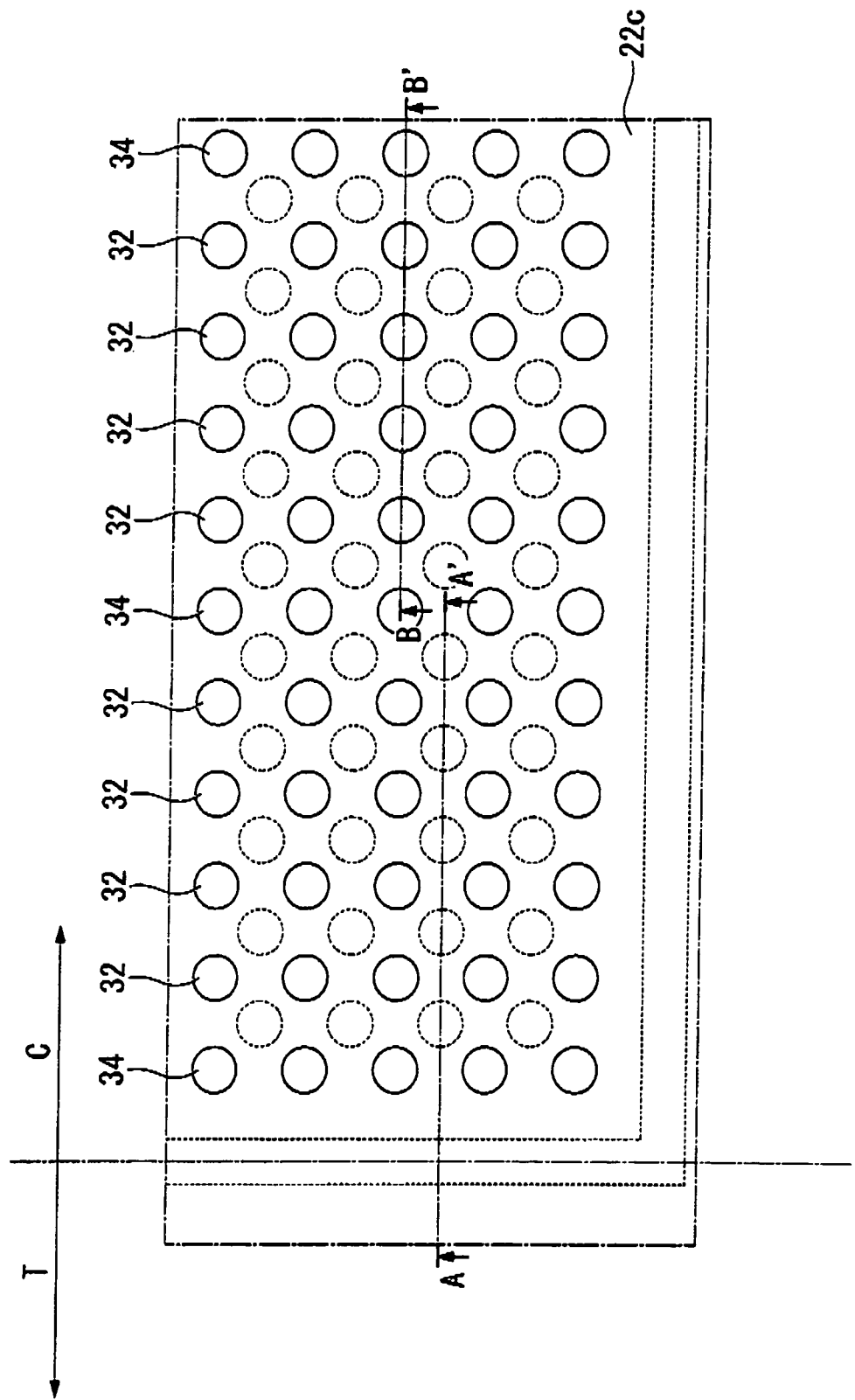
Figure 18B:
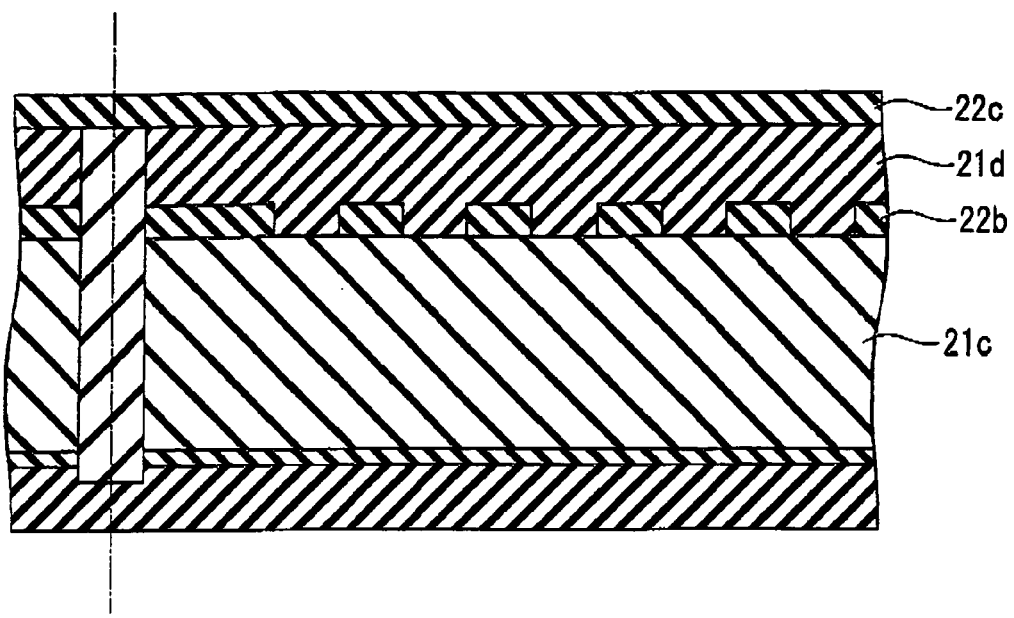
Figure 18C:
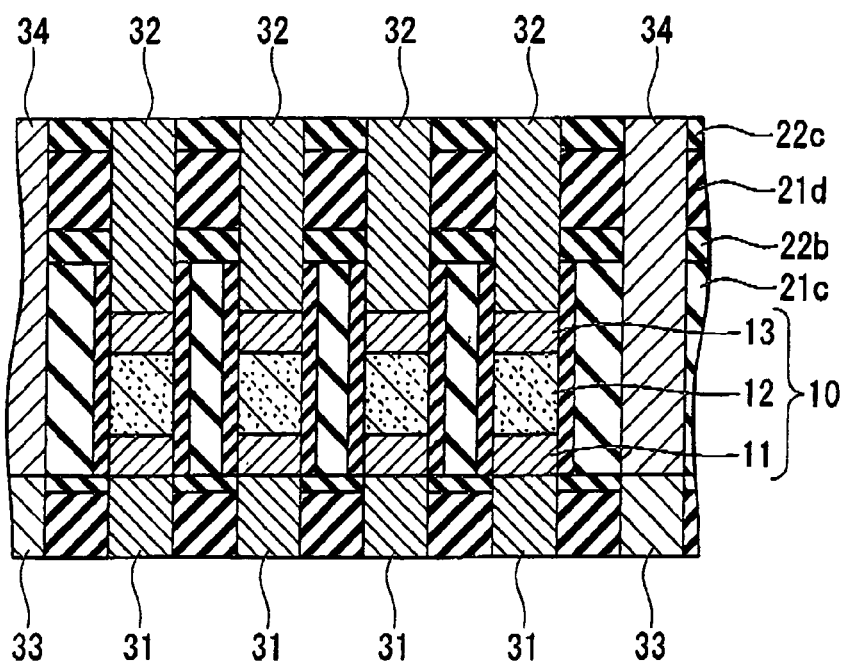

Then, contact holes, which penetrate the third inter-layer insulating film 21c, the second etching stopper film 22b, the fourth inter-layer insulating film 21d, and the third etching stopper film 22c, are formed so as to expose the upper surfaces of the third contact plugs 33, as shown in FIGS. 18A to 18C. Additionally, the second etching stopper film 22b, the silicon nitride film 16, the fourth inter-layer insulating film 21d, and the third etching stopper film 22c are selectively removed to form contact holes over respective phase-change memory elements 10.

Then, a tungsten film is formed over the third etching stopper film 22c so as to fill the contact holes. Then, the tungsten film is planarized by the CMP method so as to expose the upper surface of the third etching stopper film 22c. Thus, the second contact plugs 32 are formed over the respective phase-change memory elements 10, and the fourth contact plugs 34 are formed over the respective third contact plugs 33.

Figure 19B:
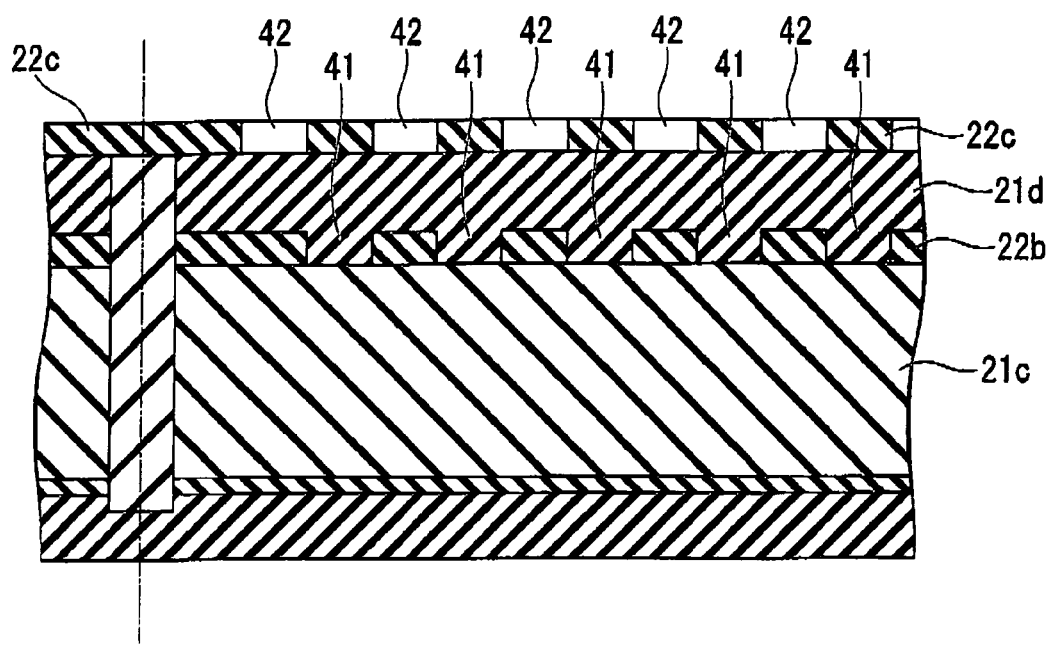

Then, the second holes 42 are formed by photolithography and etching processes in the third etching stopper films 22c over the memory cell region C, as shown in FIG. 19B. The second holes 42 are used for wet-etching the third and fourth inter-layer insulating films 21c and 21d. Thus, the double-layered structure, which has the first and second holes 41 and 42 through which a wet-etching solution is provided, is formed.

As shown in FIG. 19A, the second holes 42 are arranged in a matrix such that each of the second holes 42 is positioned between two adjacent first holes 41 and between two adjacent phase-change memory elements 10 in plan view. In other words, the second hole 42 is surrounded by two adjacent phase-change memory elements 10 and two adjacent first holes 41 in plan view. The first and second holes 41 and 42 do not overlap one another in plan view.

Figure 20A:
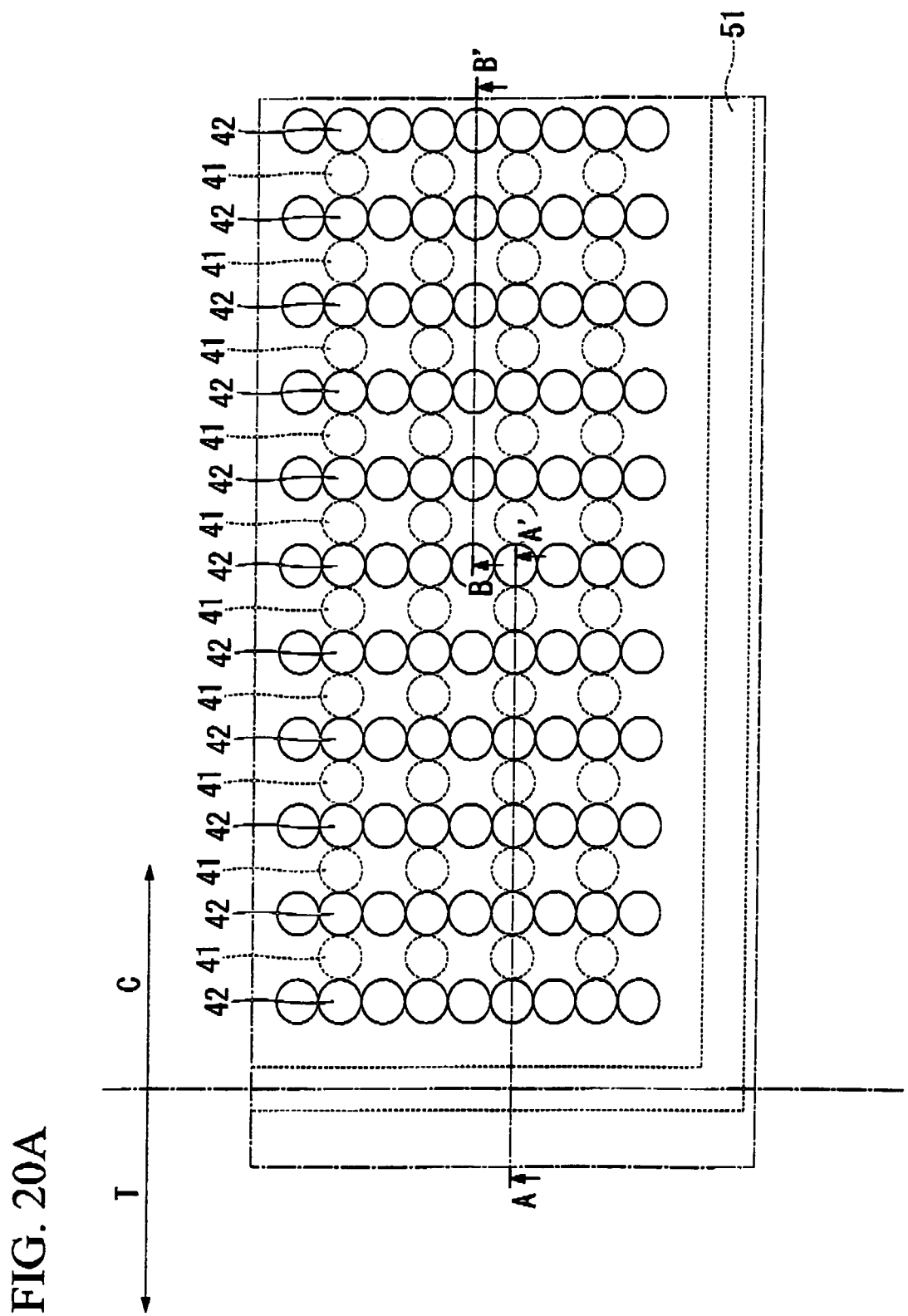
Figure 20B:
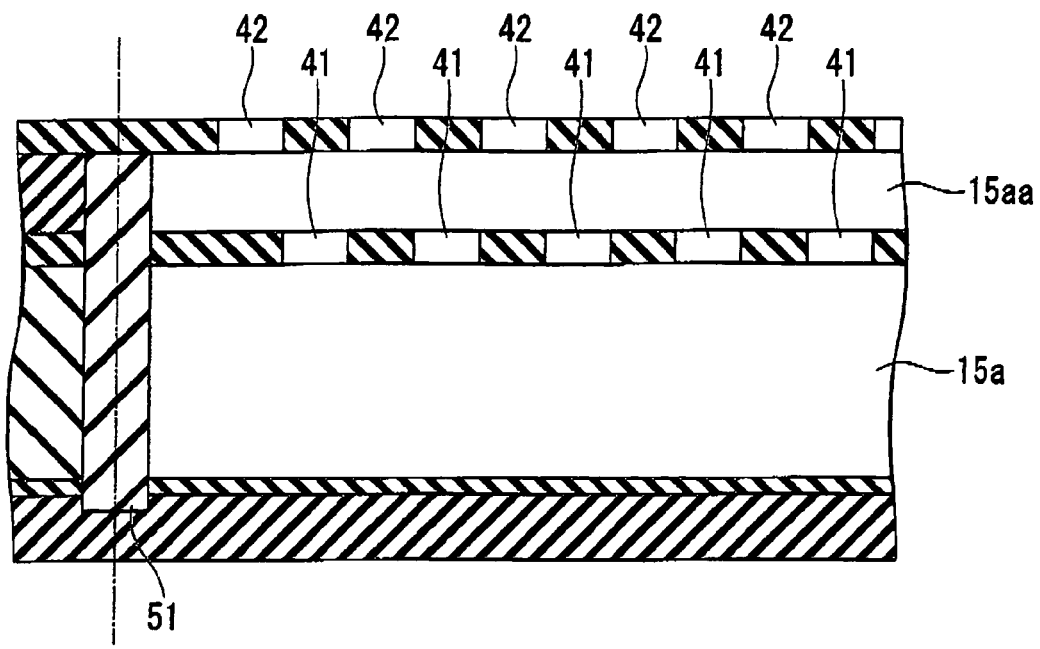
Figure 20C:
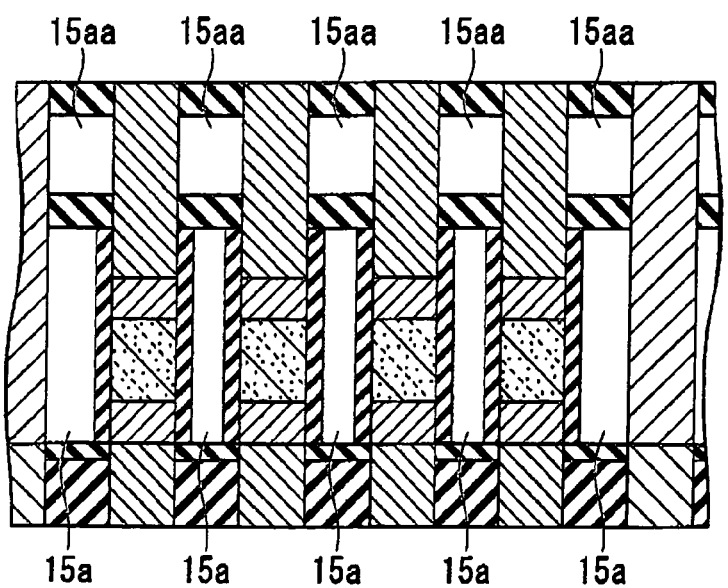

Then, a wet-etching solution is provided through the second holes 42, as shown in FIGS. 20B and 20C. Similar to the first embodiment, a wet-etching solution, whose etching selectivity is high with respect to a silicon oxide film and is small with respect to the silicon nitride film, is used. Firstly, the fourth inter-layer insulating film 21d over the memory cell region C is wet-etched to form the space portion 15aa between the second and third etching stopper films 22b and 22c.

Secondary, portions of the fourth inter-layer insulating film 21d, which fill the respective first holes 41, are wet-etched. Further, the third inter-layer insulating film 21c over the memory cell region C, which is positioned under the second etching stopper film 22b, is wet-etched to form the space portion 15a surrounding the phase-change memory elements 10. The space portions 15aa and 15a are integrated via the first holes 41. At this time, since the partition layer 51 separates the memory cell region C from the peripheral circuit region T, the wet-etching solution do not penetrate the peripheral circuit region T.

Then, the second inter-layer insulating film 21b made of a silicon oxide film is formed over the third etching stopper film 22c by a vacuum film forming method to as to fill the second holes 42. Thus, the vacuum space portion 15 is formed between the second and third etching stopper films 22b and 22c while surrounding the phase-change memory elements 10.

At this time, the silicon oxide film enters lower portions of the second holes 42, and thus the second inter-layer insulating film 21b is formed thereat. To prevent the second inter-layer insulating film 21b from passing through the first holes 41 and thereby entering the space portion 15, the silicon oxide film is preferably formed under a low coverage condition. Thus, the semiconductor device of the third embodiment shown in FIGS. 13A to 13C can be formed.

According to the semiconductor device of the third embodiment, the double-layered structure, which has the first and second holes 41 and 42 through which a wet-etching solution is provided, is formed. Accordingly, the space portion 15 can be formed uniformly and easily.

Additionally, the first and second holes 41 and 42 do not overlap one another in plan view. Accordingly, when the silicon oxide film is formed by the vacuum film forming method so as to fill the second holes 42, the silicon oxide film is formed so as to fill the lower portions of the respective second holes 42, but is prevented from passing through the first holes 41 and thereby entering the space portion 15. In other words, the space portion 15 can be precisely formed so as to surround the phase-change memory elements 10, thereby enhancing the vacuum precision of the space portion 15.

Figure 21A:
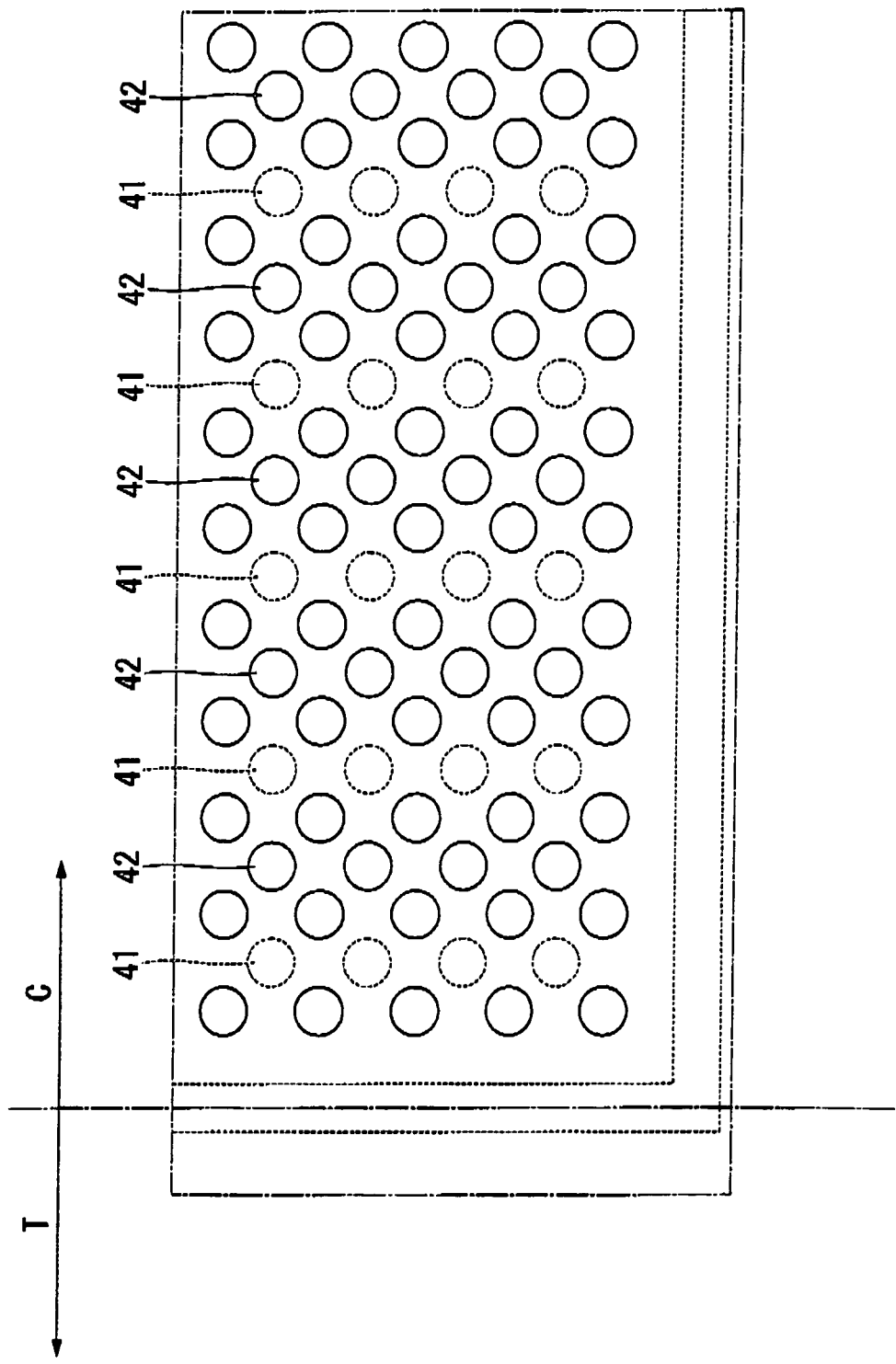
Figure 21B:
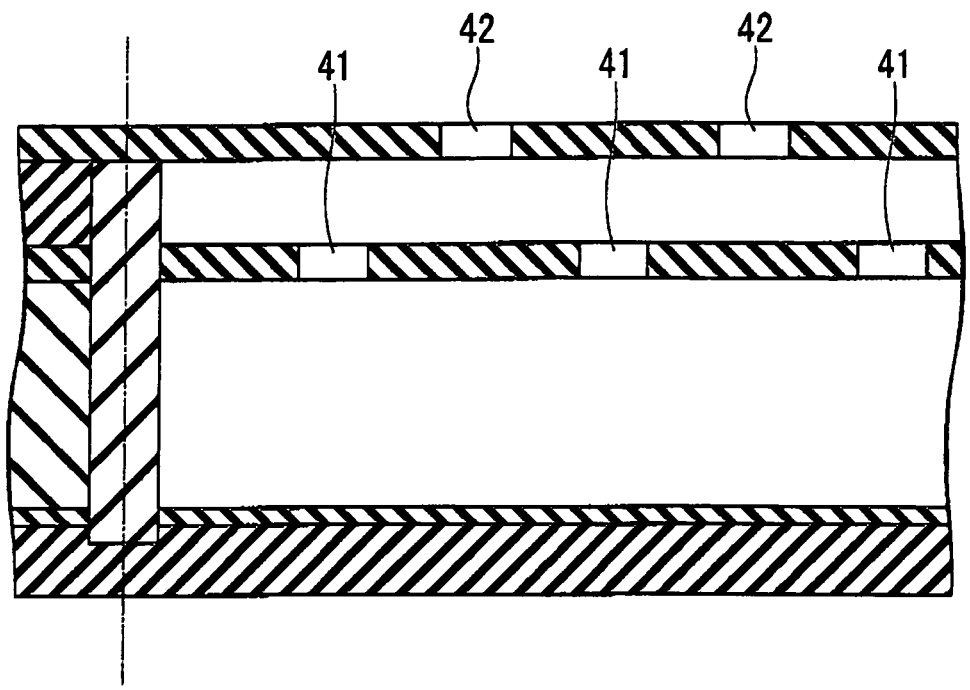

Further, the arrangement type of the first and second holes 41 and 42 of the third embodiment is $4F^2$ (where F is the minimum feature size) in the case of the semiconductor device shown in FIG. 13A. However, the arrangement type thereof may be $8F^2$, as shown in FIGS. 21A and 21B. In this case, the distance between the first and second holes 41 and 42 becomes 1F, thereby securing misalignment margin of the first and second holes 41 and 42.

Fourth Embodiment

Figure 22B:
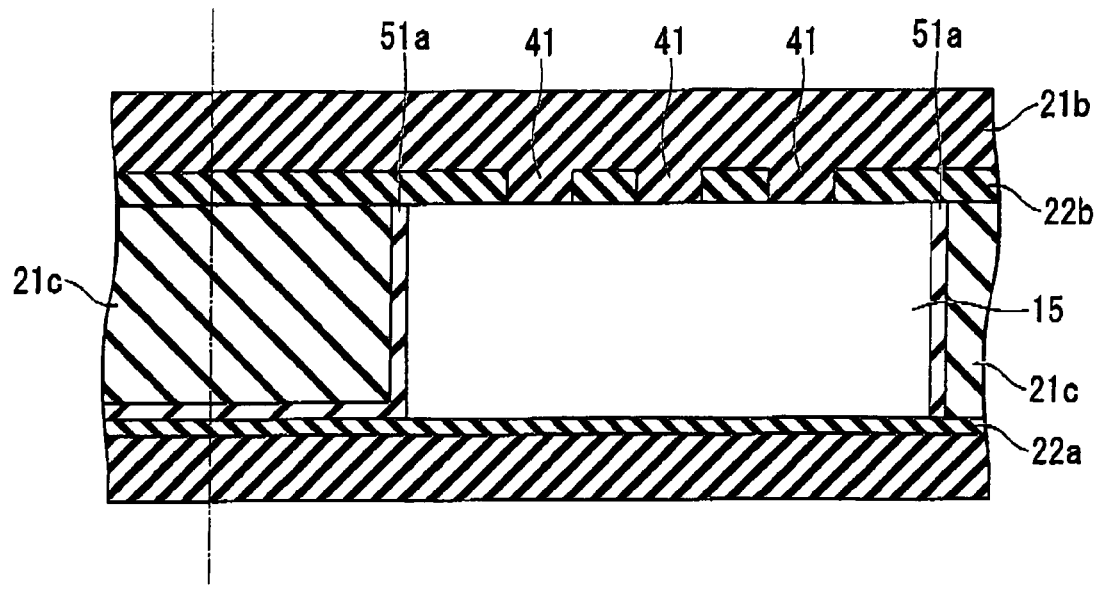
FIGS. 22B and 22C are cross-sectional views taken along lines A-A' and B-B' shown in FIG. 22A, respectively.
Figure 22C:
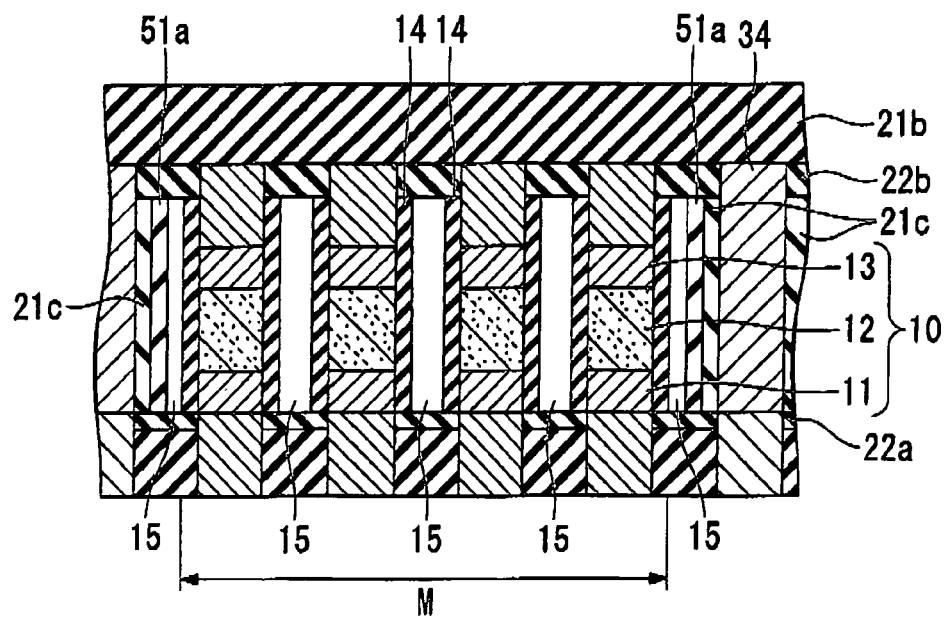

Hereinafter, a semiconductor device according to a fourth embodiment of the present invention is explained. FIG. 22A is a plan view illustrating part of the semiconductor device of the fourth embodiment. FIGS. 22B and 22C are cross-sectional views taken along lines A-A' and B-B' shown in FIG. 22A, respectively.

The partition layer 51 of the first embodiment surrounds the memory cell region C so as to separate the memory cell region C from the peripheral circuit region T. On the other hand, a partition layer 51a surrounds a memory portion M including the plurality of phase-change memory elements 10, as shown in FIGS. 22A to 22C. Like reference numerals denote like elements between the first and fourth embodiments, and explanations thereof are omitted here.

Hereinafter, a structure of the partition layer 51a of the fourth embodiment is explained. As shown in FIGS. 22A to 22C, the partition layer 51a is disposed between the first and second etching stopper films 22a and 22b so as to surround the memory portion M including the plurality of phase-change memory elements 10. In other words, the partition layer 51a is positioned between the memory portion M and the fourth contact plug 34 so as to surround the memory portion M, as shown in FIGS. 22A and 22C. Thus, the partition layer 51a separates the memory portion M from the third inter-layer insulating film 21c.

As shown in FIGS. 22A and 22C, the vacuum space portion 15 surrounding the phase-change memory elements 10 is disposed in a region surrounded by the partition layer 51a, between the first and second etching stopper films 22a and 22b. In other words, the partition layer 51a separates the space portion 15 from the third inter-layer insulating film 21c.

The structures of the second etching stopper film 22b over the space portions 15 and the third inter-layer insulating film 21c, the first holes 41 in the second etching stopper film 22b, and the second inter-layer insulating film 22b filling the first holes 41 are the same as those of the first embodiment.

Hereinafter, a method of forming the partition layer 51a is explained with reference to FIGS. 23A to 30B. The manufacturing method of the fourth embodiment up to the process of forming the protection insulating film 14 is the same as the manufacturing method of the first embodiment. Therefore, only processes thereafter are explained hereinafter.

Figure 23A:
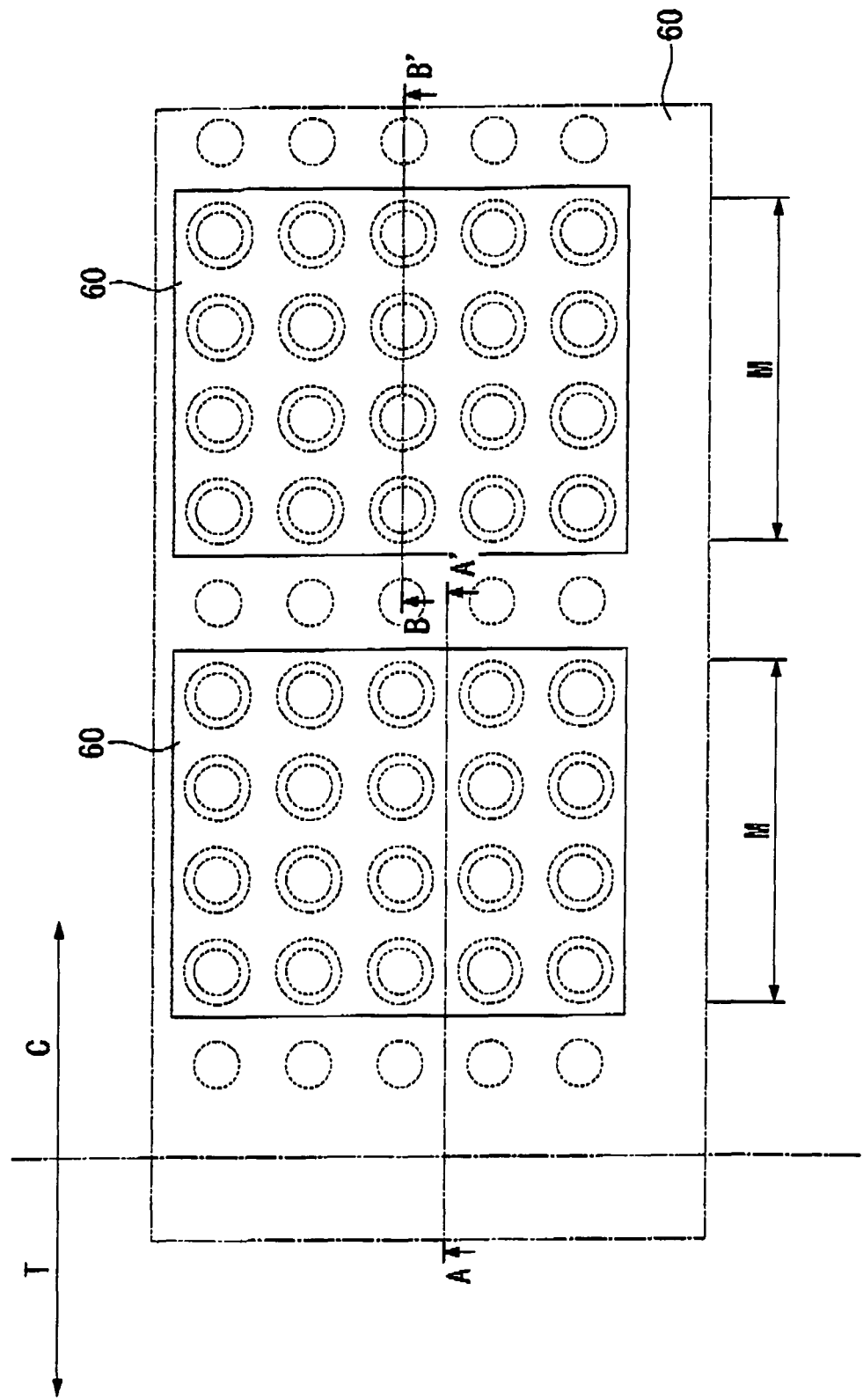
FIGS. 23A to 30B illustrate a process flow indicative of a method of manufacturing the semiconductor device of the fourth embodiment.
Figure 23B:
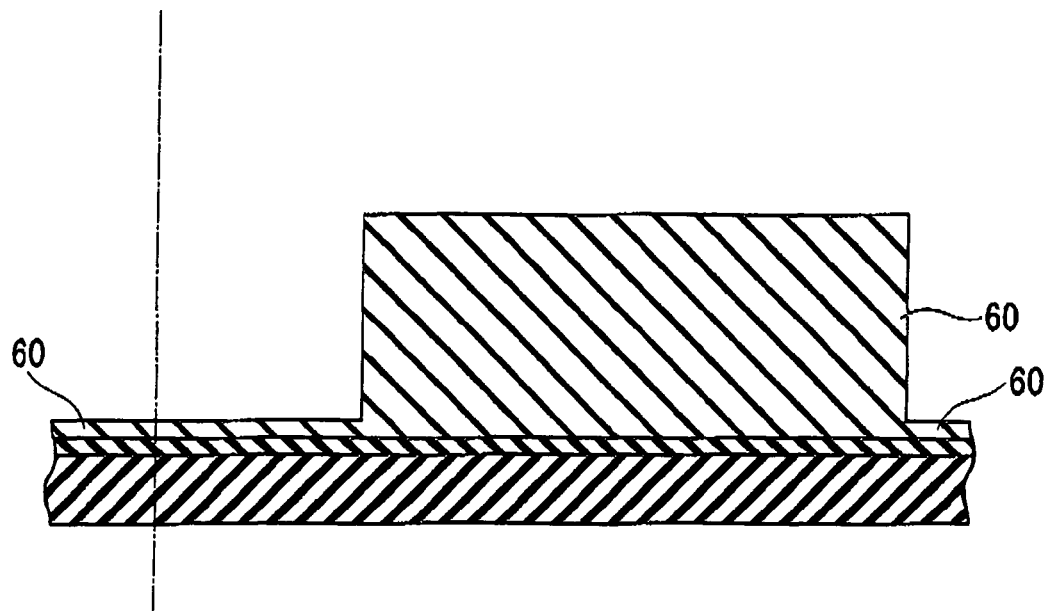
Figure 23C:
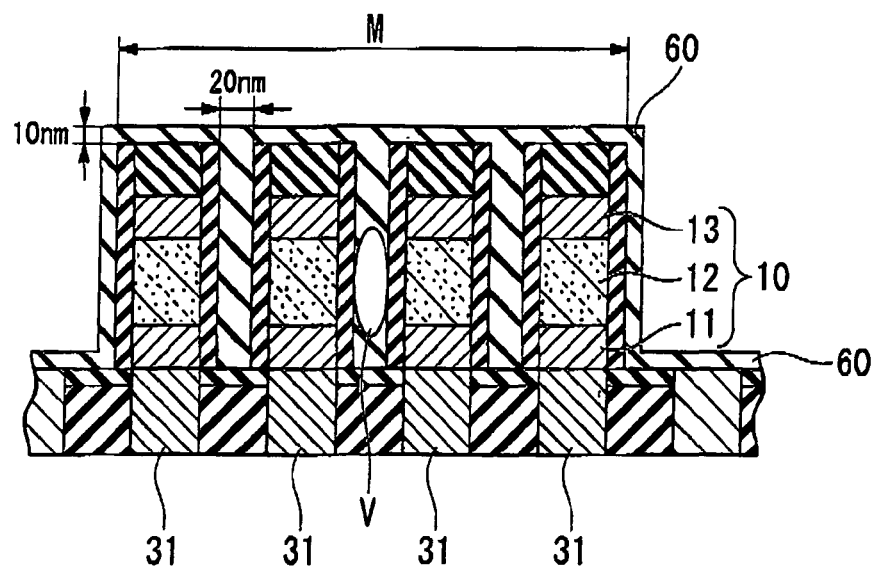

As shown in FIGS. 23B and 23C, a silicon oxide film 60 is formed so as to cover the memory portion M including the plurality of phase-change memory elements 10. At this time, the silicon oxide film 60 is formed in the space between two adjacent phase-change memory elements 10. In this case, the silicon oxide film 60 filling the space may include a void V as shown in FIG. 23C. This is because the silicon oxide film 60 filling the space between the two adjacent phase-change memory elements 10 is removed by a wet-etching process for forming the space portion 15 as will be explained later.

Preferably, the silicon oxide film 60 has a thickness such that the space between two adjacent phase-change memory elements 10 is filled up with the silicon oxide film 60. More specifically, the thickness of the silicon oxide film 60 is preferably set to a value that is less than or equal to half the distance between the two adjacent protection insulating films 14. For example, when the distance between two adjacent protection insulating films 14 is 20 nm in the case of FIG. 23C, the thickness of the silicon oxide film is set to 10 nm.

Figure 24B:
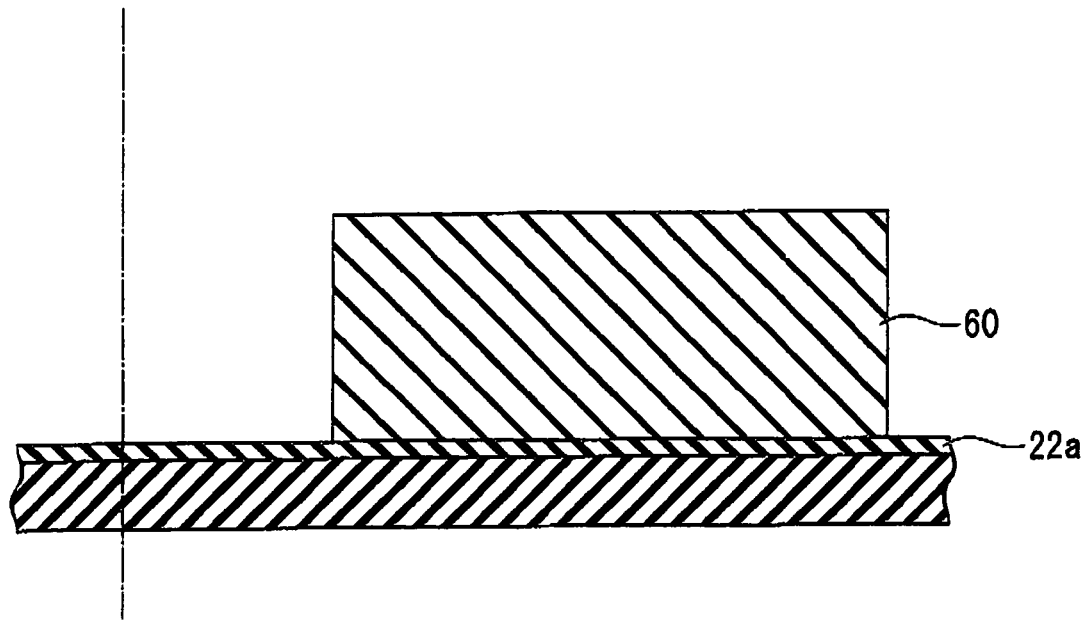
Figure 24C:
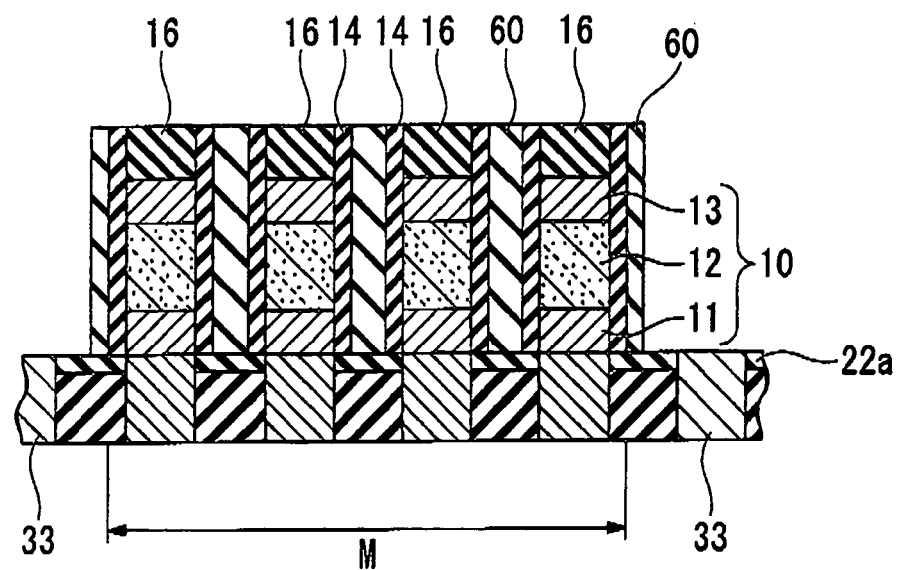
Figure 25B:
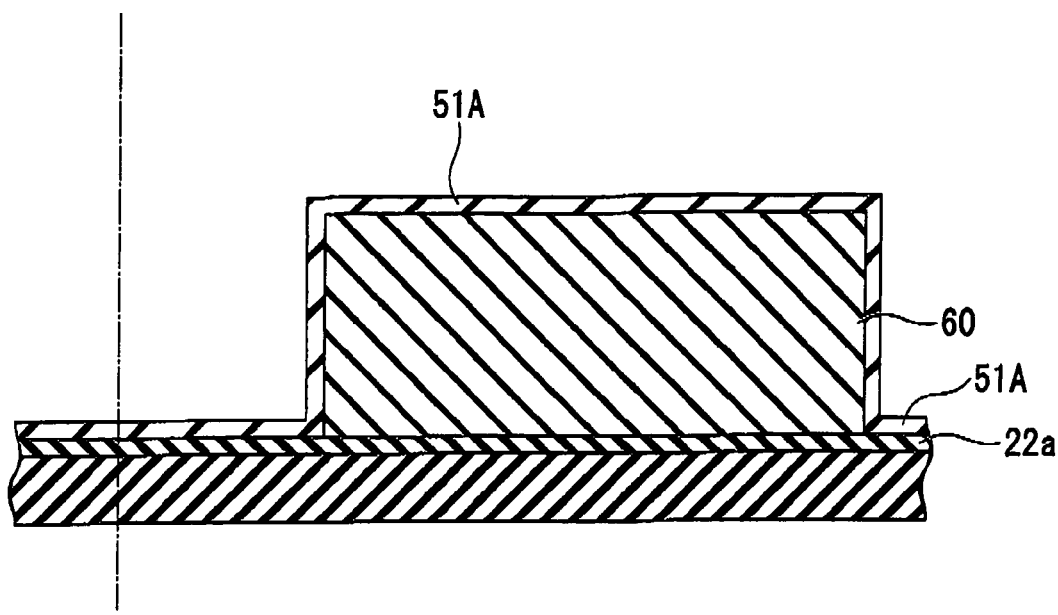
Figure 25C:
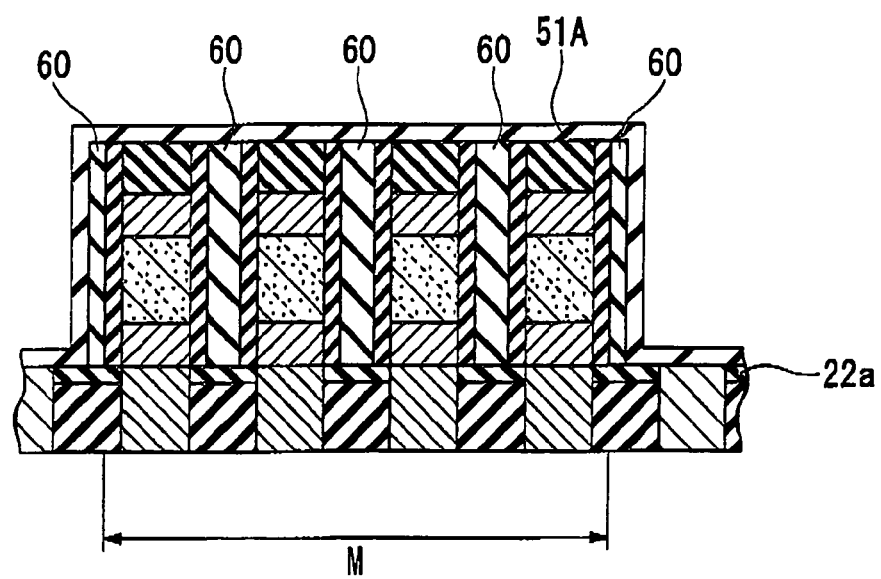

Then, the silicon oxide film 60 is anisotropically etched so as to expose upper surfaces of the SiN film 16 and the third contact plugs 33, as shown in FIGS. 24A to 24C. Then, a silicon nitride film 51A is formed so as to cover the memory portion M and the first etching stopper film 22a, as shown in FIGS. 25A to 25C.

Figure 26A:
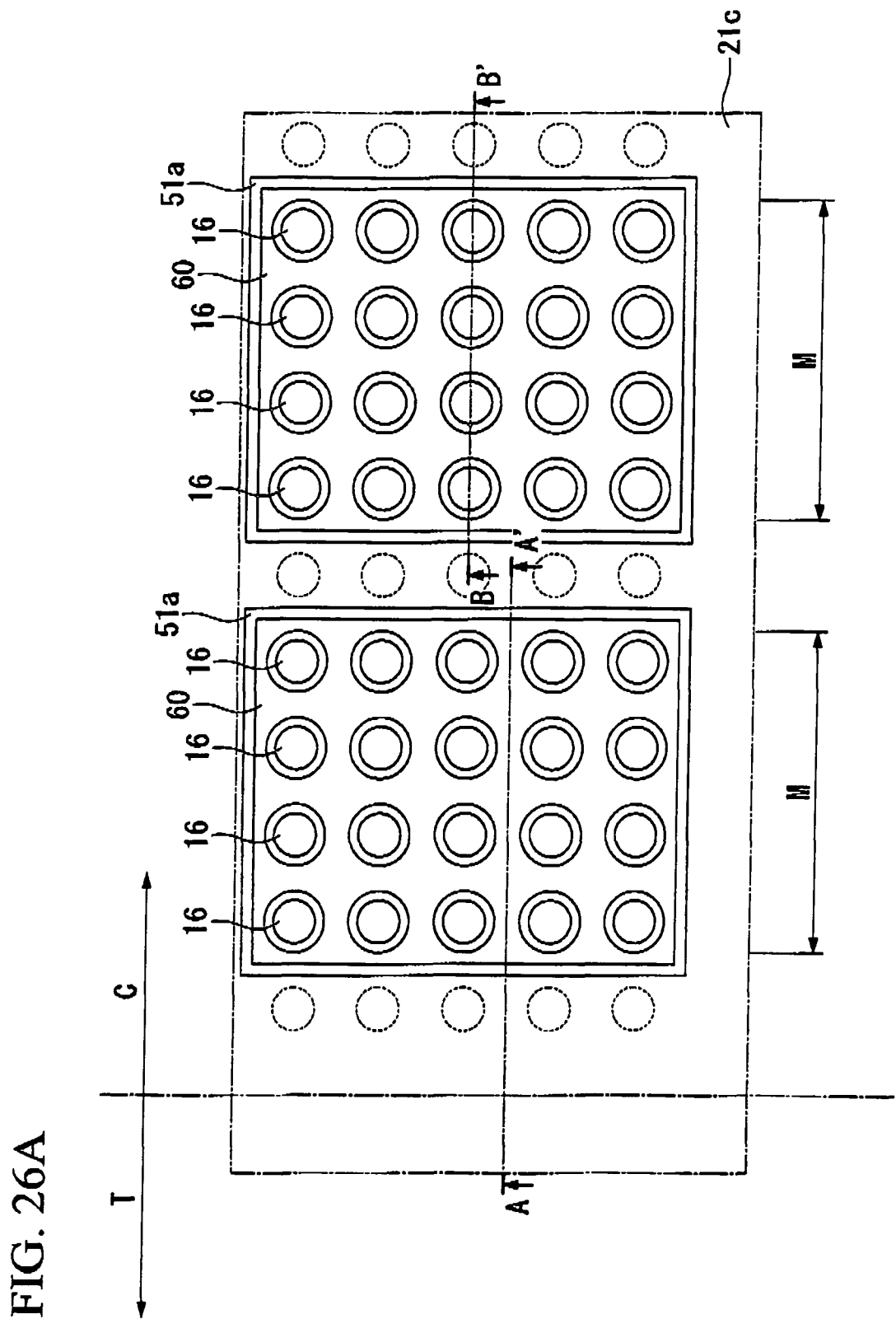
Figure 26B:
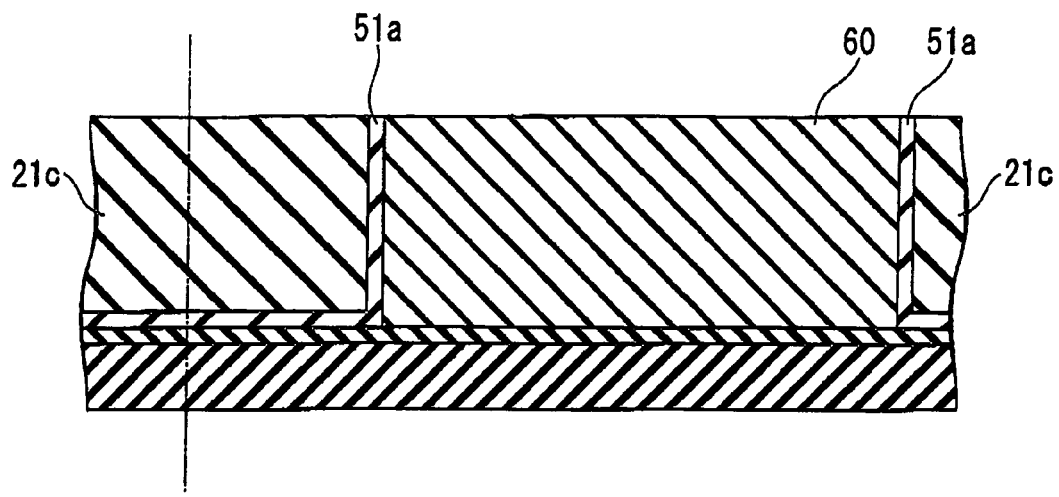
Figure 26C:
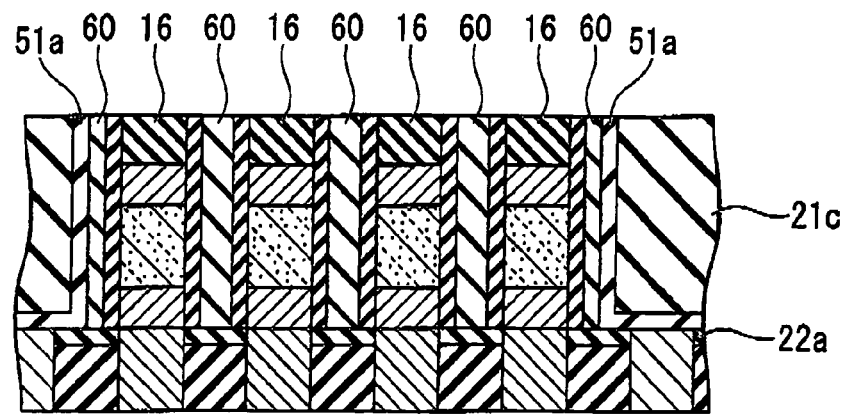

Then, a silicon oxide film is formed over the memory cell region C and the peripheral circuit region T so as to cover the memory portion M. Thus, the third inter-layer insulating film 21c is formed over the first etching stopper film 22a, as shown in FIGS. 26A to 26C. Then, the third inter-layer insulating film 21c is planarized by the CMP method until the upper surfaces of the SiN film 16 and the silicon nitride film 51A are exposed. Thus, a portion of the silicon nitride film 51A, which is positioned over the memory cell portion M, is removed. Meanwhile, the other portion of the silicon nitride film 51A, which is positioned outside the memory portion M, remains. Thus, the remaining portion of the silicon nitride film 51A becomes the partition layer 51a.

Figure 27A:
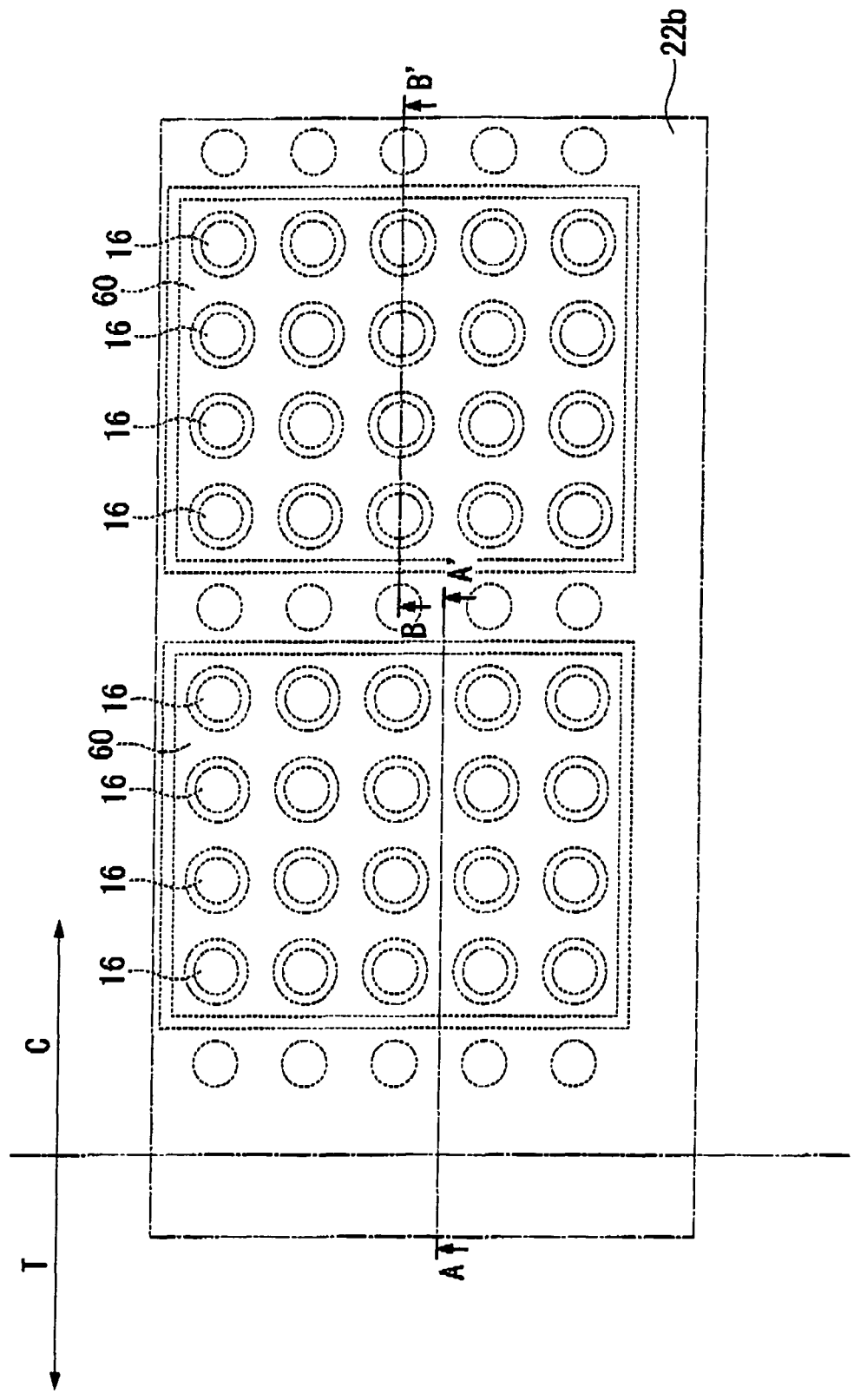
Figure 27B:
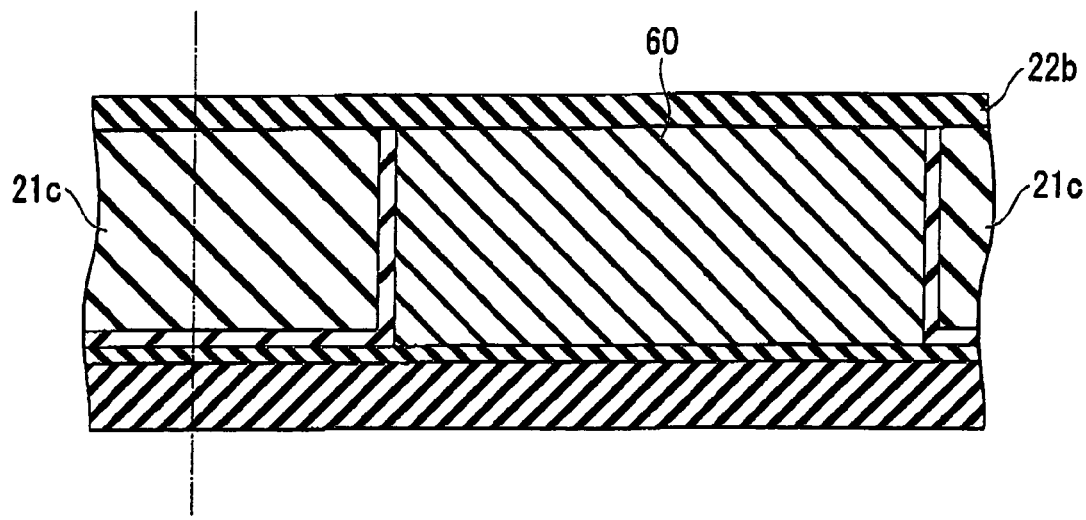
Figure 27C:
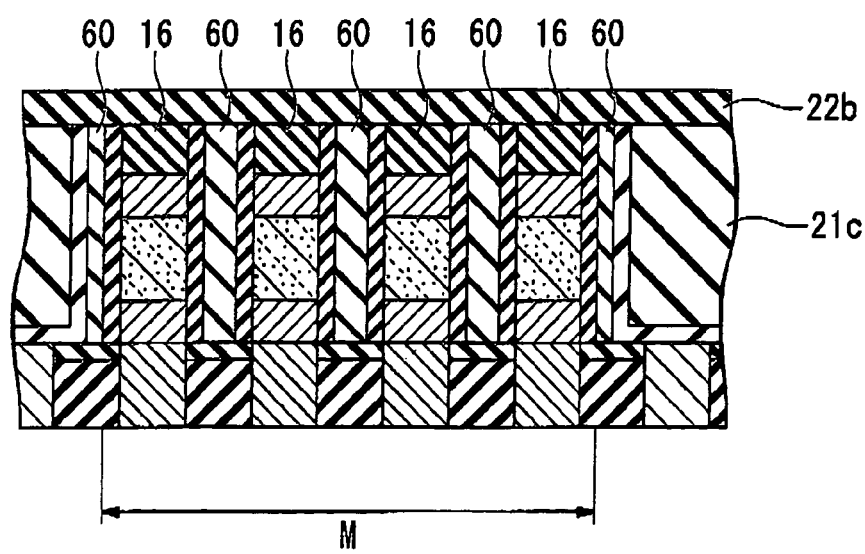

Then, a silicon nitride film is formed over the third inter-layer insulating film 21c and the memory portion M to form the second etching stopper film 22b, as shown in FIGS. 27B and 27C.

Figure 28A:
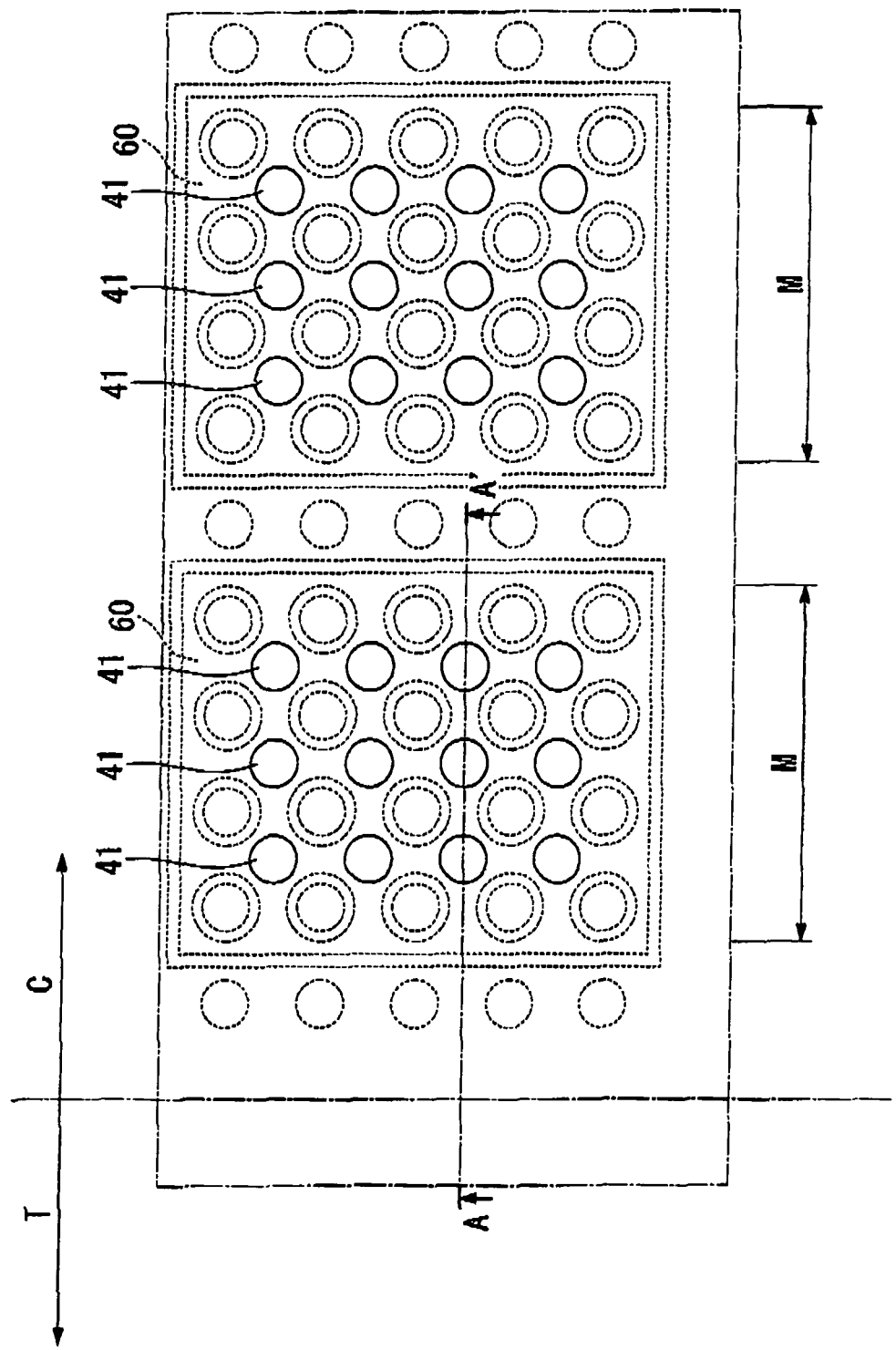
Figure 28B:
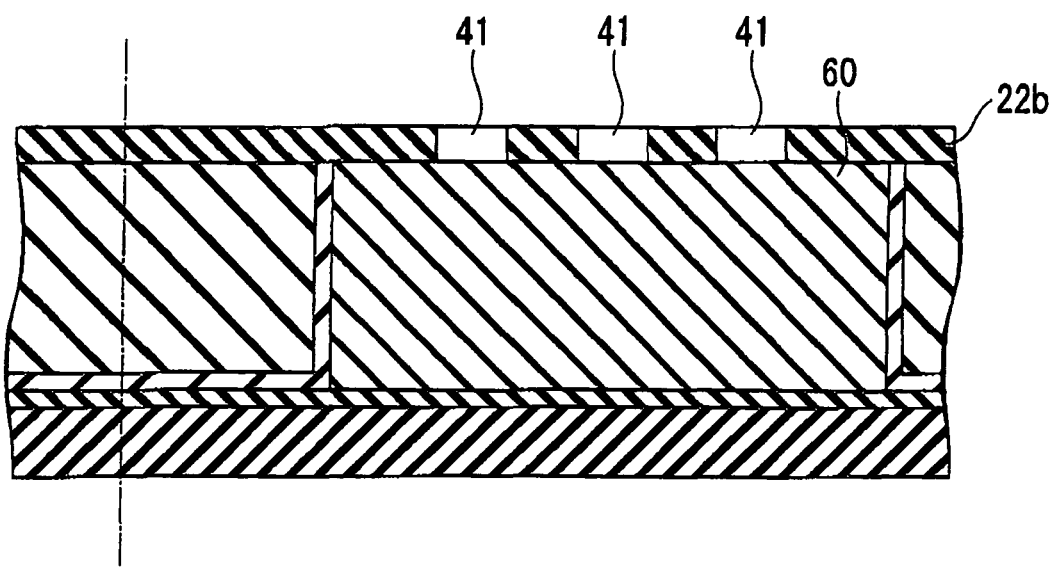

Then, the first holes 41 for wet-etching the silicon oxide film 60 are formed in the second etching stopper film 22b over the memory cell region C by photolithography and etching processes, as shown in FIG. 28B. As shown in FIG. 28A, the first holes 41 are arranged in matrix such that each first hole 41 is positioned inside four neighboring phase-change memory elements 10 in plan view. The diameter of the first hole 41 is approximately 40 nm.

Figure 29A:
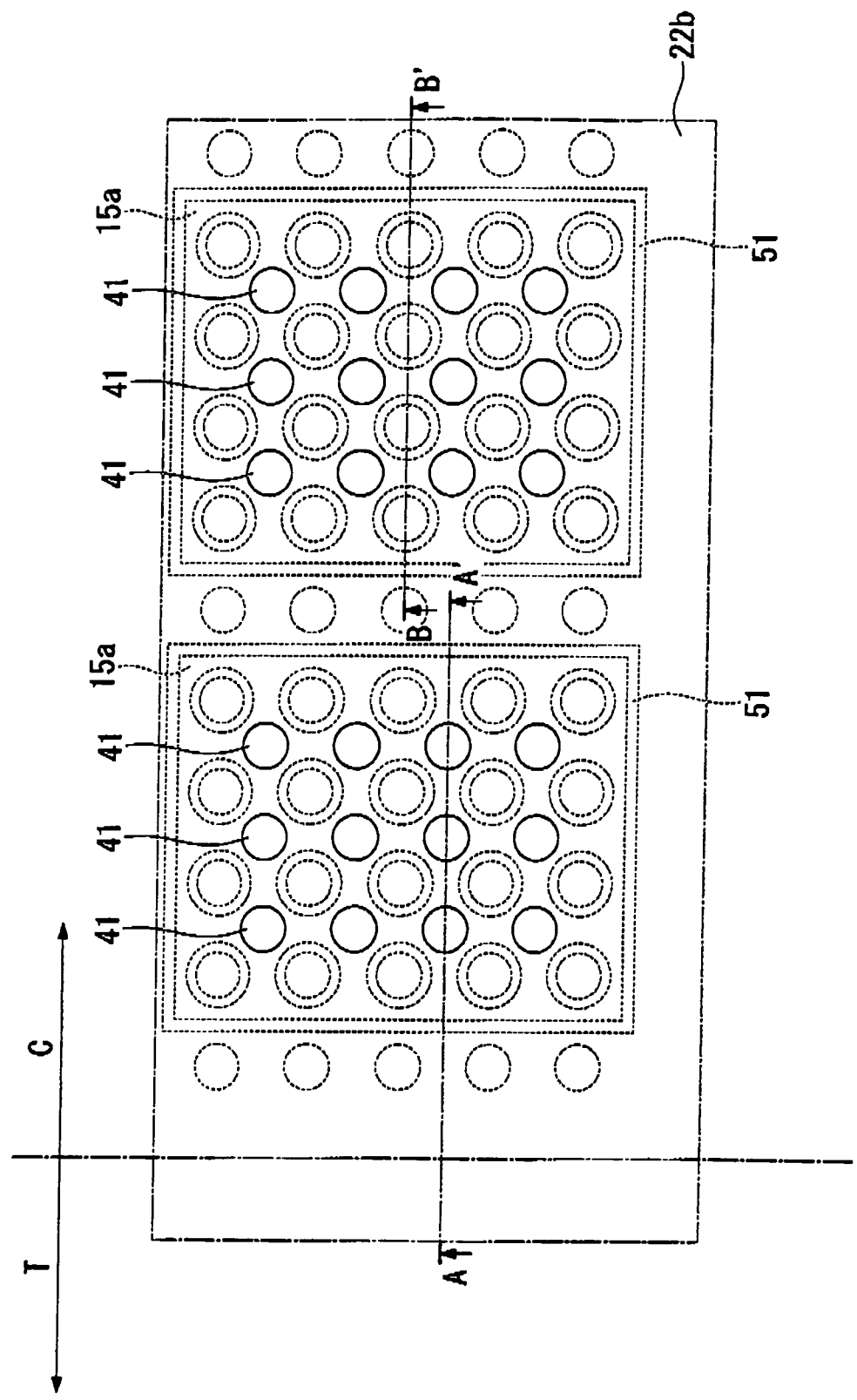
Figure 29B:
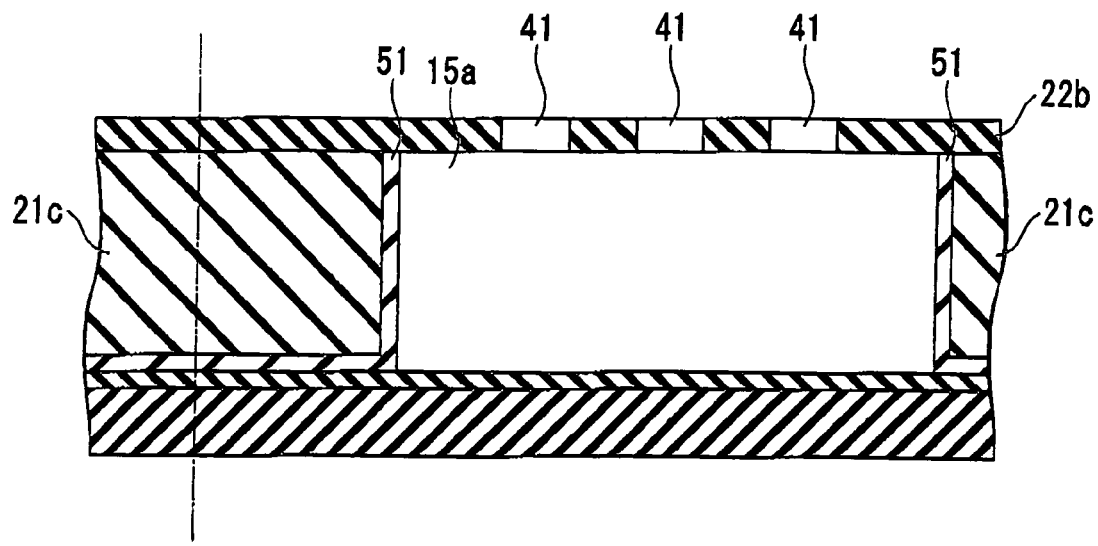
Figure 29C:
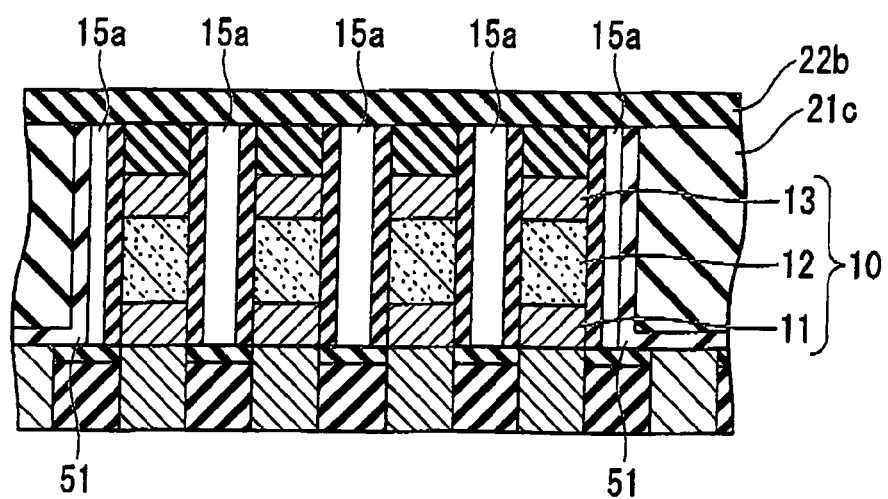

Then, the silicon oxide film 60 is wet-etched by providing an etchant through the first holes 41, as shown in FIGS. 29A to 29C. Thus, the space portion 15a surrounding the phase-change memory elements 10 is formed. In this case, an etchant, whose etching selectivity is low with respect to a silicon nitride film, is used. Thanks to the partition layer 51, the third inter-layer insulating film 21c over the peripheral circuit region T is not wet-etched. In other words, the peripheral circuit region T is not affected by the wet-etching solution.

Figure 30A:
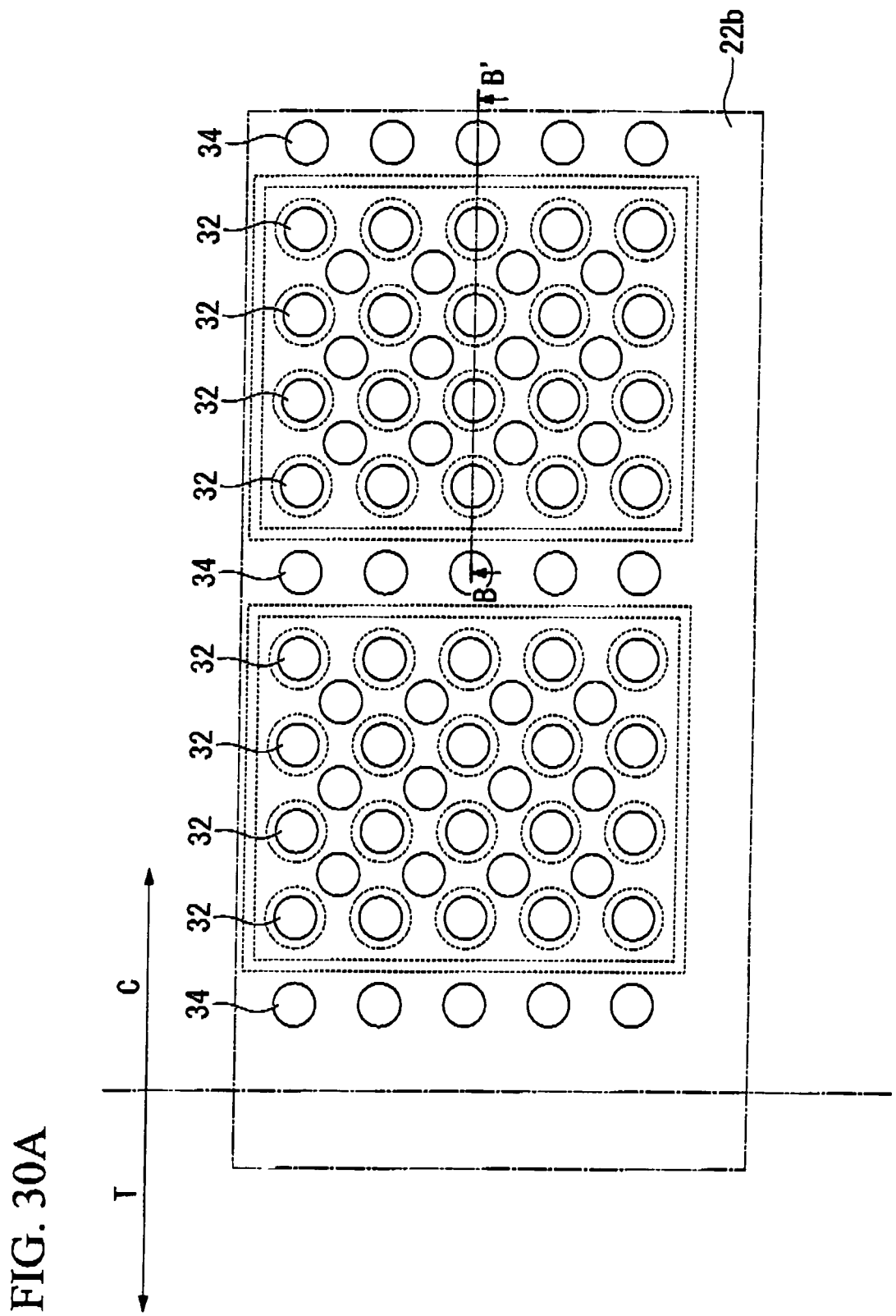
Figure 30B:
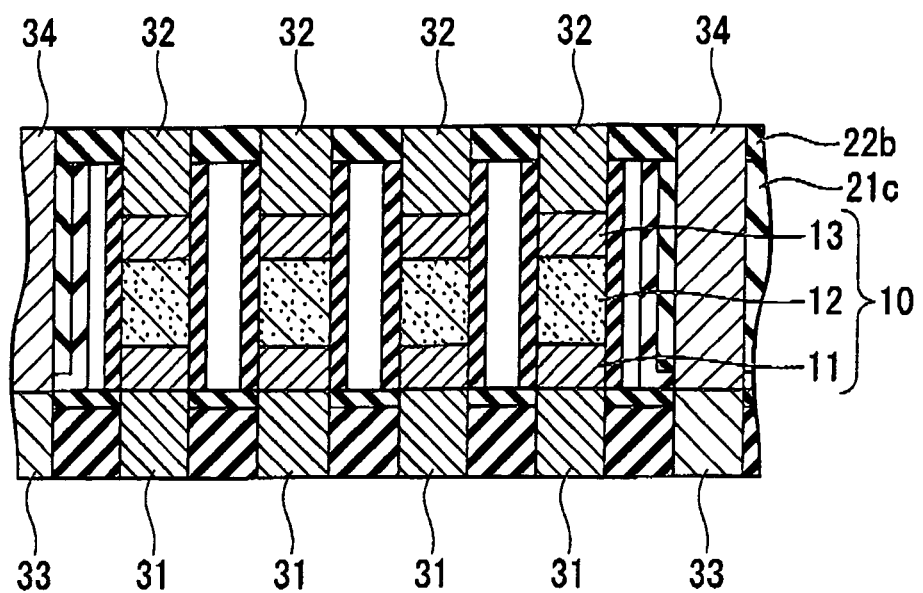

Then, contact holes penetrating the third inter-layer insulating film 21c and the second etching stopper film 22b are formed so as to expose the upper surfaces of the third contact plugs 33, as shown in FIGS. 30A and 30B. Additionally, the second etching stopper film 22b and the SiN film 16 are selectively removed to form contact holes over the respective phase-change memory elements 10.

Then, a tungsten film is formed over the second etching stopper film 22b so as to fill the contact holes. Then, the tungsten film is planarized by the CMP method so as to expose the upper surface of the second etching stopper film 22b. Thus, the second contact plugs 32 are formed over the respective phase-change memory elements 10, and the fourth contact plugs 34 are formed over the respective third contact plugs 33.

Then, the second inter-layer insulating film 21b made of a silicon oxide film is formed over the second etching stopper film 22b so as to fill the first holes 41. Thus, the vacuum space portion 15 surrounding the phase-change memory elements 10 is formed. Thus, the semiconductor device of the fourth embodiment shown in FIGS. 22A to 22C can be formed.

According to the semiconductor device of the fourth embodiment, the partition layer 51 is formed so as to surround the memory portion M including the plurality of phase-change memory elements 10. In other words, a process of forming a groove in the boundary region between the memory cell region C and the peripheral circuit region T to form the partition layer 51 is not required, thereby reducing manufacturing costs. Additionally, if the partition layer 51 is formed closer to the memory portion M, the effective area of memory cells can be decreased.

Fifth Embodiment

Figure 31A:
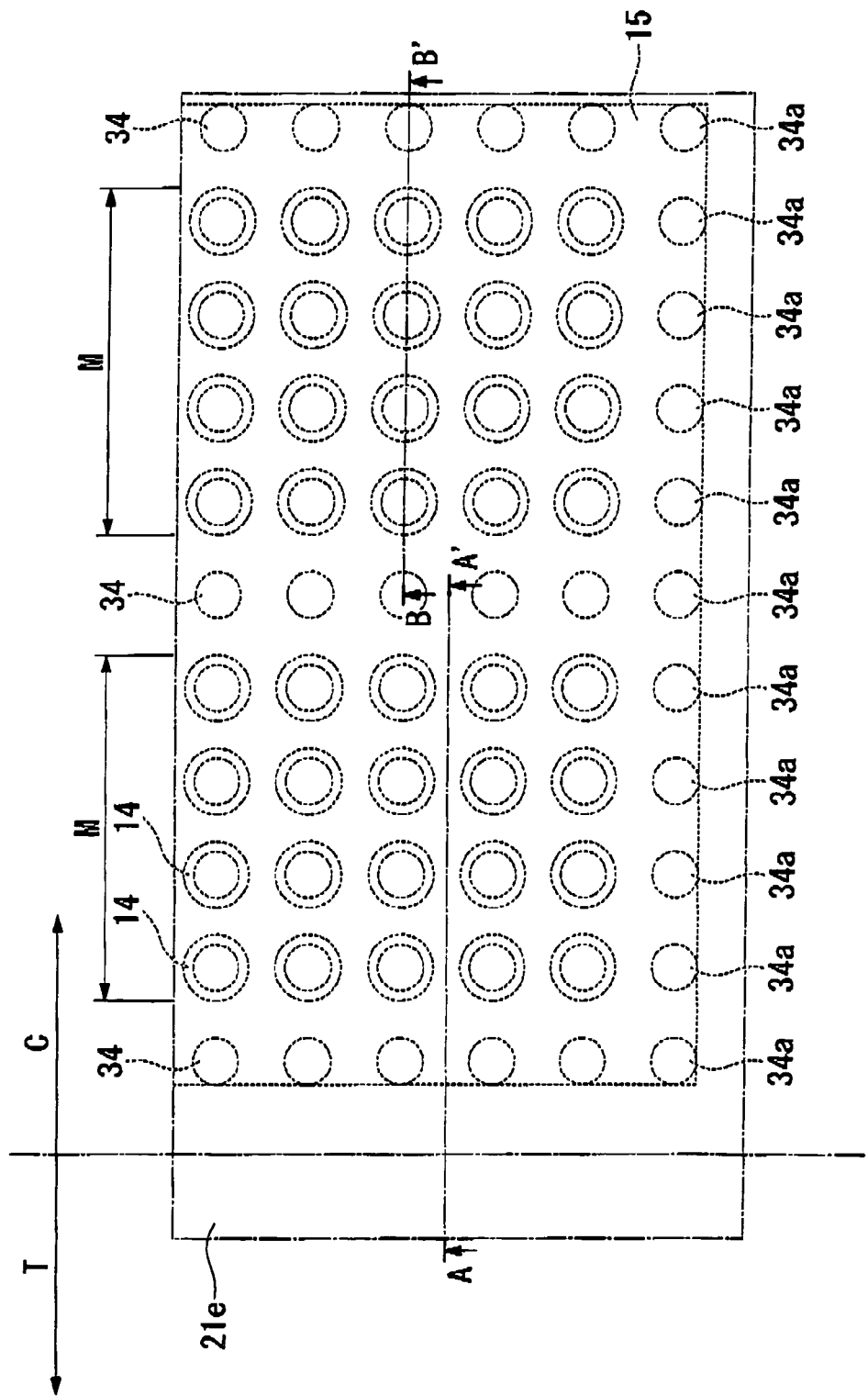
FIG. 31A is a plan view illustrating an example of a semiconductor device according to a fifth embodiment of the present invention.
Figure 31B:
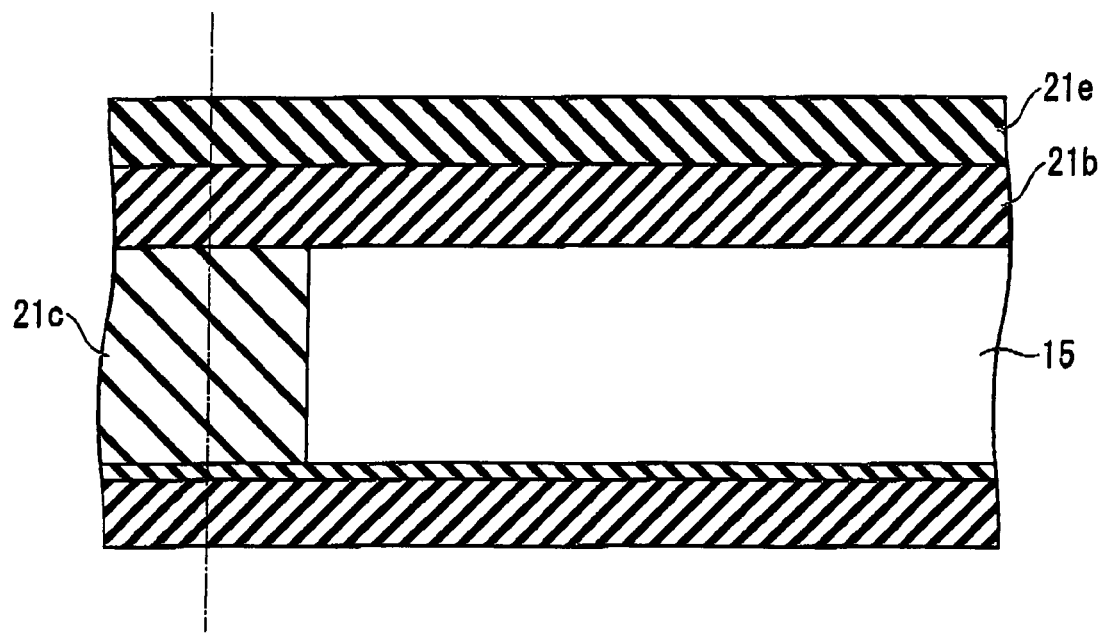
FIGS. 31B and 31C are cross-sectional views taken along lines A-A' and B-B' shown in FIG. 31A, respectively.
Figure 31C:
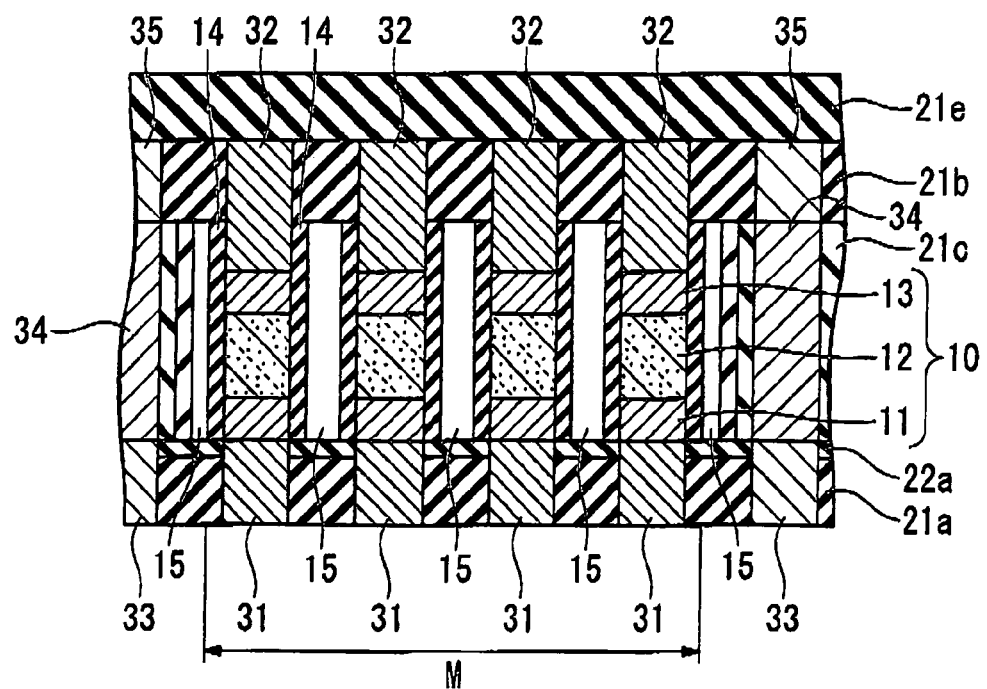

Hereinafter, a semiconductor device according to a fifth embodiment of the present invention is explained. FIG. 31A is a plan view illustrating part of the semiconductor device of the fifth embodiment. FIGS. 31B and 31C are cross-sectional views taken along lines A-A' and B-B' shown in FIG. 31A, respectively.

In the first embodiment, the fourth contact plugs 34 are arranged between two adjacent memory portions M and along the side surface of the peripheral circuit region T. In the second embodiment, on the other hand, dummy plugs 34a are formed along a side of the memory portion M, along which the fourth contact plugs 34 are not formed. In other words, the memory portion M is surrounded by the fourth contact plugs 34 and the dummy plugs 34a. The dummy plug 34a and the fourth contact plug 34 have the same shape and are made of the same material.

The semiconductor device of the fifth embodiment does not include the partition layer 51 and the first holes 41 of the first embodiment. Like reference numerals denote like elements between the first and fifth embodiments, and explanations thereof are omitted here.

As shown in FIG. 31C, the fourth contact plugs 34 are formed over the respective third contact plugs 33. As shown in FIG. 31A, the fourth contact plugs 34 are arranged in a line along either side of the memory portion M including the plurality of phase-change memory elements 10. The distance between two adjacent lines of the fourth contact plugs 34 is a predetermined value. The distance between the line of the fourth contact plugs 34 and the memory portion M is a predetermined value.

The dummy plugs 34a are arranged in a line along a side of the memory portion M along which no fourth contact plug 34 is formed, as shown in FIG. 31A. The fourth contact plug 34 and the dummy plug 34a have the same shape and are made of the same material. The distance between two adjacent dummy plugs 34a is a predetermined value. The distance between the line of the dummy plugs 34a and the memory portion M is a predetermined value. The arrangement type of the dummy plugs 34a is $4F^2$. Thus, the memory portion M is surrounded by the fourth contact plug 34 and the dummy plugs 34a.

The third inter-layer insulating film 21c made of a silicon oxide film is provided over the first etching stopper film 22a over the memory cell region C and the peripheral circuit region T so as to surround a line of the fourth contact plugs 34a and a line of the dummy plugs 34a which are arranged along the peripheral circuit region T. In other words, the third inter-layer insulating film 21c is separated from the memory portion M by the line of the fourth contact plugs and the line of the dummy contact plugs 34a.

The second inter-layer insulating film 21b is provided over the fourth contact plugs 34, the dummy plugs 34a, the protection insulating film 14, and the third inter-layer insulating film 21c. Similar to the first and third inter-layer insulating films 21a and 21c, the second inter-layer insulating film 21b is made of a silicon oxide film.

As shown in FIG. 31C, the second contact plugs 32 penetrates the second inter-layer insulating film 21b so as to be coupled to the respective upper electrodes 13. The fifth contact plugs 35 penetrates the second inter-layer insulating film 21b so as to be coupled to the respective fourth contact plugs 34.

The vacuum space portion 15 surrounding the phase-change memory elements 10 is provided between the first and second inter-layer insulating films 22a and 21b, in the region surrounded by the fourth contact plugs 34 and the dummy plugs 34a. The space portion 15 is also provided between the memory portion M and the line of the fourth contact plugs 34 and between the memory portion M and the line of the dummy contact plugs 34a.

Thus, the line of the fourth contact plugs 34 and the line of the dummy contact plugs 34a separate the third inter-layer insulating film 21c from the space portion 15. In other words, the space portion 15 is sealed by the fourth contact plugs 34, the dummy plugs 34a, the first etching stopper film 22a, and the second inter-layer insulating film 21b. The protection insulating film 14 covers side surfaces of the phase-change memory elements 10. Thus, the protection insulating film 14 separates the phase-change memory element 10 from the space portion 15.

The fifth inter-layer insulating film 21e is provided over the second inter-layer insulating film 21b, the second contact plugs 32, and the fifth contact plugs 35. Similar to the second inter-layer insulating film 21b, the fifth inter-layer insulating film 21e is made of a silicon oxide film. In the fifth embodiment, a film corresponding to the second etching stopper film 22b of the first embodiment is not provided.

Hereinafter, a method of manufacturing the semiconductor device of the fifth embodiment is explained with reference to FIGS. 32A to 35B. The manufacturing method of the fifth embodiment up to the process of forming the protection insulating film 14 and the third inter-layer insulating film 12c are the same as the manufacturing method of the first embodiment. Therefore, only processes thereafter are explained hereinafter.

Firstly, contact holes are formed in the third inter-layer insulating film 21c so as to expose upper surfaces of the third contact plugs 33. Additionally, contact holes for dummy contact plugs are formed in the third inter-layer insulating film 21c along a side of the memory portion M, where the third contact plugs 34 are not formed. The contact holes for dummy contact plugs have the same shape as that of the contact holes for the contact plugs 33 and 34. The contact holes for dummy contact plugs are arranged on a line that is separated from the memory portion M by a predetermined value.

Figure 32A:
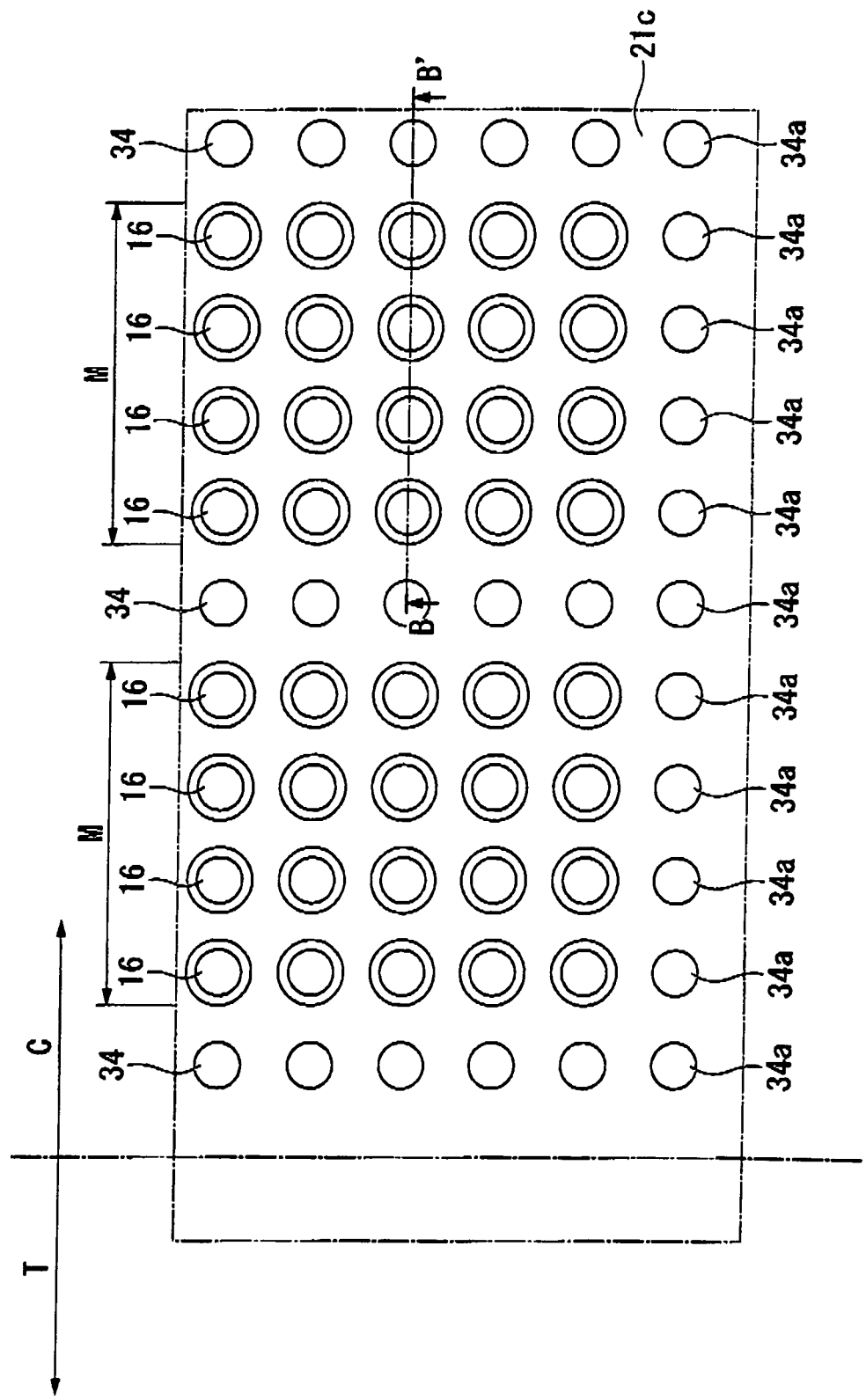
Figure 32B:
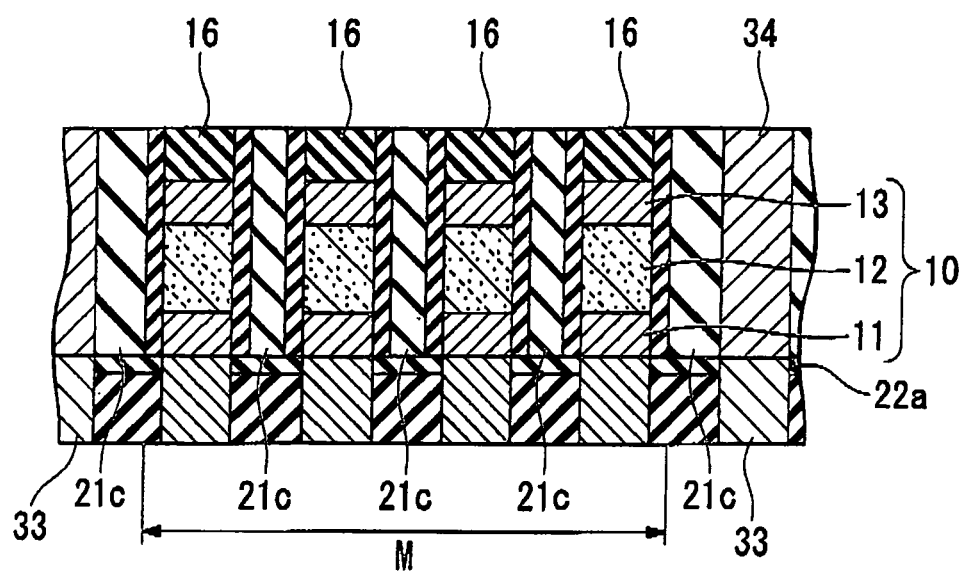

Then, a tungsten film is formed over the third inter-layer insulating film 21c and the SiN film 16 so as to fill the contact holes for contact plugs and the contact holes for dummy plugs. Then, the tungsten film is planarized by the CMP method so as to expose the upper surface of the SiN film 16, as shown in FIG. 32B. Thus, the fourth contact plugs 34 are formed over the respective third contact plugs 33, and the dummy plugs 34a are formed along the side of the memory portion M where the contact plugs 34 are not formed.

Accordingly, the memory portion M is surrounded by the fourth contact plugs 34 and the dummy plug s 34a in plan view. The fourth contact plugs 34 are coupled to the respective third contact plugs 33, and functions as contact plugs. However, the dummy plugs 34a do not function as contact plugs. The dummy plugs 34a prevent a silicon oxide film from being formed in space between two adjacent phase-change memory elements 10 when the vacuum space portion 15 is formed therebetween.

Figure 33A:
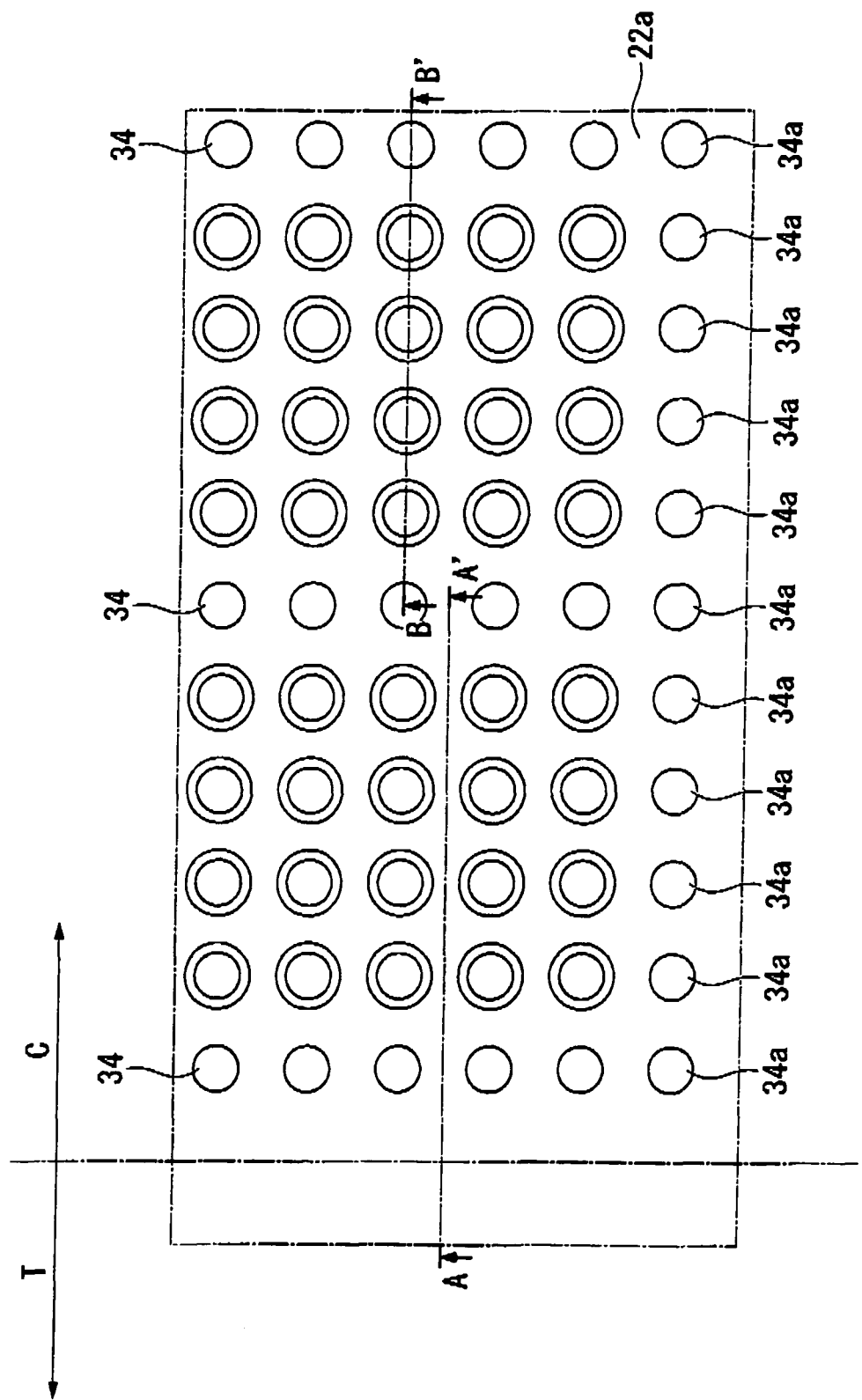
Figure 33B:
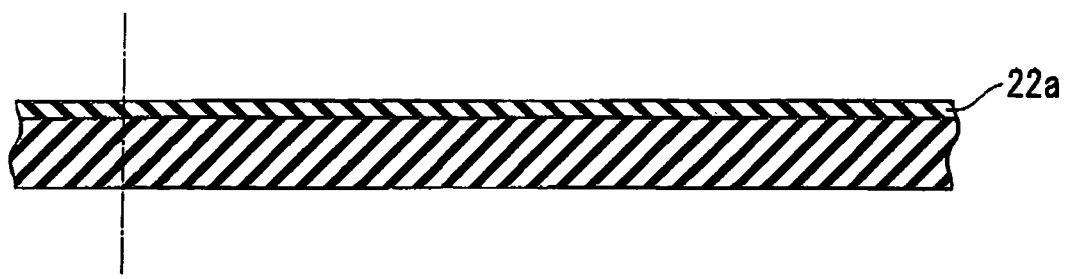
Figure 33C:
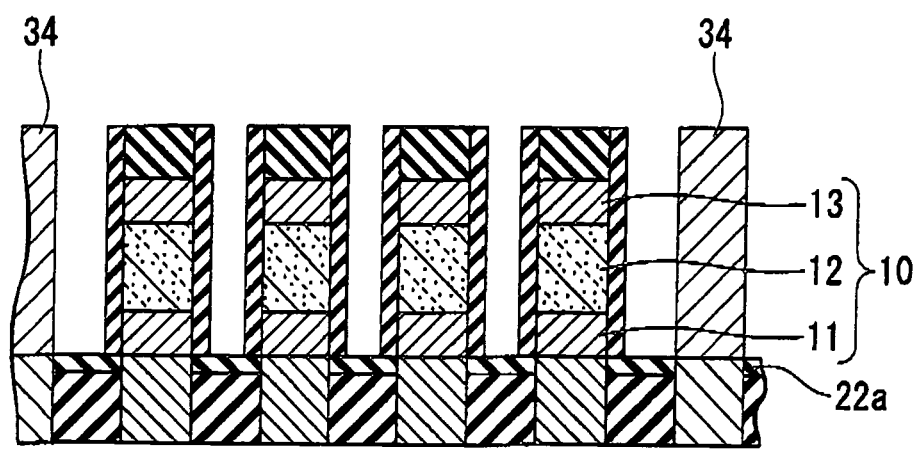

Then, the third inter-layer insulating film 21c filling the space between two adjacent phase-change memory elements 10 is removed by a wet-etching process as shown in FIGS. 33A to 33C. Consequently, the phase-change memory elements 10, the fourth contact plugs 34, and the dummy plugs 34a remain extending upward.

Figure 34A:
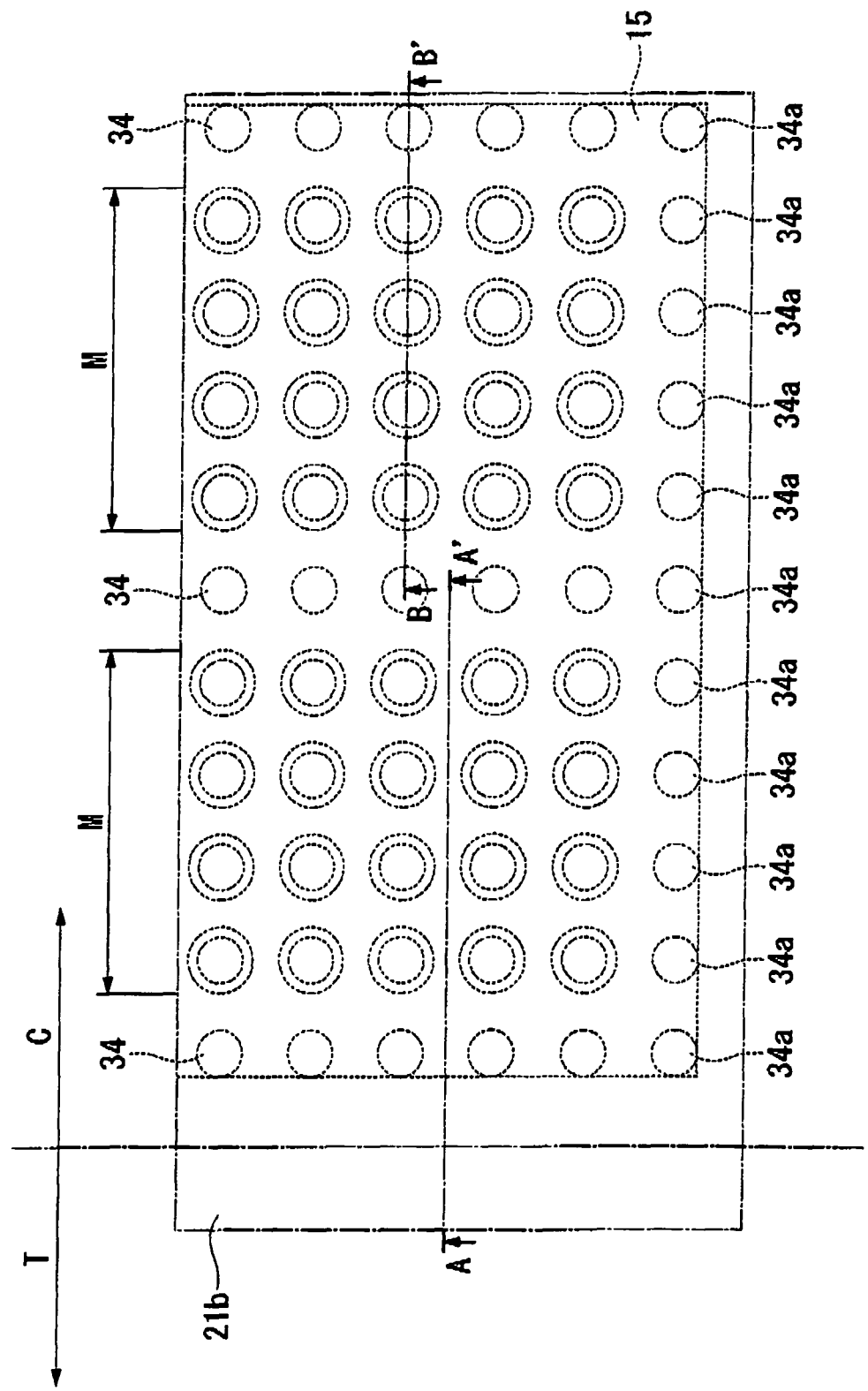
Figure 34B:
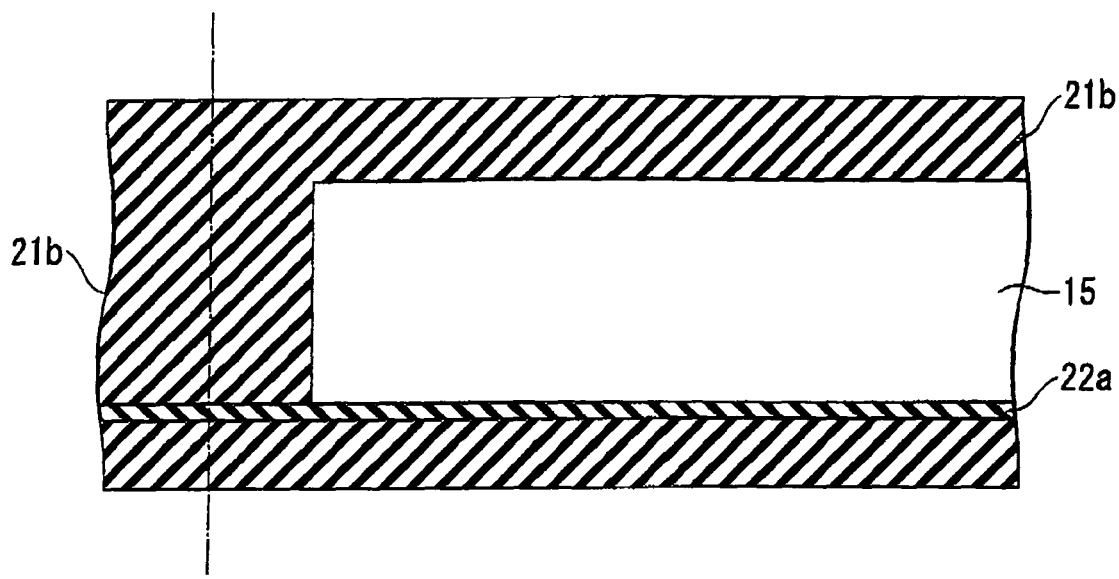
Figure 34C:
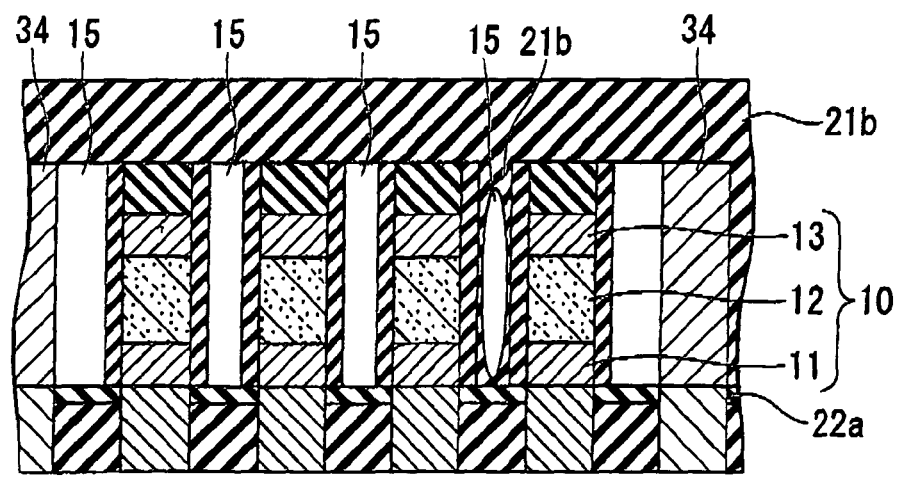

Then, the second inter-layer insulating film 21b made of a silicon oxide film is formed by a vacuum film forming method over the first etching stopper film 22a, the memory portion M, the fourth contact plugs 34, and the dummy plugs 34a, as shown in FIGS. 34A to 34C. In this case, the fourth contact plugs 34 and the dummy plugs 34a are densely provided along the periphery of the memory portion M, and the second inter-layer insulating film 21b is formed under the low coverage condition. For this reason, the second inter-layer insulating film 21b is not formed between the space between two adjacent phase-change memory elements 10. Accordingly, the vacuum space portion 15 is formed so as to surround the plurality of phase-change memory elements 10.

Even if the second inter-layer insulating film 21b is formed in the space between two adjacent phase-change memory elements 10 as shown in FIG. 34C, enhancement in thermal efficiency of the phase-change memory material layer 12 can be expected as long as the space portion 15 surrounding the phase-change memory material layer 12 is formed.

Then, the SiN film 16 and the second inter-layer insulating film 21b over the phase-change memory elements 10 are removed. Additionally, contact holes are formed in the second inter-layer insulating film 21b over the fourth contact plugs 34 so as to expose the upper surfaces of the fourth contact plugs 34.

Figure 35B:
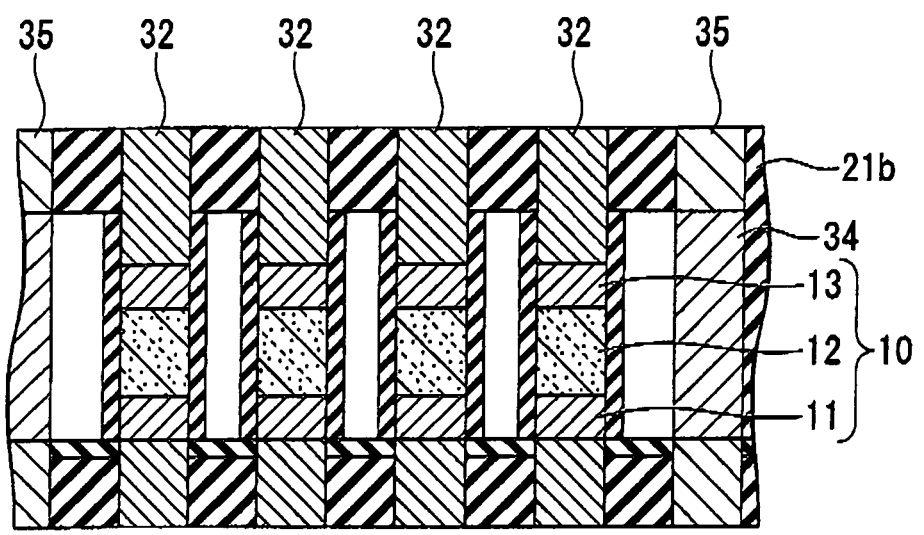

Then, a tungsten film is formed over the second inter-layer insulating film 21b so as to fill the contact holes, as shown in FIGS. 35A and 35B. Then, the tungsten film is planarized by the CMP method so as to expose the upper surface of the second inter-layer insulating film 21b. Thus, the second contact plugs 32 are formed over the respective upper electrodes 13, and the fifth contact plugs 35 are formed over the respective fourth contact plugs 34.

Then, a fifth inter-layer insulating film 21e made of a silicon oxide film is formed. The fifth inter-layer insulating film 21e is used for the following wiring process (not described here). Thus, the semiconductor device of the fifth embodiment as shown in FIGS. 31A to 31C can be formed.

According to the semiconductor device of the fifth embodiment, the memory portion M is surrounded by the fourth contact plugs 34 and the dummy contact plugs 34a in plan view. Accordingly, the process of forming the partition layer is not required to prevent a wet-etching solution from penetrating the peripheral circuit region T.

Additionally, a wet etching process for forming the space portion 15a surrounding the phase-change memory elements 10 is not required. Accordingly, the second etching stopper film having holes through which a wet-etching solution is provided is not required, thereby enabling a more miniaturized semiconductor device than the semiconductor devices of the related art.

Further, the fourth contact plugs 34 and the dummy plugs 34a are formed in the same process. Additionally, the fourth contact plugs 34 and the dummy plugs 34a are made of the same material. Thereby, manufacturing costs can be reduced without providing an additional manufacturing process.

Sixth Embodiment

Hereinafter, a semiconductor device according to a sixth embodiment of the present invention is explained with reference to FIGS. 36 to 38. The semiconductor device of the sixth embodiment differs from the semiconductor device of the related art in that the vacuum space portion 15 is provided between the element layer and the second inter-layer insulating film 21b so as to surround at least one of the heater electrode 11 and the phase-change memory material layer 12.

Figure 36:
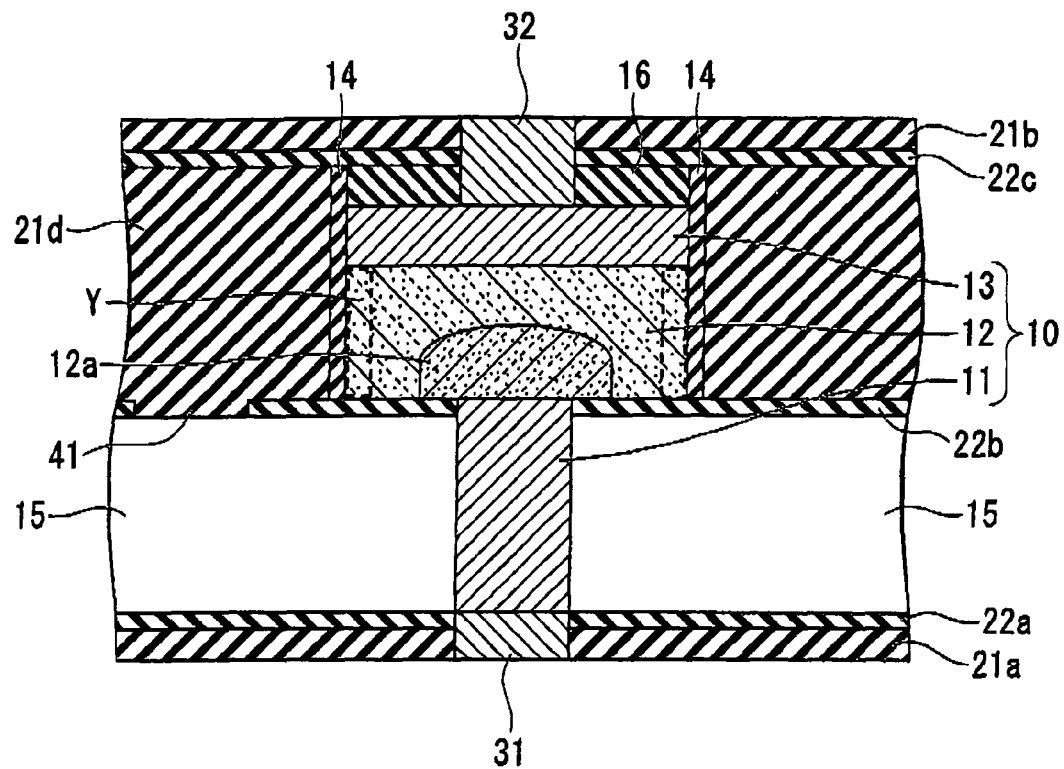
FIG. 36 is a cross-sectional view illustrating an example of a semiconductor device according to a sixth embodiment of the present invention.

FIG. 36 is a cross-sectional view illustrating one example of the semiconductor device of the sixth embodiment. The first etching stopper film 22a is provided over the element layer. The first contact plugs 31 penetrates the first inter-layer insulating film 21a and the first etching stopper film 22a.

The heater electrode 11 is provided on the first contact plug 31. The second etching stopper film 22b is provided over the first etching stopper 22a. The first and second etching stopper films 22a and 22b are made of the same material. The top level of the heater electrode 11 is substantially equal to the top level of the second etching stopper film 22b.

The first hole 41 through which a wet-etching solution is provided is formed in the second etching stopper film 22b. As will be explained later, the first holes 41 are separated by a predetermined value from the phase-change memory element 10 so that the fourth inter-layer insulating film 21d is not formed under the phase-change memory material layer 12. The fourth inter-layer insulating film 21d is made of a silicon oxide film and fills the first hole 41.

The phase-change memory material layer 12 is provided over the second etching stopper film 22b and the heater electrode 11. When a current is provided to the heater electrode 11, phase transition of the phase-change memory material layer 12 occurs. Thereby, the phase-change region 12a is formed in the phase-change memory material layer 12, adjacent to the heater electrode 11.

The upper electrode 13 is provided over the phase-change memory material layer 12. Thus, the phase-change memory layer 10, which includes the heater electrode 11, the phase-change memory material layer 12, and the upper electrode 13, is formed.

The SiN film 16 is provided over the upper electrode 13. The protection insulating film 14 covers side surfaces of the phase-change memory material layer 12, the upper electrode 13, and the SiN film 16. The fourth inter-layer insulating film 21d made of a silicon oxide film surrounds the protection insulating film 14. The fourth inter-layer insulating film 21d fills the first hole 41 in the second etching stopper film 22b. The vacuum space portion 15 surrounding the heater electrode 11 is provided between the first and second etching stopper films 22a and 22b.

The third etching stopper film 22c is provided over the fourth inter-layer insulating film 21d and the SiN film 16. The second inter-layer insulating film 21b is provided over the third etching stopper film 22c. The second contact plug 32 penetrates the second inter-layer insulating film 21b, the third etching stopper film 22c, and the SiN film 16 so as to be coupled to the upper electrode 11.

Figure 37:
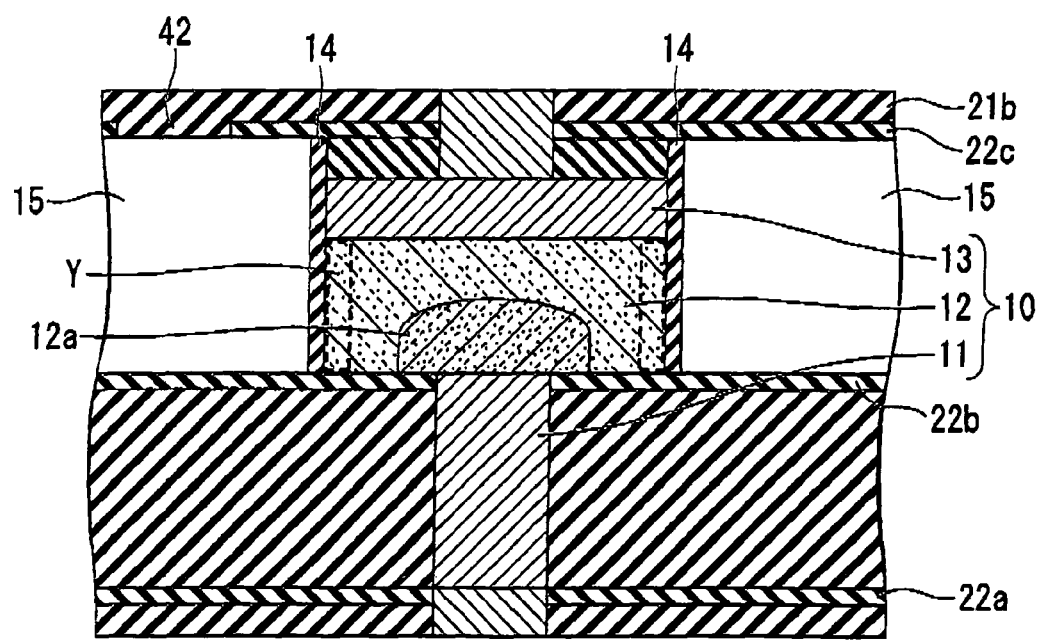
FIG. 37 is another example of the semiconductor device of the sixth embodiment.

FIG. 37 is a cross-sectional view illustrating another example of the semiconductor device of the sixth embodiment. In this example, the space portion 15 is provided between the second and third etching stopper films 22b and 22c, so as to surround the phase-change memory element layer 12.

The second hole 42 through which a wet-etching solution is provided is provided in the third etching stopper film 22c. In this case, the second hole 42 is separated by a predetermined value from the phase-change memory element 10 so that a wet-etching solution is not deposited close to the phase-change memory layer 10.

Figure 38:
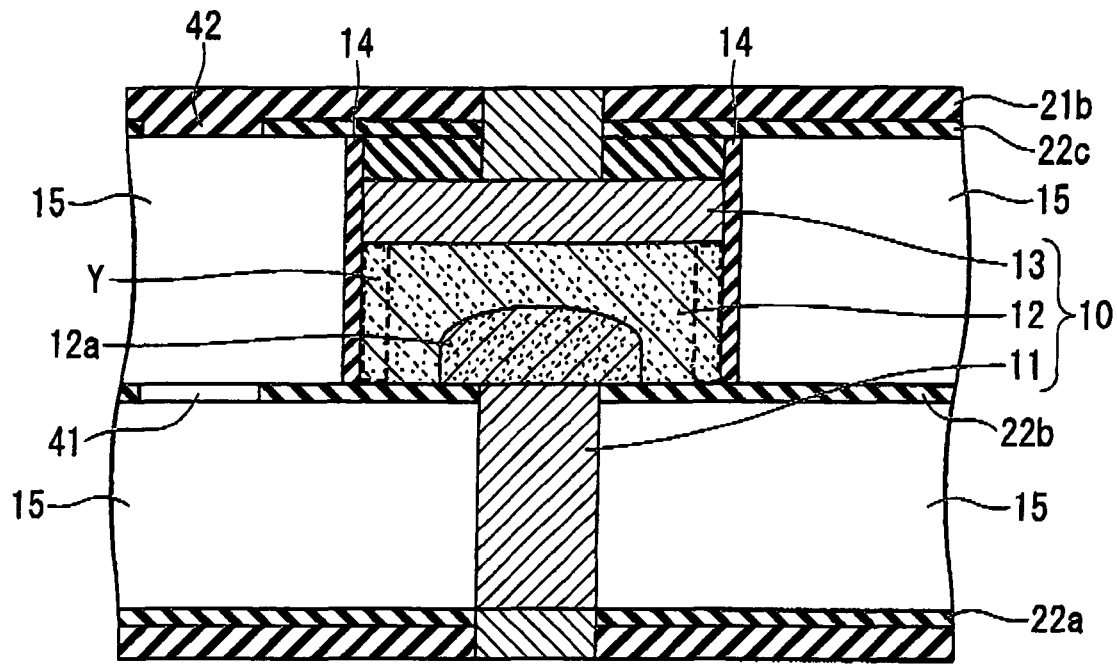
FIG. 38 is another example of the semiconductor device of the sixth embodiment.
Figure 39:
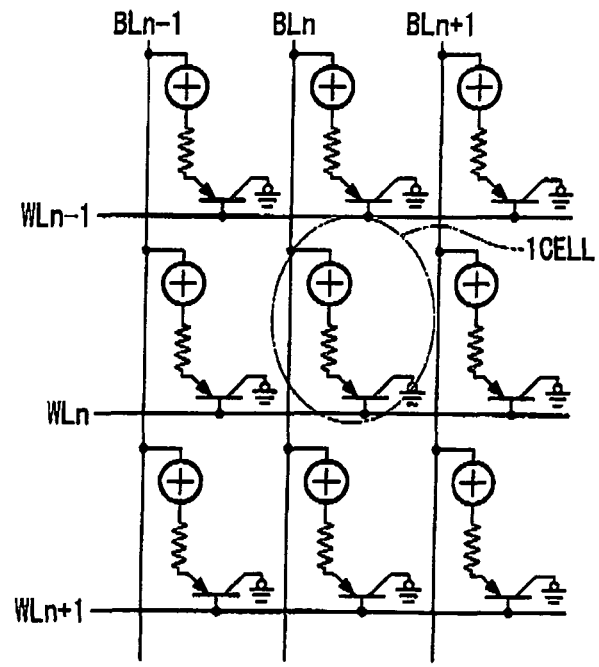
FIG. 39 is a plan view illustrating layout of a semiconductor device of related art.
Figure 40:
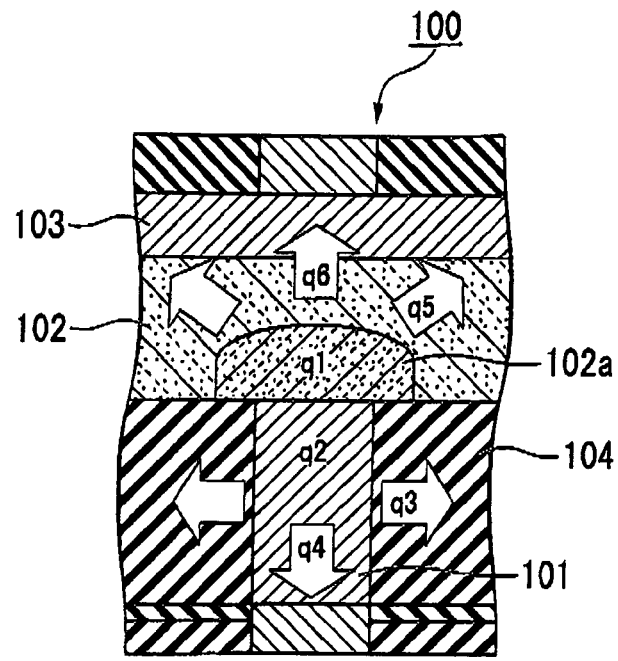
FIG. 40 is a cross-sectional view illustrating an example of the semiconductor device of related art.
Figure 41:
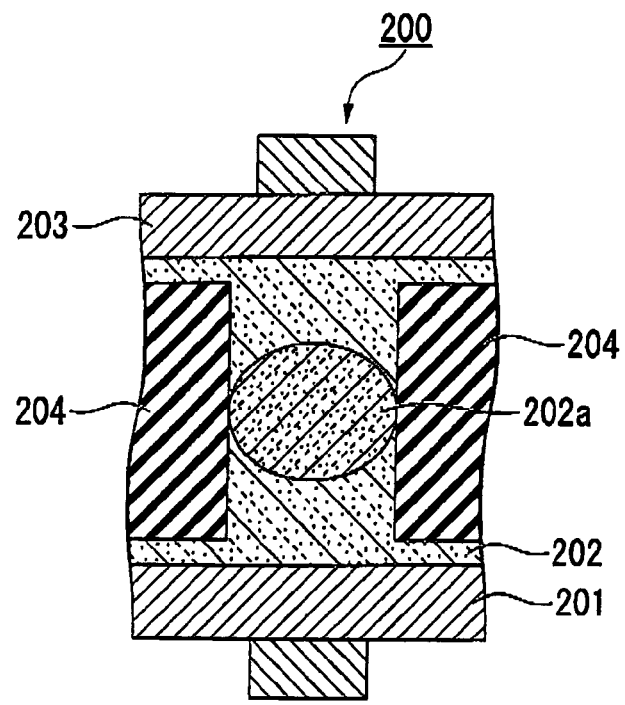
FIG. 41 is a cross-sectional view illustrating another example of the semiconductor device of related art.

FIG. 38 is a cross-sectional view illustrating another example of the semiconductor device of the sixth embodiment. The vacuum space portion 15 is provided between the first and second etching stopper films 22a and 22b so as to surround the heater electrode 11. Additionally, the vacuum space portion 15 is also provided between the second and third etching stopper films 22b and 22c so as to surround the phase-change memory element layer 12.

The first hole 41 and the second hole 42, through which a wet-etching solution is provided, are provided in the second etching stopper film 22b and the third etching stopper film 22c, respectively. In other words, a double-layered structure having the holes 41 and 42 is provided. In this case, the holes 41 and 42 are separated by a predetermined distance from the phase-change memory element 10 so that a wet-etching solution is not deposited close to the phase-change memory layer 10.

Hereinafter, a method of manufacturing the semiconductor device of the sixth embodiment is explained. In addition to the processes for manufacturing the semiconductor device of the related art, the method of the sixth embodiment further includes: a process of forming at least one of the first and second holes 41 and 42 in at least one of the second and third etching stopper films 22b or 22c; and a process of forming the space portion 15.

The manufacturing of the sixth embodiment up to the process of forming the phase-change memory layer 10 is the same as the manufacturing method of the related art. Therefore, only processes thereafter are explained hereinafter.

Hereinafter, a method of manufacturing the semiconductor device shown in FIG. 36 is explained. In addition to the processes of manufacturing the semiconductor device of the related art, the method of manufacturing the semiconductor device shown in FIG. 36 further includes: a process of forming the first hole 41; and a process of forming the vacuum space portion 15.

After the phase-change memory layer 10 is formed over the second etching stopper film 22b, the first hole 41 is formed in the second etching stopper film 22b by photolithography and etching processes.

As will be explained later, the first hole 41 is filled with the fourth inter-layer insulating film 21d. At this time, if the first hole 41 is formed close to the phase-change memory element 10, the fourth inter-layer insulating film 21d might spread into region under the second etching stopper film 22b through the first hole 41. Consequently, the fourth inter-layer insulating film 21d might be formed under the phase-change material layer 12. For this reason, the first hole 41 is preferably separated from the phase-change memory layer 10 by a predetermined value.

Then, the third inter-layer insulating film 21c is wet-etched by providing a wet-etching solution through the first hole 41. Then, the fourth inter-layer insulating film 21d made of a silicon oxide film is formed by a vacuum film forming method over the second etching stopper film 22b so as to surround the phase-change memory material layer 12 and the upper electrode 13. In this case, the first hole 41 is filled with the fourth inter-layer insulating film 21d.

Thus, the vacuum space portion 15 surrounding the heater electrode 11 is formed between the first and second etching stopper films 22a and 22b. In this case, the fourth inter-layer insulating film 21d is preferably formed under a low coverage condition.

Then, the third etching stopper film 22c is formed over the fourth inter-layer insulating film 21d and the SiN film 16. Then, the second inter-layer insulating film 21b is formed over the third etching stopper film 22c.

Then, the second contact plug 32 is formed so as to penetrate the third etching stopper film 22c and the second inter-layer insulating film 21b. The second contact plug 32 is coupled to the upper electrode 13. Thus, the semiconductor device shown in FIG. 36 can be manufactured.

Hereinafter, a method of manufacturing the semiconductor device shown in FIG. 37 is explained. In addition to the processes of manufacturing the semiconductor device of the related art, the method of manufacturing the semiconductor device shown in FIG. 37 further includes: a process of forming the first hole 42; and a process of forming the vacuum space portion 15.

Firstly, the fourth inter-layer insulating film 21d made of a silicon oxide film is formed over the second etching stopper film 22b so as to surround the phase-change memory material layer 12 and the upper electrode 13.

Then, the third etching stopper film 22c is formed over the fourth inter-layer insulating film 21d and the SiN film 16. Then, the second hole 42 is formed in the third etching stopper film 22c by photolithography and etching processes. Then, the fourth inter-layer insulating film 21d is wet-etched by providing an etchant through the second hole 42.

Then, the second inter-layer insulating film 21b made of a silicon oxide film is formed by a vacuum film forming method over the third etching stopper film 22c. At this time, the second hole 42 is filled with the second inter-layer insulating film 21b. Thus, the vacuum space portion 15 is formed between the second and third etching stopper films 22b and 22c, so as to surround the phase-change memory material layer 12. Preferably, the second inter-layer insulating film 21b is formed under a low coverage condition. Thus, the semiconductor device shown in FIG. 37 can be manufactured.

Hereinafter, a method of manufacturing the semiconductor device shown in FIG. 38 is explained. In addition to the processes of manufacturing the semiconductor device of the related art, the method of manufacturing the semiconductor device shown in FIG. 38 further includes: a process of forming the first and second holes 41 and 42 in the second and third etching stopper films 22b and 22c, respectively; and a process of forming the vacuum space portion 15 surrounding the heater electrode 11 and the phase-change memory material layer 12.

After the phase-change memory element 10 is formed over the second etching stopper film 22b, the first hole 41 is formed in the second etching stopper film 22b. Preferably, the first hole 41 is separated from the phase-change memory element 10 by a predetermined value.

Then, the fourth inter-layer insulating film 21d made of a silicon oxide film is formed over the second etching stopper film 22b so as to surround the phase-change memory material layer 12 and the upper electrode 13. At this time, the first hole 41 is filled with the fourth inter-layer insulating film 21d.

Then, the third etching stopper film 22c is formed over the fourth inter-layer insulating film 21d and the SiN film 16. Then, the second hole 42 is formed in the third etching stopper film 22c. Then, the fourth inter-layer insulating film 21d is wet-etched by providing etchant through the second hole 42. Thus, the space portion 15 surrounding the phase-change memory element 10 is formed.

Then, the wet etching process proceeds so that the fourth inter-layer insulating film 21d filling the first hole 41 is also wet-etched. Then, the third inter-layer insulating film 22c under the second etching stopper film 22b is wet-etched. Thus, the space portion 15 surrounding the heater electrode 11 is formed.

Then, the second inter-layer insulating film 21b made of silicon oxide is formed over the third etching stopper film 22c by a vacuum film forming method. Consequently, the second hole 42 is filled with the second inter-layer insulating film 21b. Thus, the vacuum space portion 15 surrounding the phase-change memory material layer 12 and the heater electrode 11 is formed. Thus, the semiconductor device shown in FIG. 38 can be manufactured.

According to the semiconductor devices of the sixth embodiment, when a current is supplied to the heater electrode 11, the phase-change region 12a is formed in the phase-change memory material layer 12, over the heater electrode 11 without spreading toward the protection insulating film 14. This is because the vacuum space portion 15 with low thermal conductivity is formed so as to surround at least one of the heater electrode 11 and the phase-change memory material layer 12, thereby enhancing the thermal efficiency. Accordingly, the phase change region 12a can be separated from a damaged layer Y generated upon etching the phase-change memory material layer 12, thereby preventing a variation in the amount of rewriting current.

As used herein, the following directional terms "forward," "rearward," "above," "downward," "vertical," "horizontal," "below," and "transverse," as well as any other similar directional terms refer to those directions of an apparatus equipped with the present invention. Accordingly, these terms, as utilized to describe the present invention should be interpreted relative to an apparatus equipped with the present invention.

The term "configured" is used to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The terms of degree such as "substantially," "about," and "approximately" as used herein mean a reasonable amount of deviation of the modified term such that the end result is not significantly changed. For example, these terms can be construed as including a deviation of at least ±5 percent of the modified term if this deviation would not negate the meaning of the word it modifies.

It is apparent that the present invention is not limited to the above embodiments, and may be modified and changed without departing from the scope and spirit of the invention.

In addition, while not specifically claimed in the claim section, the application reserves the right to include in the claim section at any appropriate time the following method.

A method of manufacturing a semiconductor device may include, but is not limited to the following processes. A plurality of memory structures are formed over a first insulating film such that the plurality of memory structures are spatially separated from one another. A plurality of second insulating films covering side surfaces of the plurality of memory structures are formed such that the plurality of second insulating films being spatially separated from one another. A third insulating film filling space among the plurality of second insulating films is formed. A fourth insulating film is formed over the plurality of memory structures and the second and third insulating films. A plurality of through holes are formed in the fourth insulating film so as not to overlap the plurality of memory structures in plan view. The third insulating film is selectively removed to form empty space among the plurality of memory structures. A fifth insulating film is formed over the fourth insulating film so as to fill the plurality of through holes.

What is claimed is:

1. A semiconductor device comprising:
    a first insulating film;
    a second insulating film over the first insulating film;
    a first memory structure between the first and second insulating films, the first memory structure comprising:
        a heater electrode; and
        a phase-change memory element between the heater electrode and the second insulating film, the phase-change memory element contacting the heater electrode; and
    a third insulating film between the first and second insulating films, the third insulating film covering at least a side surface of the phase-change memory element, and empty space being positioned adjacent to at least one of the heater electrode and the third insulating film,
    wherein the first memory structure further comprises:
        a lower contact plug penetrating the first insulating film, the lower contact plug contacting the heater electrode;
        an upper electrode over the phase-change memory element; and
        an upper contact plug over the upper electrode, the upper contact plug penetrating the second insulating film.

2. The semiconductor device according to claim 1, wherein the heater electrode is configured to heat the phase-change memory element.

3. The semiconductor device according to claim 1, wherein the third insulating film covers a side surface of the first memory structure, and
    the empty space is positioned adjacent to the third insulating film.

4. The semiconductor device according to claim 1, further comprising:
    a fourth insulating film between the first and second insulating films, the heater electrode penetrating the fourth insulating film, the phase-change memory electrode being positioned over the fourth insulating film, and the third insulating film being positioned over the fourth insulating film.

5. The semiconductor device according to claim 4, further comprising:
    a fifth insulating film between the second and fourth insulating films, the fifth insulating film being positioned adjacent to the third insulating film, the empty space being positioned between the first and fourth insulating films, and the empty space being positioned adjacent to the heater electrode.

6. The semiconductor device according to claim 4, further comprising:
    a sixth insulating film between the first and fourth insulating films, the sixth insulating film being positioned adjacent to the heater electrode, the empty space being positioned between the second and fourth insulating films, and the empty space being positioned adjacent to the third insulating film.

7. The semiconductor device according to claim 4, wherein the empty space is positioned between the first and fourth insulating films,
    the empty space is positioned adjacent to the heater electrode, another empty space is positioned between the second and fourth insulating films, and,
    the another empty space is positioned adjacent to the third insulating film.

8. The semiconductor device according to claim 5, wherein the fourth insulating film has a through hole separated from the phase-change memory electrode and the third insulating film in plan view, and
    the fifth insulating film fills the through hole.

9. The semiconductor device according to claim 6, wherein the second insulating film has a through hole separated from the phase-change memory electrode and the third insulating film in plan view, and
    the semiconductor device further comprises:
        a seventh insulating film over the second insulating film, the seventh insulating film filling the through hole.

10. The semiconductor device according to claim 7, wherein
    the fourth insulating film has a through hole separated from the phase-change memory element and the third insulating film.

11. A semiconductor device comprising:
    a first insulating film;
    a second insulating film over the first insulating film; and
    a plurality of memory structures between the first and second insulating films, each of the plurality of memory structures being spatially separated from one another, and each of the plurality of memory structures comprising:
        a heater electrode; and
        a phase-change memory element between the heater electrode and the second insulating film, the phase-change memory element contacting the heater electrode,
    wherein each of the plurality of memory structures further comprises:
        a lower contact plug penetrating the first insulating film, the lower contact plug contacting the heater electrode;
        an upper electrode over the phase-change memory element; and
        an upper contact plug over the upper electrode, the upper contact plug penetrating the second insulating film.

12. The semiconductor device according to claim 11, wherein the heater electrode is configured to heat the phase-change memory element.

13. The semiconductor device according to claim 11, further comprising:
    a plurality of third insulating films covering side surfaces of the memory structures, the plurality of third insulating films being spatially separated from one another.

14. The semiconductor device according to claim 11, further comprises:
    a fourth insulating film between the first and second insulating films, the fourth insulating film surrounding the plurality of memory structures in plan view.

15. The semiconductor device according to claim 11, further comprises:
    a plurality of first contact plugs between the first and the second insulating films, the plurality of first contact plugs being arranged on a first line in plan view; and
    a plurality of second contact plugs between the first and second insulating films, the plurality of second contact plugs being arranged on a second line in parallel with the first line in plan view, and the plurality of memory structures being positioned between the first and second lines in plan view.

16. The semiconductor device according to claim 11, further comprises:
    a plurality of contact plugs between the first and second insulating films, the plurality of contact plugs being arranged on a third line surrounding the plurality of memory structures in plan view.

17. A semiconductor device comprising:
    a first insulating film;
    a second insulating film over the first insulating film; and a plurality of memory structures between the first and second insulating films, each of the plurality of memory structures being spatially separated from one another, and each of the plurality of memory structures comprising:
  a heater electrode; and
  a phase-change memory element between the heater electrode and the second insulating film, the phase-change memory element contacting the heater electrode,
wherein the second insulating film includes a plurality of first through holes, and one of the plurality of first through holes is surrounded by four of the plurality of memory structures in plan view.

18. The semiconductor device according to claim 17, further comprising:
  a fifth insulating film over the second insulating film, the fifth insulating film having a plurality of second through holes, one of the plurality of second thorough holes being surrounded by two of the plurality of first holes and two of the plurality of memory structures in plan view, the plurality of memory structures penetrating the second and fifth insulating films; and
  a sixth insulating film over the fifth insulating film, the sixth insulating film filling the plurality of second through holes.

* * * * *